(12) United States Patent
Yamazaki et al.

(10) Patent No.: US 10,565,946 B2
(45) Date of Patent: Feb. 18, 2020

(54) LIQUID CRYSTAL DISPLAY DEVICE AND ELECTRONIC DEVICE INCLUDING THE LIQUID CRYSTAL DISPLAY DEVICE

(71) Applicant: Semiconductor Energy Laboratory Co., Ltd., Atsugi-shi, Kanagawa-ken (JP)

(72) Inventors: Shunpei Yamazaki, Setagaya (JP); Ryo Arasawa, Isehara (JP); Jun Koyama, Sagamihara (JP); Masashi Tsubuku, Atsugi (JP); Kosei Noda, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/824,343

(22) Filed: Nov. 28, 2017

(65) Prior Publication Data

US 2018/0090086 A1   Mar. 29, 2018

Related U.S. Application Data

(63) Continuation of application No. 15/264,014, filed on Sep. 13, 2016, now abandoned, which is a
(Continued)

(30) Foreign Application Priority Data

Oct. 16, 2009   (JP) .................................. 2009-238869
Dec. 8, 2009   (JP) .................................. 2009-279004

(51) Int. Cl.
*H01L 27/12*   (2006.01)
*G09G 3/36*   (2006.01)
(Continued)

(52) U.S. Cl.
CPC ......... *G09G 3/3614* (2013.01); *G02F 1/1368* (2013.01); *G02F 1/13439* (2013.01);
(Continued)

(58) Field of Classification Search
CPC .. G09G 3/3614; G09G 3/3677; G09G 3/3648; G09G 2330/021;
(Continued)

(56) References Cited

U.S. PATENT DOCUMENTS 5,070,409 A   12/1991   Miyadera et al.
5,142,430 A   8/1992   Anthony
(Continued)

FOREIGN PATENT DOCUMENTS

CN   001731497 A   2/2006
CN   101335274 A   12/2008
(Continued)

OTHER PUBLICATIONS

Taiwanese Office Action (Application No. 106114988) dated Jan. 4, 2018.
(Continued)

*Primary Examiner* — Liliana Cerullo
(74) *Attorney, Agent, or Firm* — Robinson Intellectual Property Law Office; Eric J. Robinson

(57) ABSTRACT

In a liquid crystal display device including a plurality of pixels in a display portion and configured to performed display in a plurality of frame periods, each of the frame periods includes a writing period and a holding period, and after an image signal is input to each of the plurality of pixels in the writing period, a transistor included in each of the plurality of pixels is turned off and the image signal is held for at least 30 seconds in the holding period. The pixel includes a semiconductor layer including an oxide semiconductor layer, and the oxide semiconductor layer has a carrier concentration of less than $1 \times 10^{14}/cm^3$.

11 Claims, 30 Drawing Sheets

Related U.S. Application Data continuation of application No. 15/134,937, filed on Apr. 21, 2016, now Pat. No. 9,959,822, which is a continuation of application No. 14/477,172, filed on Sep. 4, 2014, now Pat. No. 9,368,082, which is a continuation of application No. 12/901,023, filed on Oct. 8, 2010, now Pat. No. 8,854,286.

(51) Int. Cl.

| | | |
|---|---|---|
| *H01L 29/786* | (2006.01) | |
| *H01L 21/02* | (2006.01) | |
| *H01L 21/467* | (2006.01) | |
| *H01L 21/477* | (2006.01) | |
| *H01L 29/24* | (2006.01) | |
| *H01L 29/423* | (2006.01) | |
| *H01L 29/45* | (2006.01) | |
| *H01L 29/66* | (2006.01) | |
| *G02F 1/1335* | (2006.01) | |
| *G02F 1/1343* | (2006.01) | |
| *G02F 1/1368* | (2006.01) | |

(52) U.S. Cl.
CPC ..... *G02F 1/133553* (2013.01); *G09G 3/3648* (2013.01); *G09G 3/3677* (2013.01); *H01L 21/02164* (2013.01); *H01L 21/02266* (2013.01); *H01L 21/02565* (2013.01); *H01L 21/02631* (2013.01); *H01L 21/467* (2013.01); *H01L 21/477* (2013.01); *H01L 27/1225* (2013.01); *H01L 27/1255* (2013.01); *H01L 29/24* (2013.01); *H01L 29/42356* (2013.01); *H01L 29/45* (2013.01); *H01L 29/66969* (2013.01); *H01L 29/7869* (2013.01); *H01L 29/78648* (2013.01); *G02F 2201/123* (2013.01); *G02F 2202/10* (2013.01); *G09G 2300/08* (2013.01); *G09G 2310/0286* (2013.01); *G09G 2310/08* (2013.01); *G09G 2330/021* (2013.01)

(58) Field of Classification Search
CPC ........ G09G 2310/0283; G09G 2310/08; G02F 1/1368; G02F 1/13439; G02F 1/133553; H01L 29/45; H01L 29/66969; H01L 29/24; H01L 29/78648; H01L 29/42356; H01L 29/7869; H01L 21/02164; H01L 21/02266; H01L 21/02565; H01L 21/02631; H01L 21/467; H01L 21/477; H01L 27/1255; H01L 27/1225
See application file for complete search history.

(56) References Cited

U.S. PATENT DOCUMENTS

| | | | |
|---|---|---|---|
| 5,351,143 | A | 9/1994 | Sato et al. |
| 5,410,583 | A | 4/1995 | Weisbrod et al. |
| 5,731,856 | A | 3/1998 | Kim et al. |
| 5,744,864 | A | 4/1998 | Cillessen et al. |
| 5,767,832 | A | 6/1998 | Koyama et al. |
| 5,977,940 | A | 11/1999 | Akiyama et al. |
| 6,046,790 | A * | 4/2000 | Hara ................. G02F 1/136213 349/172 |
| 6,169,532 | B1 | 1/2001 | Sumi et al. |
| 6,278,426 | B1 | 8/2001 | Akiyama |
| 6,294,274 | B1 | 9/2001 | Kawazoe et al. |
| 6,310,600 | B1 | 10/2001 | Koyama et al. |
| 6,563,174 | B2 | 5/2003 | Kawasaki et al. |
| 6,614,418 | B2 | 9/2003 | Koyama et al. |
| 6,624,801 | B2 | 9/2003 | Moriyama |
| 6,727,522 | B1 | 4/2004 | Kawasaki et al. |
| 6,784,863 | B2 | 8/2004 | Yanagi et al. |
| 6,795,066 | B2 | 9/2004 | Tanaka et al. |
| 6,977,637 | B2 | 12/2005 | Ikeda et al. |
| 6,977,639 | B2 | 12/2005 | Fujiwara et al. |
| 7,019,738 | B2 | 3/2006 | Tsutsui |
| 7,038,278 | B2 | 5/2006 | Tsujimura et al. |
| 7,049,190 | B2 | 5/2006 | Takeda et al. |
| 7,057,598 | B2 | 6/2006 | Azami et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,123,246 | B2 | 10/2006 | Nakatani et al. |
| 7,126,595 | B2 | 10/2006 | Yanagi et al. |
| 7,211,825 | B2 | 5/2007 | Shih et al. |
| 7,282,782 | B2 | 10/2007 | Hoffman et al. |
| 7,286,108 | B2 | 10/2007 | Tsuda et al. |
| 7,297,977 | B2 | 11/2007 | Hoffman et al. |
| 7,314,801 | B2 | 1/2008 | Kiesel et al. |
| 7,321,353 | B2 | 1/2008 | Tsuda et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,477,223 | B2 | 1/2009 | Sekiguchi et al. |
| 7,501,293 | B2 | 3/2009 | Ito et al. |
| 7,674,650 | B2 | 3/2010 | Akimoto et al. |
| 7,710,384 | B2 | 5/2010 | Azami et al. |
| 7,732,819 | B2 | 6/2010 | Akimoto et al. |
| 7,791,072 | B2 | 9/2010 | Kumomi et al. |
| 7,791,074 | B2 | 9/2010 | Iwasaki |
| 7,807,515 | B2 | 10/2010 | Kato et al. |
| 7,808,495 | B2 | 10/2010 | Tsutsui |
| 7,884,360 | B2 | 2/2011 | Takechi et al. |
| 7,907,224 | B2 | 3/2011 | Ito et al. |
| 7,910,490 | B2 | 3/2011 | Akimoto et al. |
| 7,924,276 | B2 | 4/2011 | Tsuda et al. |
| 7,932,521 | B2 | 4/2011 | Akimoto et al. |
| 7,935,582 | B2 | 5/2011 | Iwasaki |
| 7,947,981 | B2 | 5/2011 | Yamazaki et al. |
| 7,956,361 | B2 | 6/2011 | Iwasaki |
| 7,998,372 | B2 | 8/2011 | Yano et al. |
| 8,130,179 | B2 | 3/2012 | Uchino et al. |
| 8,143,115 | B2 | 3/2012 | Omura et al. |
| 8,148,721 | B2 | 4/2012 | Hayashi et al. |
| 8,154,024 | B2 | 4/2012 | Iwasaki |
| 8,188,467 | B2 | 5/2012 | Itagaki et al. |
| 8,188,480 | B2 | 5/2012 | Itai |
| 8,193,045 | B2 | 6/2012 | Omura et al. |
| 8,212,248 | B2 | 7/2012 | Itagaki et al. |
| 8,264,445 | B2 | 9/2012 | Azami et al. |
| 8,274,077 | B2 | 9/2012 | Akimoto et al. |
| 8,372,686 | B2 | 2/2013 | Yamada et al. |
| 8,420,442 | B2 | 4/2013 | Takechi et al. |
| 8,451,261 | B2 | 5/2013 | Yoon |
| 8,461,583 | B2 | 6/2013 | Yano et al. |
| 8,466,463 | B2 | 6/2013 | Akimoto et al. |
| 8,513,662 | B2 | 8/2013 | Yabuta et al. |
| 8,530,246 | B2 | 9/2013 | Ofuji et al. |
| 8,592,009 | B2 | 11/2013 | Matsumori et al. |
| 8,629,069 | B2 | 1/2014 | Akimoto et al. |
| 8,669,550 | B2 | 3/2014 | Akimoto et al. |
| 8,704,217 | B2 | 4/2014 | Yano et al. |
| 8,723,175 | B2 | 5/2014 | Yano et al. |
| 8,748,879 | B2 | 6/2014 | Yano et al. |
| 8,766,906 | B2 | 7/2014 | Yoshida et al. |
| 8,786,533 | B2 | 7/2014 | Azami et al. |
| 8,790,959 | B2 | 7/2014 | Akimoto et al. |
| 8,796,069 | B2 | 8/2014 | Akimoto et al. |
| 8,854,286 | B2 | 10/2014 | Yamazaki et al. |
| 8,889,480 | B2 | 11/2014 | Takechi et al. |
| 9,028,926 | B2 | 5/2015 | Matsumori et al. |
| 9,035,867 | B2 | 5/2015 | Yoshida |
| 9,099,562 | B2 | 8/2015 | Akimoto et al. |
| 9,105,520 | B2 | 8/2015 | Azami et al. |
| 9,189,994 | B2 | 11/2015 | Iida et al. |
| 9,355,602 | B2 | 5/2016 | Yoshida et al. |

(56) References Cited

U.S. PATENT DOCUMENTS

| | | | |
|---|---|---|---|
| 9,368,082 | B2 | 6/2016 | Yamazaki et al. |
| 9,496,291 | B2 | 11/2016 | Azami et al. |
| 9,570,017 | B2 | 2/2017 | Yoshida et al. |
| 9,959,822 | B2 | 5/2018 | Yamazaki et al. |
| 2001/0046027 | A1 | 11/2001 | Tai et al. |
| 2002/0056838 | A1 | 5/2002 | Ogawa |
| 2002/0126229 | A1 | 9/2002 | Niiyama et al. |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0027505 | A1* | 2/2004 | Yamazaki ......... G02F 1/134363 349/43 |
| 2004/0036072 | A1 | 2/2004 | Tsujimura et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2005/0212737 | A1 | 9/2005 | Yoshihara et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0001963 | A1 | 1/2007 | Koma |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0115219 | A1 | 5/2007 | Inoue |
| 2007/0141789 | A1 | 6/2007 | Kiesel et al. |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0212807 | A1 | 9/2007 | Yamada et al. |
| 2007/0241390 | A1 | 10/2007 | Tanaka et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0017854 | A1 | 1/2008 | Marks et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0055218 | A1 | 3/2008 | Tsuda et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0142797 | A1 | 6/2008 | Lee et al. |
| 2008/0166834 | A1 | 7/2008 | Kim et al. |
| 2008/0180385 | A1 | 7/2008 | Yoshida et al. |
| 2008/0182358 | A1 | 7/2008 | Cowdery-Corvan et al. |
| 2008/0224133 | A1 | 9/2008 | Park et al. |
| 2008/0239208 | A1 | 10/2008 | Chen |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2008/0308805 | A1 | 12/2008 | Akimoto et al. |
| 2009/0001374 | A1 | 1/2009 | Inoue et al. |
| 2009/0001387 | A1 | 1/2009 | Kimura |
| 2009/0002304 | A1 | 1/2009 | Kim |
| 2009/0045397 | A1 | 2/2009 | Iwasaki |
| 2009/0046040 | A1 | 2/2009 | Iida et al. |
| 2009/0068773 | A1 | 3/2009 | Lai et al. |
| 2009/0072232 | A1 | 3/2009 | Hayashi et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0160741 | A1 | 6/2009 | Inoue et al. |
| 2009/0230890 | A1 | 9/2009 | Takahara |
| 2009/0237000 | A1 | 9/2009 | Inoue |
| 2009/0261325 | A1 | 10/2009 | Kawamura et al. |
| 2009/0267064 | A1 | 10/2009 | Yano et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0066932 | A1* | 3/2010 | Huh ............... C09K 19/3402 349/38 |
| 2010/0092800 | A1 | 4/2010 | Itagaki et al. |
| 2010/0109002 | A1 | 5/2010 | Itagaki et al. |
| 2010/0149138 | A1 | 6/2010 | Lee et al. |
| 2010/0163865 | A1 | 7/2010 | Arai |
| 2011/0001136 | A1 | 1/2011 | Hasegawa et al. |
| 2011/0104851 | A1 | 5/2011 | Akimoto et al. |
| 2011/0121290 | A1 | 5/2011 | Akimoto et al. |
| 2012/0168750 | A1 | 7/2012 | Hayashi et al. |
| 2013/0313548 | A1 | 11/2013 | Yano et al. |
| 2015/0056747 | A1 | 2/2015 | Takechi et al. |
| 2015/0084048 | A1 | 3/2015 | Hayashi et al. |
| 2015/0210923 | A1 | 7/2015 | Matsumori et al. |
| 2015/0338709 | A1 | 11/2015 | Yoshida |
| 2015/0340513 | A1 | 11/2015 | Akimoto et al. |
| 2016/0035278 | A1 | 2/2016 | Iida et al. |
| 2017/0004788 | A1 | 1/2017 | Yamazaki et al. |
| 2017/0076820 | A1 | 3/2017 | Azami et al. |

FOREIGN PATENT DOCUMENTS

| | | |
|---|---|---|
| EP | 0651395 A | 5/1995 |
| EP | 1134721 A | 9/2001 |
| EP | 1189192 A | 3/2002 |
| EP | 1197790 A | 4/2002 |
| EP | 1280129 A | 1/2003 |
| EP | 1296174 A | 3/2003 |
| EP | 1737044 A | 12/2006 |
| EP | 1770788 A | 4/2007 |
| EP | 1801887 A | 6/2007 |
| EP | 1930865 A | 6/2008 |
| EP | 1981085 A | 10/2008 |
| EP | 1995787 A | 11/2008 |
| EP | 1998373 A | 12/2008 |
| EP | 1998374 A | 12/2008 |
| EP | 1998375 A | 12/2008 |
| EP | 2006824 A | 12/2008 |
| EP | 2020686 A | 2/2009 |
| EP | 2105967 A | 9/2009 |
| EP | 2219225 A | 8/2010 |
| EP | 2226847 A | 9/2010 |
| EP | 2339639 A | 6/2011 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-219287 A | 9/1991 |
| JP | 04-504880 | 8/1992 |

(56) References Cited

FOREIGN PATENT DOCUMENTS

| | | |
|---|---|---|
| JP | 05-119352 A | 5/1993 |
| JP | 05-504880 | 7/1993 |
| JP | 05-251705 A | 9/1993 |
| JP | 07-182891 A | 7/1995 |
| JP | 07-239463 A | 9/1995 |
| JP | 08-264794 A | 10/1996 |
| JP | 09-243994 A | 9/1997 |
| JP | 10-228009 A | 8/1998 |
| JP | 11-505377 | 5/1999 |
| JP | 2000-044236 A | 2/2000 |
| JP | 2000-150900 A | 5/2000 |
| JP | 2000-221923 A | 8/2000 |
| JP | 2001-184015 A | 7/2001 |
| JP | 2001-242818 A | 9/2001 |
| JP | 2001-312253 A | 11/2001 |
| JP | 2002-014320 A | 1/2002 |
| JP | 2002-060752 A | 2/2002 |
| JP | 2002-076356 A | 3/2002 |
| JP | 2002-091396 A | 3/2002 |
| JP | 2002-140052 A | 5/2002 |
| JP | 2002-182621 A | 6/2002 |
| JP | 2002-207462 A | 7/2002 |
| JP | 2002-278523 A | 9/2002 |
| JP | 2002-289859 A | 10/2002 |
| JP | 2002-335153 A | 11/2002 |
| JP | 2002-366108 A | 12/2002 |
| JP | 2003-044011 A | 2/2003 |
| JP | 2003-086000 A | 3/2003 |
| JP | 2003-086808 A | 3/2003 |
| JP | 2003-131632 A | 5/2003 |
| JP | 2003-131633 A | 5/2003 |
| JP | 2003-131648 A | 5/2003 |
| JP | 2004-087682 A | 3/2004 |
| JP | 2004-103957 A | 4/2004 |
| JP | 2004-206075 A | 7/2004 |
| JP | 2004-273614 A | 9/2004 |
| JP | 2004-273732 A | 9/2004 |
| JP | 2005-015775 A | 1/2005 |
| JP | 2005-070337 A | 3/2005 |
| JP | 2006-165528 A | 6/2006 |
| JP | 2006-286719 A | 10/2006 |
| JP | 2006-286772 A | 10/2006 |
| JP | 2007-103918 A | 4/2007 |
| JP | 2007-123861 A | 5/2007 |
| JP | 2007-142195 A | 6/2007 |
| JP | 2007-142196 A | 6/2007 |
| JP | 2007-173820 A | 7/2007 |
| JP | 2007-258675 A | 10/2007 |
| JP | 2007-273957 A | 10/2007 |
| JP | 2007-286150 A | 11/2007 |
| JP | 2008-042088 A | 2/2008 |
| JP | 2008-286911 A | 11/2008 |
| JP | 2008-287118 A | 11/2008 |
| JP | 2008-300518 A | 12/2008 |
| JP | 2009-075569 A | 4/2009 |
| JP | 2009-111125 A | 5/2009 |
| JP | 2009-123957 A | 6/2009 |
| JP | 2009-157371 A | 7/2009 |
| JP | 2009-164393 A | 7/2009 |
| JP | 2009-177149 A | 8/2009 |
| JP | 2009-212443 A | 9/2009 |
| JP | 2009-223036 A | 10/2009 |
| JP | 2009-231613 A | 10/2009 |
| JP | 2009-276387 A | 11/2009 |
| JP | 2009-277702 A | 11/2009 |
| JP | 2011-141522 A | 7/2011 |
| KR | 2008-0069607 A | 7/2008 |
| TW | 200523856 | 7/2005 |
| TW | 200537222 | 11/2005 |
| TW | 200837708 | 9/2008 |
| TW | 200841306 | 10/2008 |
| TW | 200841475 | 10/2008 |
| TW | 200845396 | 11/2008 |
| TW | 200915270 | 4/2009 |
| TW | 200915577 | 4/2009 |
| TW | 200917203 | 4/2009 |
| WO | WO-1991/010716 | 7/1991 |
| WO | WO-1991/015046 | 10/1991 |
| WO | WO-2004/114391 | 12/2004 |
| WO | WO-2005/033785 | 4/2005 |
| WO | WO-2005/073790 | 8/2005 |
| WO | WO-2007/029844 | 3/2007 |
| WO | WO-2007/139009 | 12/2007 |
| WO | WO-2008/069056 | 6/2008 |
| WO | WO-2008/069255 | 6/2008 |
| WO | WO-2008/136505 | 11/2008 |
| WO | WO-2008/149754 | 12/2008 |
| WO | WO-2008/149873 | 12/2008 |
| WO | WO-2009/081885 | 7/2009 |
| WO | WO-2009/087943 | 7/2009 |
| WO | WO-2009/091013 | 7/2009 |
| WO | WO-2009/110623 | 9/2009 |
| WO | WO-2009/139482 | 11/2009 |
| WO | WO-2009/139483 | 11/2009 |
| WO | WO-2011/046010 | 4/2011 |

OTHER PUBLICATIONS

International Search Report (Application No. PCT/JP2010/066627) dated Nov. 30, 2010.

Written Opinion (Application No. PCT/JP2010/066627) dated Nov. 30, 2010.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04: SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(56) References Cited

OTHER PUBLICATIONS

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a charge-generation layer", Adv. Mater. (Advanced Materials), 2006, vol. 18, No. 3, pp. 339-342.
Tsuda.K et al., "Ultra Low Power Consumption Technologies for Mobile TFT-LCDs", IDW '02 : Proceedings of the 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits , 2008, vol. 43, No. 1, pp. 292-299.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by PEALD Grown ZnO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", NIRIM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "SPINEL,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.S et al., "42.3: Transparent ZnO Thin Film Transistor for the Application of High Aperture Ratio Bottom Emission AM-OLED

(56) References Cited

OTHER PUBLICATIONS

Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Taiwanese Office Action (Application No. 099133859) dated Mar. 17, 2015.

Taiwanese Office Action (Application No. 105110571) dated Jan. 25, 2017.

Taiwanese Office Action (Application No. 105132213) dated Feb. 7, 2017.

Korean Office Action (Application No. 2016-7032712) dated Feb. 20, 2017.

\* cited by examiner

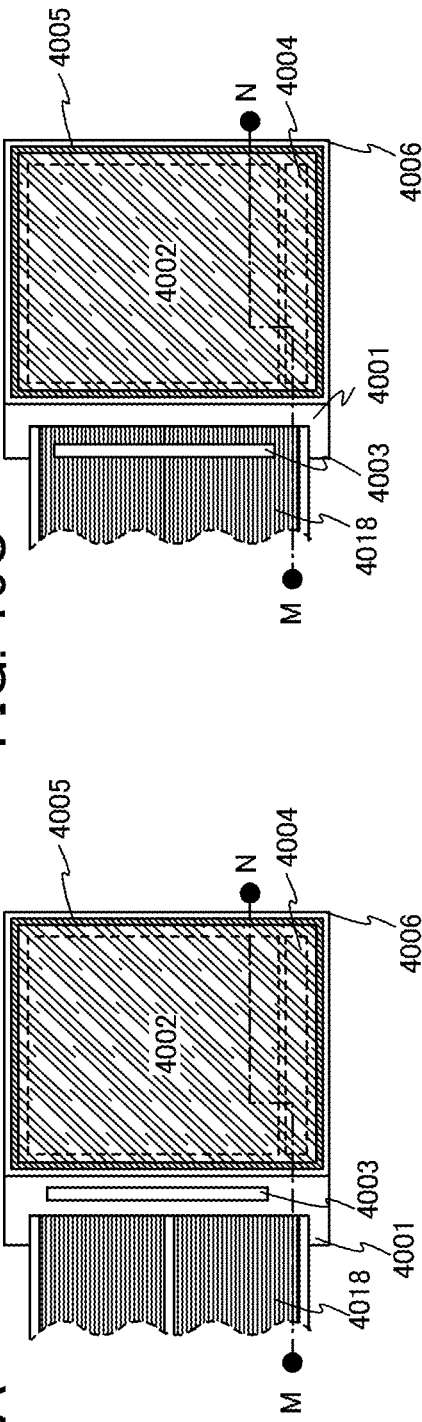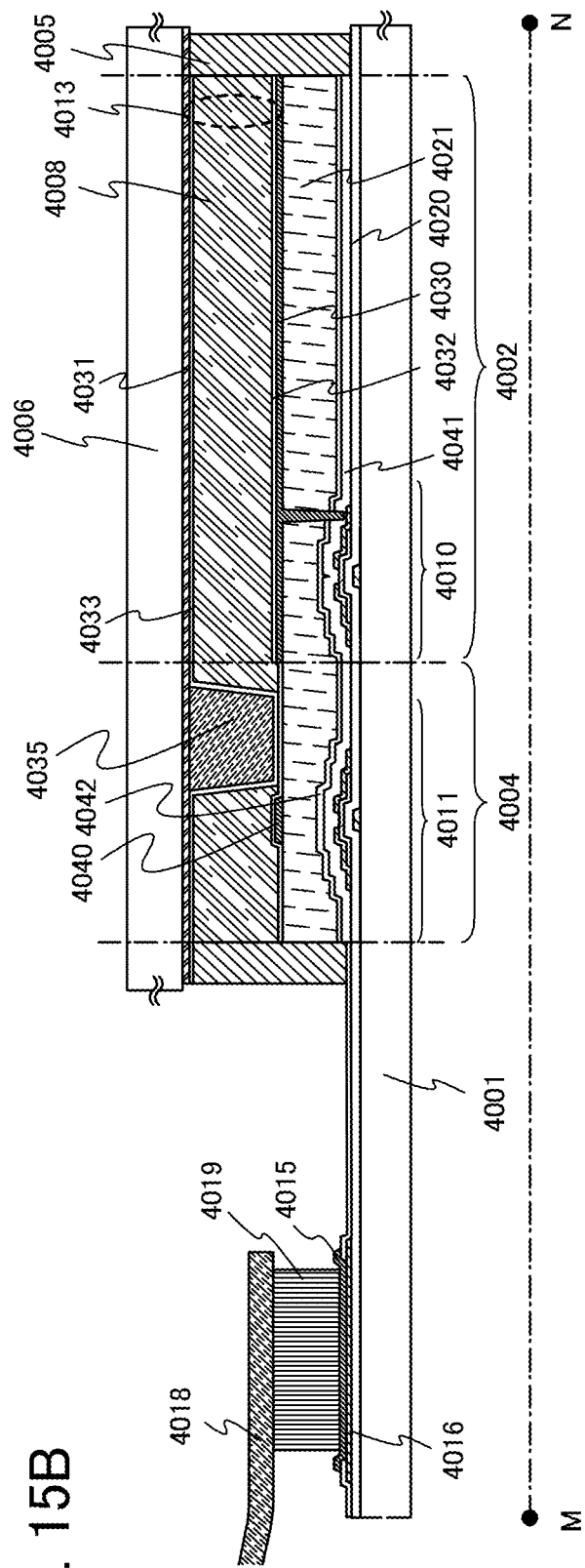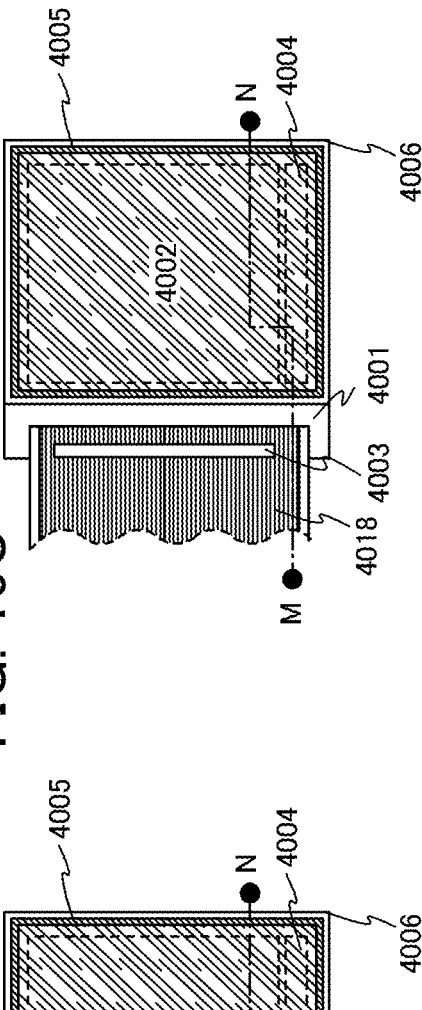

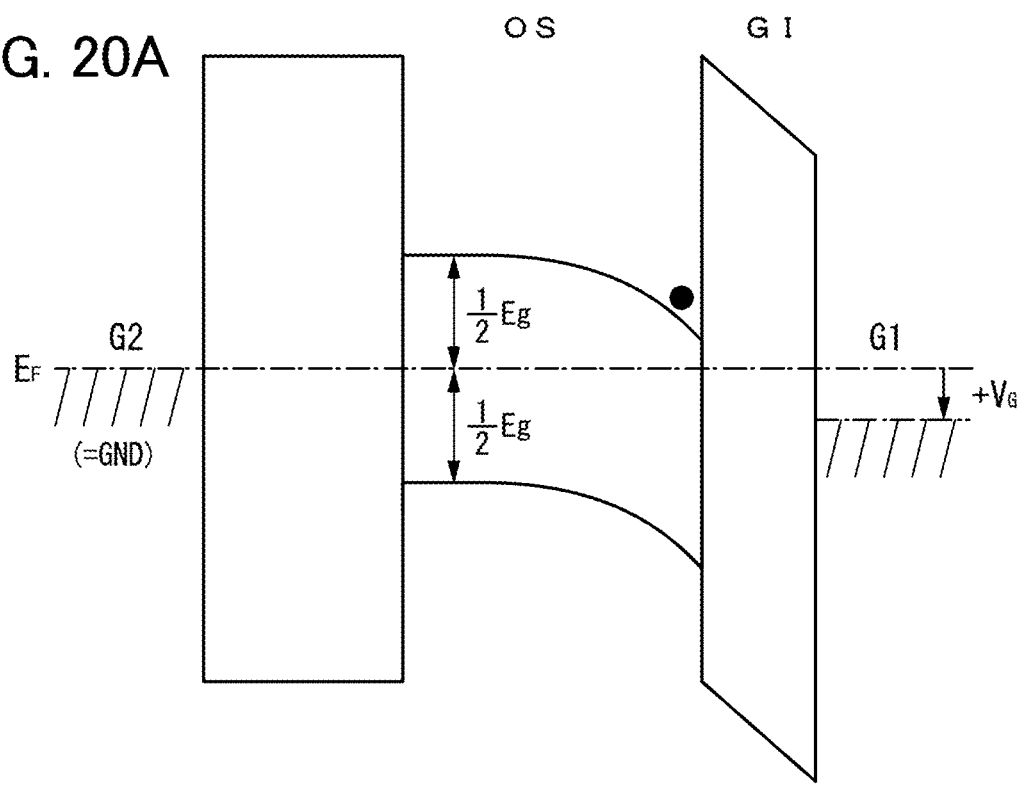
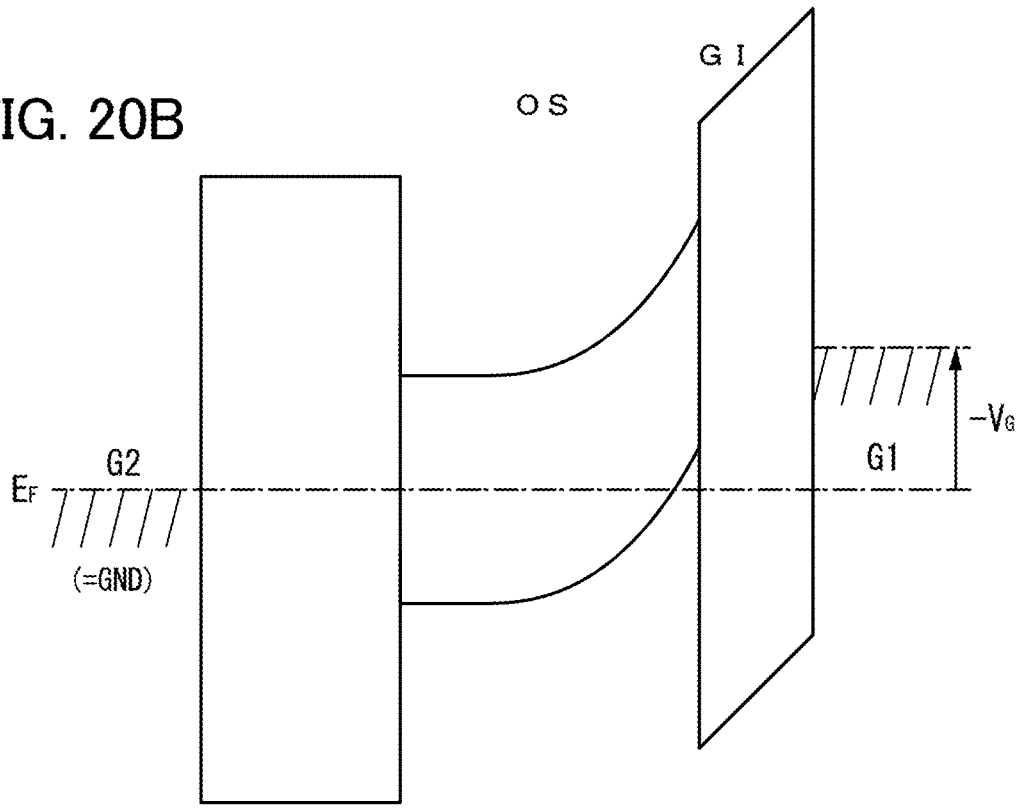

LIQUID CRYSTAL DISPLAY DEVICE AND ELECTRONIC DEVICE INCLUDING THE LIQUID CRYSTAL DISPLAY DEVICE

TECHNICAL FIELD

An embodiment of the present invention relates to a liquid crystal display device. An embodiment of the present invention relates to an electronic device including the liquid crystal display device.

BACKGROUND ART

Thin film transistors formed over a flat plate such as a glass substrate have been manufactured using amorphous silicon or polycrystalline silicon, as typically seen in liquid crystal display devices. Thin film transistors manufactured using amorphous silicon have low field effect mobility but can be formed over a large glass substrate. On the other hand, thin film transistors manufactured using crystalline silicon have high field effect mobility, but due to a crystallization step such as laser annealing, such a transistor is not necessarily suitable for being formed over a large glass substrate.

In view of the foregoing, attention has been drawn to a technique by which a thin film transistor is manufactured using an oxide semiconductor, and such a transistor is applied to an electronic device or an optical device. For example, Patent Document 1 discloses a technique by which a thin film transistor is manufactured using zinc oxide or an In—Ga—Zn—O-based oxide semiconductor as an oxide semiconductor film, and such a transistor is used as, for example, a switching element of a liquid crystal display device.

REFERENCE

[Patent Document 1] Japanese Published Patent Application No. 2006-165528

DISCLOSURE OF INVENTION

A thin film transistor in which an oxide semiconductor is used for a channel region achieves higher field effect mobility than a thin film transistor in which amorphous silicon is used for a channel region. A pixel including such a thin film transistor including an oxide semiconductor is expected to be applied to a display device such as a liquid crystal display device.

Each pixel included in a liquid crystal display device is provided with a storage capacitor in which a voltage for controlling the orientation of a liquid crystal element is held. Off-state current of a thin film transistor is one factor by which the amount of the storage capacitance is determined. A reduction in off-state current which leads to the extension of a period for holding a voltage in the storage capacitor is important for a reduction in power consumption when a still image or the like is displayed.

Note that in this specification, off-state current is current which flows between a source and a drain when a thin film transistor is in an off state (also called a non-conductive state). In the case of an n-channel thin film transistor (for example, with a threshold voltage of about 0 V to 2 V), the off-state current means a current which flows between a source and a drain when a negative voltage is applied between a gate and the source.

Further, as a liquid crystal display device with higher value added, such as a 3D display or a 4k2k display, a liquid crystal display device including a pixel in which the area per pixel is expected to be small and the aperture ratio is improved is needed. It is important to reduce the area of the holding capacitor in order to improve the aperture ratio. Accordingly, the off-state current of a thin film transistor needs to be decreased.

In view of the foregoing, it is an object of one embodiment of the present invention to provide a liquid crystal display device in which an off-state current of a thin film transistor using an oxide semiconductor can be reduced in a pixel.

An embodiment of the present invention is a liquid crystal display device including a plurality of pixels in a display portion and configured to perform display in a plurality of frame periods. Each of the plurality of frame periods includes a writing period and a holding period. After an image signal is input to each of the plurality of pixels in the writing period, a transistor included in each of the plurality of pixels is turned off and the image signal is held for at least 30 seconds in the holding period.

An embodiment of the present invention is a liquid crystal display device including a plurality of pixels in a display portion and configured to perform display in a plurality of frame periods. Each of the plurality of frame periods includes a writing period and a holding period. After an image signal with a voltage whose polarity is inverted a plurality of times is input to each of the plurality of pixels in the writing period, a transistor included in each of the plurality of pixels is turned off and the image signal is held for at least 30 seconds in the holding period.

In the liquid crystal display device of the embodiment of the present invention, a polarity of the voltage of the image signal supplied to each of the plurality of pixels in the holding period may be a polarity of the voltage supplied at the end of the writing period.

In the liquid crystal display device of the embodiment of the present invention, the transistor may include a semiconductor layer including an oxide semiconductor, and the oxide semiconductor may have a carrier concentration of less than $1 \times 10^{14}/cm^3$.

In the liquid crystal display device of the embodiment of the present invention, the off-state current per micrometer of channel width of the transistor may be $1 \times 10^{-17}$ A or less.

In a pixel including a thin film transistor using an oxide semiconductor, the off-state current can be reduced. Therefore, a liquid crystal display device capable of extending the period in which a storage capacitor can hold a voltage and reducing power consumption when displaying a still image or the like can be obtained. Further, the aperture ratio can be improved, so that a liquid crystal display device including a high-definition display portion can be obtained.

BRIEF DESCRIPTION OF DRAWINGS

FIGS. 15A to 15C illustrate a liquid crystal panel.
FIGS. 20A and 20B are diagrams for illustrating Embodiment 13.

BEST MODE FOR CARRYING OUT THE INVENTION

Figure 1A:
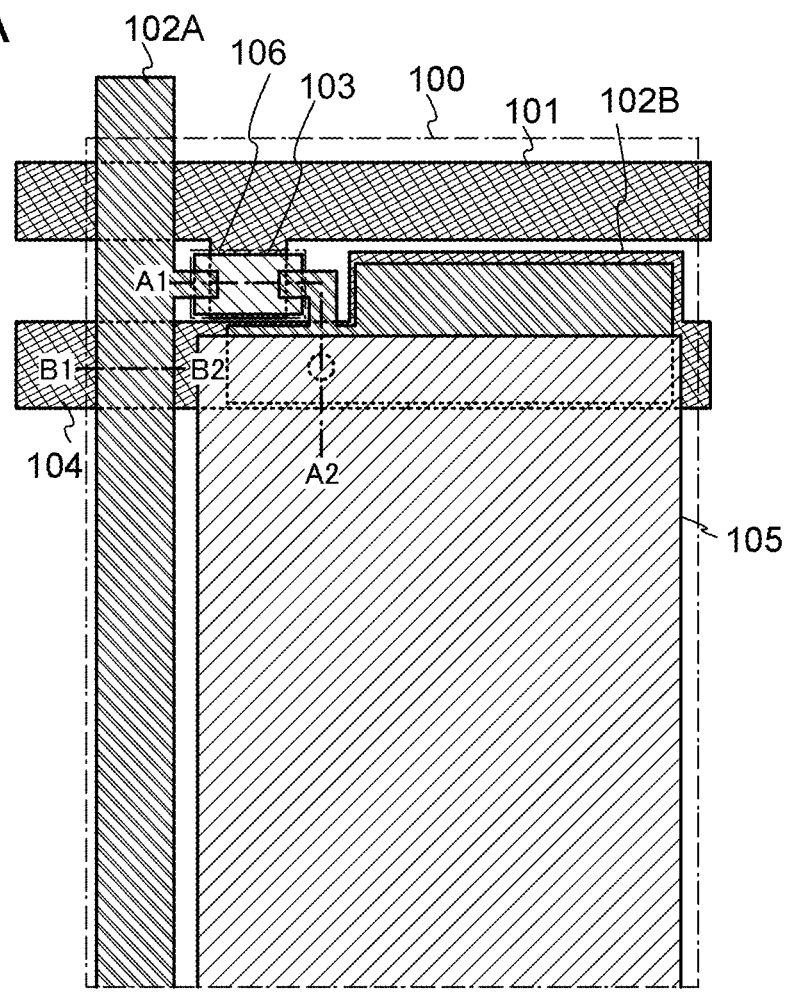
FIGS. 1A to 1C illustrate a top view and cross-sectional views of a liquid crystal display device.

Embodiments and examples of the present invention will be described in detail with reference to the drawings. Note that the invention is not limited to the following description, and it will be easily understood by those skilled in the art that various changes and modifications can be made without departing from the spirit and scope of the invention. Therefore, the present invention should not be interpreted as being limited to the description of the embodiments and examples below. Note that in the structure of the invention described below, portions that are identical or portions having similar functions in different drawings are denoted by the same reference numerals, and their repetitive description will be omitted.

Note that the size, the thickness of a layer, or a region of each structure illustrated in drawings in this specification is exaggerated for simplicity in some cases. Therefore, embodiments and examples of the present invention are not limited to such scales.

Note that the terms such as "first", "second", and "third" used in this specification are used just to avoid confusion of structural elements and do not mean limitation of the number of the structural elements. Therefore, for example, description can be made even when "first" is replaced with "second" or "third", as appropriate.

Embodiment 1

An example is described below in which a pixel of a liquid crystal display device is formed using a thin film transistor. In this embodiment, a thin film transistor (hereinafter also referred to as a TFT) included in a pixel of a liquid crystal display device, and an electrode functioning as a pixel electrode connected to the TFT (simply also referred to as a pixel electrode) are described as examples. Note that a pixel refers to an element group which includes elements provided in each pixel of a display device, for example, an element for controlling display in accordance with electric signals, such as a thin film transistor, an electrode functioning as a pixel electrode, or a wiring. Note that a pixel may include a color filter and the like, and may correspond to one color component whose brightness can be controlled with one pixel. Therefore, for example, in the case of a color display device including color components of R, G, and B, a minimum unit of an image includes three pixels of R, G, and B and an image can be obtained with a plurality of pixels. Note that an embodiment of the present invention is not limited to a color display device and may be a monochrome display device.

Note that "A and B are connected to each other" includes a case where A and B are electrically connected to each other and a case where A and B are directly connected to each other. Here, each of A and B corresponds to an object (e.g., a device, an element, a circuit, a wiring, an electrode, a terminal, a conductive film, a layer, or the like).

First, a top view of a pixel is illustrated in FIG. 1A. Note that FIG. 1A illustrates a bottom-gate structure as an example of a structure of a TFT. Note that FIG. 1A illustrates a so-called inverted staggered structure in which wiring layers serving as a source electrode and a drain electrode of a TFT are provided on the opposite side of an oxide semiconductor layer serving as a channel region with respect to a wiring serving as a gate.

A pixel 100 illustrated in FIG. 1A includes a first wiring 101 functioning as a scan line, a second wiring 102A functioning as a signal line, an oxide semiconductor layer 103, a capacitor line 104, and a pixel electrode 105. In addition, the pixel 100 includes a third wiring 102B for electrically connecting the oxide semiconductor layer 103 and the pixel electrode 105 to each other, in which a thin film transistor 106 is formed. The first wiring 101 is also a wiring functioning as a gate of the thin film transistor 106. The second wiring 102A is also a wiring functioning as one of a source electrode and a drain electrode and one electrode of a storage capacitor. The third wiring 102B is also a wiring functioning as the other of the source electrode and the drain electrode. The capacitor line 104 is a wiring functioning as the other electrode of the storage capacitor.

Note that for simplification of a process, it is preferable that the first wiring 101 and the capacitor line 104 are provided in the same layer and the second wiring 102A and the third wiring 102B are provided in the same layer. Furthermore, the third wiring 102B and the capacitor line 104 are provided so as to partly overlap each other and form the storage capacitor for a liquid crystal element. Note that the oxide semiconductor layer 103 included in the thin film transistor 106 is provided over a wiring diverging from the first wiring 101 with a gate insulating film (not shown) interposed therebetween.

Figure 1B:
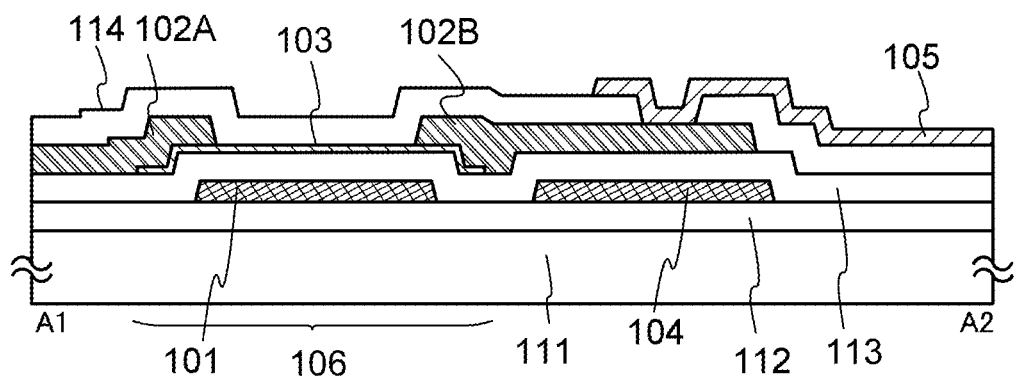

FIG. 1B illustrates a cross-sectional structure taken along chain line A1-A2 of FIG. 1A. In the cross-sectional structure illustrated in FIG. 1B, the first wiring 101 serving as a gate and the capacitor line 104 are provided over a substrate 111 with a base film 112 interposed therebetween. A gate insulating film 113 is provided so as to cover the first wiring 101 and the capacitor line 104. The oxide semiconductor layer 103 is provided over the gate insulating film 113. The second wiring 102A and the third wiring 102B are provided over the oxide semiconductor layer 103. In addition, an oxide insulating layer 114 functioning as a passivation film is provided over the oxide semiconductor layer 103, the second wiring 102A, and the third wiring 102B. An opening portion is formed in the oxide insulating layer 114, and in the opening portion, the pixel electrode 105 and the third wiring 102B are connected to each other. Furthermore, a capacitor is formed by the third wiring 102B, the capacitor line 104, and the gate insulating film 113 which serves as a dielectric.

Figure 1C:
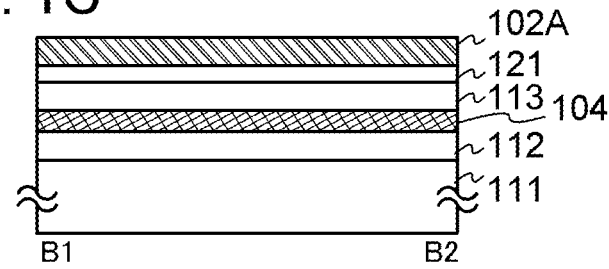

FIG. 1C illustrates a cross-sectional view taken along chain line B1-B2 of FIG. 1A and illustrates a structure in which an insulating layer 121 is provided between the capacitor line 104 and the second wiring 102A.

In the case where the second wiring 102A is provided over the first wiring 101 and the capacitor line 104, a parasitic capacitance may be generated between the first wiring 101 and the second wiring 102A and between the capacitor line 104 and the second wiring 102A, depending on the thickness of the gate insulating film 113. Therefore, by providing the insulating layer 121 as illustrated in FIG. 1C, a parasitic capacitance can be reduced and a defect such as malfunction can be reduced.

Figure 2:
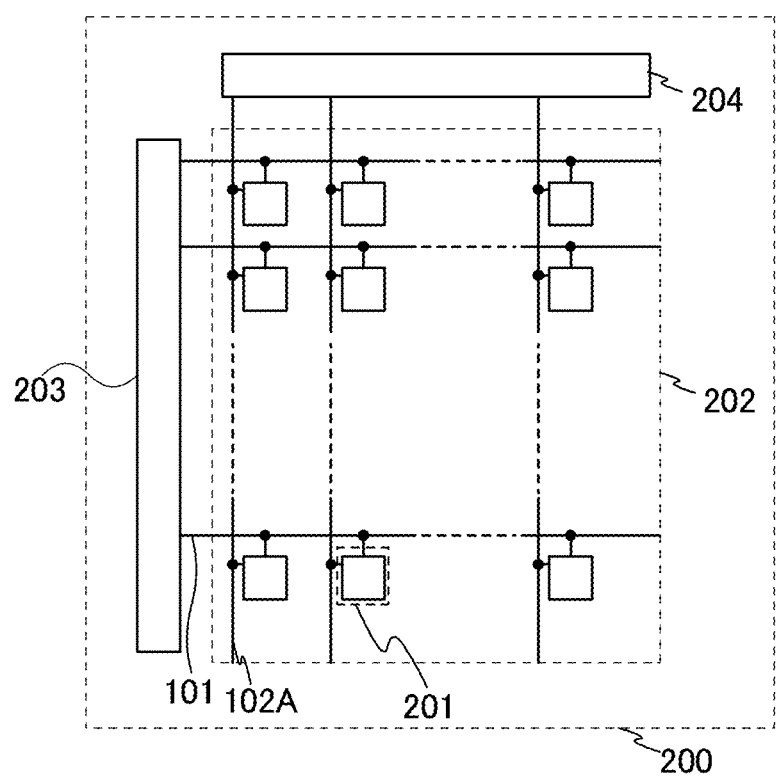
FIG. 2 is a block diagram of a liquid crystal display device.

Note that the pixel illustrated in FIGS. 1A to 1C corresponds to one of a plurality of pixels 201 arranged in matrix over a substrate 200 as illustrated in FIG. 2. FIG. 2 illustrates a structure in which a pixel portion 202, a scan line driver circuit 203, and a signal line driver circuit 204 are provided over the substrate 200. Whether the pixels 201 are in a selected state or in a non-selected state is determined for each line in accordance with a scan signal supplied from the first wiring 101 connected to the scan line driver circuit 203. The pixel 201 selected by the scan signal is supplied with a video voltage (also referred to as an image signal, a video signal, or video data) through the wiring 102A connected to the signal line driver circuit 204.

Although FIG. 2 illustrates a structure in which the scan line driver circuit 203 and the signal line driver circuit 204 are provided over the substrate 200, a structure may be employed in which one of the scan line driver circuit 203 and the signal line driver circuit 204 is provided over the substrate 200 and the other is formed over another substrate (e.g., a single crystal silicon substrate) and then connected to the pixel portion 202 by a mounting technique such as a TAB method or a COG method. Alternatively, a structure may be employed in which only the pixel portion 202 is provided over the substrate 200 and the scan line driver circuit 203 and the signal line driver circuit 204 are formed over another substrate and then connected to the pixel portion 202 by a mounting technique such as a TAB method or a COG method.

FIG. 2 illustrates an example in which the plurality of pixels 201 is arranged in matrix (in stripe) in the pixel portion 202. Note that the pixels 201 do not necessarily need to be arranged in matrix and may be arranged in a delta pattern or a Bayer pattern, for example. As a display method of the pixel portion 202, either a progressive method or an interlace method can be employed. Note that color components controlled in the pixel for color display are not limited to three colors of R, G, and B (R, G, and B correspond to red, greed, and blue, respectively) and color components of more than three colors may be employed, for example, R, G, B, and W (W corresponds to white), R, G, B, and one or more of yellow, cyan, magenta, and the like, or the like. Note that the sizes of display regions may be different between respective dots of color components.

In FIG. 2, the numbers of the first wirings 101 and the second wirings 102A correspond to the numbers of the pixels in a column direction and a row direction. Note that the numbers of the first wirings 101 and the second wirings 102A may be increased depending on the number of sub-pixels included in the pixels or the number of the transistors in the pixels. Alternatively, the pixel 201 may be driven by the first wiring 101 and the second wiring 102A which are shared with other pixels.

Note that FIG. 1A illustrates the second wiring 102A of the TFT as having a rectangular shape; alternatively, the second wiring 102A may be formed in such a shape as to surround the third wiring 102B (specifically, a U shape or a C shape) so that the area of a region in which carriers move can be increased and the amount of current flowing when the thin film transistor is turned on (also referred to as an on-state current) can be increased.

Note that in this specification, on-state current is current which flows between a source and a drain when a thin film transistor is in an on state (also called a conductive state). In the case of an n-channel thin film transistor, the on-state current means a current which flows between a source and a drain when a voltage applied between a gate and the source is higher than a threshold voltage (Vth).

Note that an aperture ratio refers to a ratio of an area of a light transmitting region to a unit area. As a region occupied by a member which does not transmit light becomes larger, the aperture ratio decreases, and as a region occupied by a member which transmits light becomes larger, the aperture ratio increases. In a liquid crystal display device, the aperture ratio increases by decreasing the area of a wiring or a capacitor line overlapping a pixel electrode and the size of a thin film transistor.

Note that a thin film transistor is an element having at least three terminals of a gate, a drain, and a source. The thin film transistor has a channel region between a drain region and a source region and allows a current to flow through the drain region, the channel region, and the source region. Here, since the source and the drain of the thin film transistor may change depending on the structure, the operating condition, and the like of the thin film transistor, it is difficult to define which is a source or a drain. Therefore, a region functioning as a source or a drain is not called the source or the drain in some cases. In such a case, for example, one of the source and the drain may be referred to as a first terminal and the other may be referred to as a second terminal. Alternatively, one of the source and the drain may be referred to as a first electrode and the other may be referred to as a second electrode. Further alternatively, one of the source and the drain may be referred to as a first region and the other may be referred to as a second region.

Next, the oxide semiconductor layer 103 will be described.

In this embodiment, from an oxide semiconductor, hydrogen (including an OH bond) is removed such that the concentration of hydrogen in the oxide semiconductor becomes $5\times10^{19}/cm^3$ or less, preferably $5\times10^{18}/cm^3$ or less, more preferably $5\times10^{17}/cm^3$ or less. Then, a thin film transistor whose channel region is formed using an oxide semiconductor film having a carrier concentration of less than $1\times10^{14}/cm^3$, preferably $1\times10^{12}/cm^3$ or less is formed. Note that the concentration of hydrogen in the oxide semiconductor layer is measured by an analysis by secondary ion mass spectrometry (SIMS).

When the energy gap of an oxide semiconductor is 2 eV or more, preferably 2.5 eV or more, more preferably 3 eV or more, carries generated by thermal excitation are so few that they can be ignored. Thus, impurities such as hydrogen which form donors are reduced as much as possible so that the carrier concentration becomes less than $1\times10^{14}/cm^3$, preferably $1\times10^{12}/cm^3$ or less. In other words, the carrier concentration of an oxide semiconductor layer is made as close to zero as possible.

When an oxide semiconductor which is purified by thoroughly removing hydrogen from the oxide semiconductor as described above is used for a channel formation region of a thin film transistor, the drain current is $1\times10^{-13}$ A or less at a drain voltage in the rang of from 1 V to 10 V and a gate voltage in the range of from −5 V to −20 V even in the case where the channel width is 10 mm.

In the case where a circuit of a display device or the like is manufactured using a thin film transistor having such an extremely small off-state current, there is very little leakage. Therefore, an electrical signal such as a video signal can be held for a longer period of time.

Specifically, the off-state current per micrometer of channel width of the aforementioned transistor including the oxide semiconductor layer and having a channel width of 10 μm can be as small as 10 aA/μm ($1\times10^{-17}$ A/μm) or less, and furthermore, 1 aA/μm ($1\times10^{-18}$ A/μm) or less. When a transistor having an extremely small current in an off state (off-state current) is used as a selection transistor in a pixel, an electrical signal such as a video signal can be held for a longer period of time. Because the holding time can be extended, for example, a holding period after writing of a video signal is set to 10 seconds or longer, preferably 30 seconds or longer, more preferably 1 minute or longer and shorter than 10 minutes. By extending the holding period, writing intervals can be set long and power consumption can be more effectively reduced.

On the other hand, in the case of a transistor including, for example, low-temperature polysilicon, design or the like is performed on the assumption that the off-state current is approximately $1\times10^{-12}$ A/μm. Therefore, in the case of a transistor including an oxide semiconductor, which has a storage capacitance equal to that of the transistor including low-temperature polysilicon (approximately 0.1 pF), the voltage holding period can be approximately $10^4$ times as long as that of the transistor including low-temperature polysilicon. Furthermore, in the case of a transistor including amorphous silicon, the off-state current per micrometer of channel width is $1\times10^{-13}$ A/μm or more. Therefore, the voltage holding period of a transistor including a high-purity oxide semiconductor can be $10^4$ or more times as long as that of a transistor using amorphous silicon when these transistors have storage capacitances which are equal or substantially equal to each other (approximately 0.1 pF).

For example, in an active matrix display device having a thin film transistor including low-temperature polysilicon, due to a leakage current of the thin film transistor, there is a loss of charges which are held in a pixel; thus, rewriting of a video signal is performed every 16 milliseconds (at 60 frames/second). On the other hand, in an active matrix display device having the aforementioned thin film transistor including the oxide semiconductor layer, the off-state current of the thin film transistor including the oxide semiconductor layer is much smaller than that in a thin film transistor including low-temperature polysilicon; thus, the holding period for every signal writing can be made 10000 times longer, which is approximately 160 seconds.

Because the holding period can be extended, the frequency of signal writing can be decreased particularly when a still image is displayed. Therefore, the number of times of signal writing to a pixel can be decreased, and power consumption can be reduced.

The storage capacitor illustrated in FIGS. 1A to 1C is formed by a pair of electrodes and an insulating layer provided as a dielectric between the pair of electrodes. The storage capacitance is set considering the leakage current of a thin film transistor provided in the pixel portion or the like so that charges can be held for a predetermined period. The size of the storage capacitor may be set considering the off-state current of a transistor or the like. In this embodiment, because a transistor including a high-purity oxide semiconductor layer is used as the transistor 106, it is sufficient to provide a storage capacitor having a capacitance which is ⅓ or less, preferably ⅕ or less, of a liquid crystal capacitance in each pixel.

In the case of the aforementioned transistor including the high-purity oxide semiconductor layer, the holding period can be set longer. Therefore, the frequency of signal writing can be drastically decreased particularly when a still image is displayed. Accordingly, in the case of displaying a still image or the like which involves less frequent changes in display, the number of times of signal writing to a pixel can be decreased, and thus, power consumption can be reduced.

Note that in still image display, refresh operation may be performed as appropriate considering a holding rate of a voltage applied to a liquid crystal element during a holding period. For example, refresh operation may be performed at the timing when a voltage is decreased to a predetermined level with respect to the value of voltage (initial value) shortly after a signal is written to a pixel electrode of a liquid crystal element. The predetermined level is preferably set to a voltage at which flicker is not sensed with respect to the initial value. Specifically, in the case where a display object is an image, refresh operation (rewrite) is preferably performed every time the voltage becomes 1.0%, preferably 0.3%, lower than the initial value. In the case where a display object is text, refresh operation (rewrite) is preferably performed every time the voltage becomes 10%, preferably 3%, lower than the initial value.

During the holding period in still image display, a counter electrode (also referred to as a common electrode) can be put in a floating state. Specifically, a switch may be provided between the counter electrode and a power source for supplying a common potential to the counter electrode. During the writing period, the switch may be turned on and the common potential may be supplied to the counter electrode; after that, during the holding period, the switch may be turned off and the counter electrode may be put in a floating state. As the switch, it is preferable to use the aforementioned transistor including the high-purity oxide semiconductor layer. With the use of a TFT including an oxide semiconductor having an extremely small off-state current as described above, the potential between the pixel electrode and the counter electrode of a liquid crystal display panel hardly changes, and the still image display can be maintained while a driver circuit is stopped without causing so-called image burn-in of a liquid crystal.

The specific resistance of a liquid crystal material is $1\times10^{12}$ Ω·cm or more, preferably $1\times10^{13}$ Ω·cm or more, more preferably $1\times10^{14}$ Ω·cm or more. Note that the specific resistance in this specification is measured at 20° C. In the case where a liquid crystal display device is formed using the liquid crystal material, the resistivity of a portion serving as a liquid crystal element may be $1\times10^{11}$ Ω·cm or more, furthermore $1\times10^{12}$ Ω·cm or more in some cases because there is a possibility that an impurity may be mixed into a liquid crystal layer from an alignment film, a sealant, or the like.

As the specific resistance of a liquid crystal material becomes larger, more charges leaking through the liquid crystal material can be reduced, and a decrease over time in voltage for holding an operation state of the liquid crystal element can be suppressed. As a result, the holding period can be extended; therefore, the frequency of signal writing can be decreased, and power consumption of a display device can be reduced.

Figure 3A:
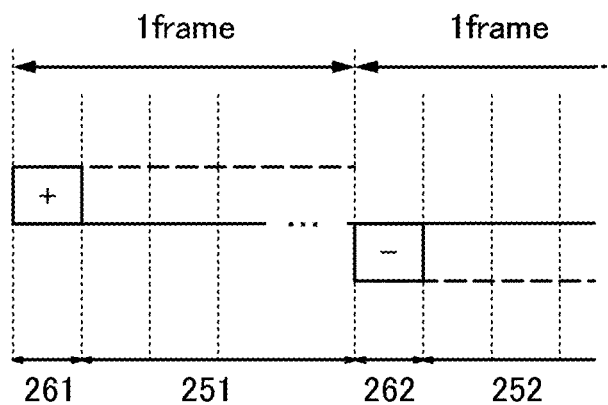
FIGS. 3A and 3B illustrate the operation of a liquid crystal display device.

FIG. 3A illustrates the relationship between a writing period and a holding period in a frame period. In FIG. 3A, periods 251 and 252 each correspond to a holding period, and periods 261 and 262 each correspond to a writing period.

In FIG. 3A, the polarity of a voltage applied to a liquid crystal element which is a display element (in the diagram, the polarity is indicated by a plus sign or a minus sign) is inverted in every frame period. Accordingly, the electric field applied to the liquid crystal element is not biased, and the degree of deterioration of the liquid crystal element can be decreased. In the case of the aforementioned thin film transistor including the oxide semiconductor layer, the holding period can be set longer; thus, the number of times of writing to a pixel can be drastically decreased. Therefore, in the case of displaying a still image or the like which involves less frequent changes in display, power consumption can be reduced.

Figure 3B:
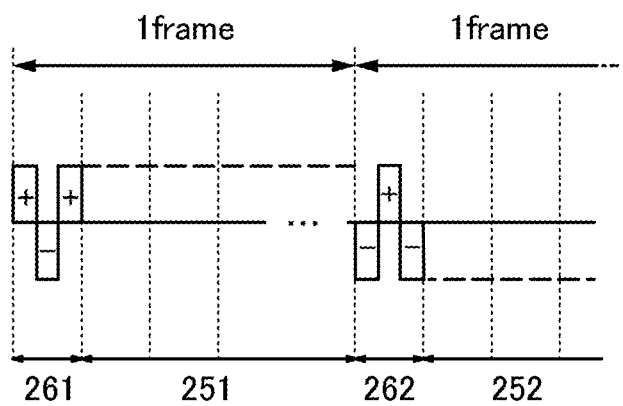

In addition, FIG. 3B illustrates the relationship in the case of writing a voltage whose polarity is inverted a plurality of times in each of the writing periods 261 and 262 of FIG. 3A. By writing a voltage whose polarity is inverted a plurality of times in each of the writing periods 261 and 262 as illustrated in FIG. 3B, the degree of deterioration of a liquid crystal element can be further decreased. Note that the polarity of the voltage applied at the end of each of the writing periods 261 and 262 is a polarity to be held in the holding period.

Note that the voltage applied to a liquid crystal element in FIGS. 3A and 3B may be input in accordance with dot inversion driving, source line inversion driving, gate line inversion driving, frame inversion driving, or the like.

Figure 4A:
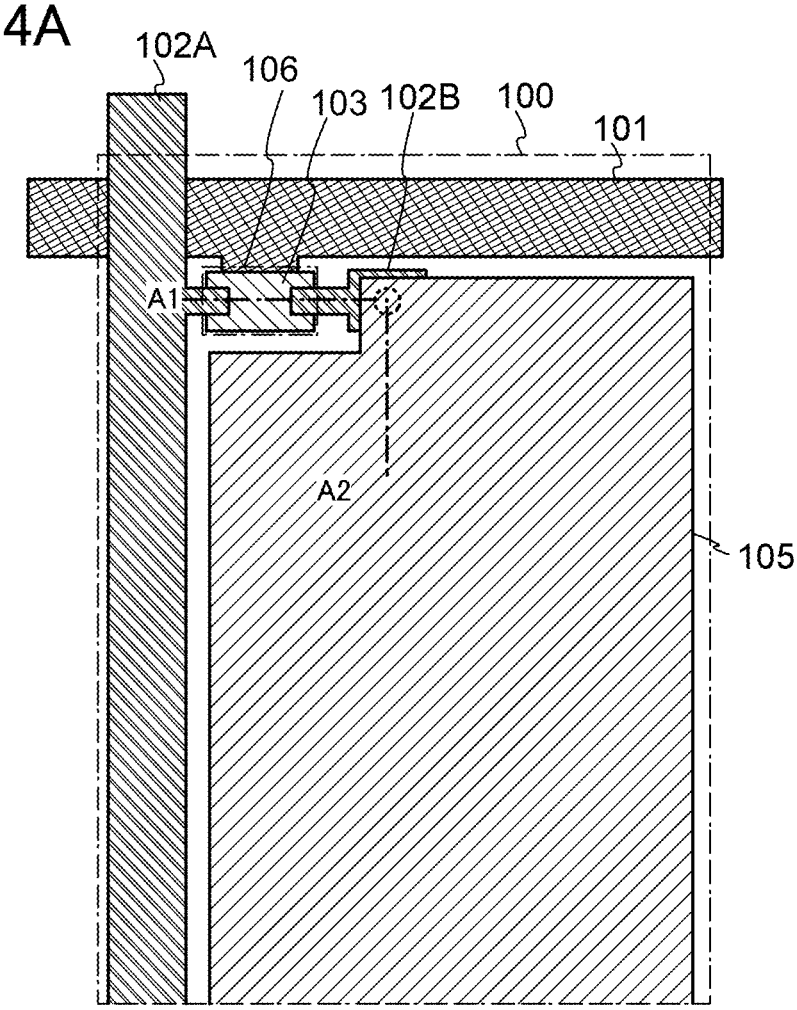
FIGS. 4A and 4B illustrate a top view and a cross-sectional view of a liquid crystal display device.
Figure 4B:
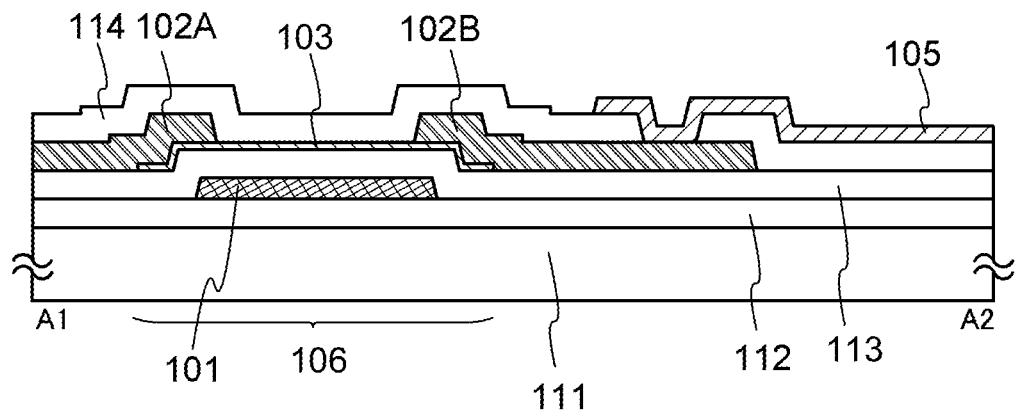

Note that in the case where a still image is not displayed and a pixel is formed using a thin film transistor including an oxide semiconductor layer, a moving image can be displayed without a storage capacitor. FIGS. 4A and 4B illustrate a top view and a cross-sectional view of a structure of a pixel in which a storage capacitor is not formed. The structure illustrated in FIGS. 4A and 4B corresponds to a structure in which the capacitor line in FIGS. 1A and 1B is omitted. As can also be seen from the top view of FIG. 4A and the cross-sectional view of FIG. 4B, with the use of a thin film transistor including an oxide semiconductor layer, a region occupied by the pixel electrode 105, i.e., the aperture ratio, can be increased. In addition, as can also be seen from the cross-sectional view of FIG. 4B, with the use of a thin film transistor including an oxide semiconductor layer, a capacitor line can be eliminated and a region occupied by the pixel electrode 105 can be enlarged; therefore, the aperture ratio can be increased.

With the structure described above in this embodiment, off-state current can be decreased in a pixel having a thin film transistor including an oxide semiconductor. Accordingly, a liquid crystal display device capable of extending the period in which a storage capacitor can hold a voltage and reducing power consumption when displaying a still image or the like can be obtained. Furthermore, by an increase in aperture ratio, a liquid crystal display device having a high-definition display portion can be obtained.

This embodiment can be implemented in appropriate combination with any of the structures described in other embodiments.

Embodiment 2

In this embodiment, an example of a thin film transistor which can be applied to a liquid crystal display device described in this specification will be described. A thin film transistor 410 described in this embodiment can be used as the thin film transistor 106 of Embodiment 1.

A thin film transistor of this embodiment and an embodiment of a method for manufacturing the thin film transistor are described using FIGS. 5A and 5B and FIGS. 6A to 6E.

Figure 5A:
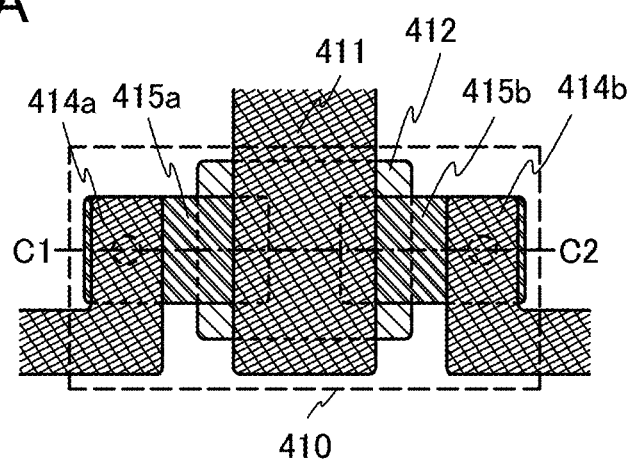
FIGS. 5A and 5B illustrate a thin film transistor.
Figure 5B:
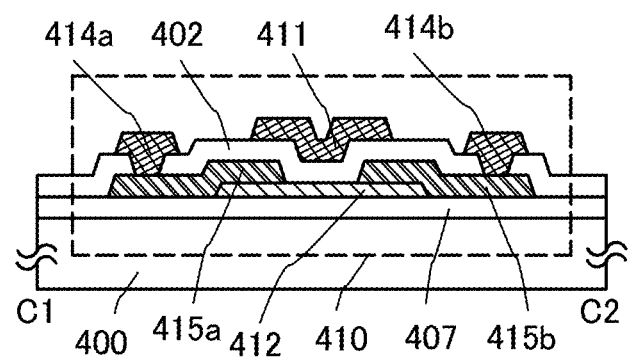

FIG. 5A illustrates an example of a planar structure of the thin film transistor, and FIG. 5B illustrates an example of a cross-sectional structure thereof. The thin film transistor 410 shown in FIGS. 5A and 5B is a top-gate thin film transistor.

FIG. 5A is a plan view of the top-gate thin film transistor 410 and FIG. 5B is a cross-sectional view along line C1-C2 in FIG. 5A.

The thin film transistor 410 includes, over a substrate 400 having an insulating surface, an insulating layer 407, an oxide semiconductor layer 412, a source and drain electrode layers 415a and 415b, a gate insulating layer 402, and a gate electrode layer 411. Wiring layers 414a and 414b are provided in contact with the source and drain electrode layers 415a and 415b, respectively, to be electrically connected thereto.

The thin film transistor 410 is described as a single-gate thin film transistor; a multi-gate thin film transistor including a plurality of channel formation regions can be formed when needed.

A process for manufacturing the thin film transistor 410 over the substrate 400 is described below with reference to FIGS. 6A to 6E.

Although there is no particular limitation on a substrate which can be used as the substrate 400 having an insulating surface, it is necessary that the substrate 400 has at least heat resistance high enough to withstand heat treatment to be performed later.

As the substrate 400, a glass substrate whose strain point is higher than or equal to 730° C. may be used when the temperature of the heat treatment performed later is high. As a material of the glass substrate, a glass material such as aluminosilicate glass, aluminoborosilicate glass, or barium borosilicate glass is used, for example. Note that by containing a larger amount of barium oxide (BaO) than boron oxide, a heat-resistant glass substrate which is of more practical use can be formed. Therefore, it is preferable that a glass substrate containing more BaO than $B_2O_3$ be used.

Note that a substrate formed using an insulator such as a ceramic substrate, a quartz substrate, or a sapphire substrate may be used instead of the above-described glass substrate, as the substrate 400. Alternatively, a crystallized glass substrate or the like may be used. Further alternatively, a plastic substrate or the like may be used.

First, the insulating layer 407 which functions as a base film is formed over the substrate 400 having an insulating surface. It is preferable that an oxide insulating layer such as a silicon oxide layer, a silicon oxynitride layer, an aluminum oxide layer, or an aluminum oxynitride layer be used as the insulating layer 407 which is in contact with the oxide semiconductor layer. The insulating layer 407 can be formed by a plasma CVD method, a sputtering method, or the like. It is preferable to form the insulating layer 407 by a sputtering method in order to prevent the insulating layer 407 from containing a large amount of hydrogen.

In this embodiment, a silicon oxide layer is formed as the insulating layer 407 by a sputtering method. The substrate 400 is transferred into a chamber, a sputtering gas containing high-purity oxygen in which hydrogen and moisture are removed is introduced into the chamber, and a target is used, so that the silicon oxide layer is deposited to the substrate 400 as the insulating layer 407. The substrate 400 may be at room temperature or may be heated.

For example, a silicon oxide film is formed as follows: quartz (preferably, synthetic quartz) is used as the target; the substrate temperature is 108° C.; the distance between the target and the substrate (T-S distance) is 60 mm; the pressure is 0.4 Pa; the high-frequency power is 1.5 kW; the atmosphere is oxygen and argon (flow rate ratio of oxygen to argon is 25 sccm: 25 sccm=1:1); and an RF sputtering method is used. The thickness of the silicon oxide film is 100 nm in this embodiment. A silicon target may be used instead of the quartz (preferably, synthetic quartz) to form the silicon oxide film. As a sputtering gas, oxygen or a mixed gas of oxygen and argon is used in this embodiment.

In that case, it is preferable to remove residual moisture in the chamber in the deposition of the insulating layer 407. This is in order to prevent the insulating layer 407 from containing hydrogen, a hydroxyl group, or moisture.

In order to remove residual moisture from the chamber, an adsorption-type vacuum pump is preferably used. For example, a cryopump, an ion pump, or a titanium sublimation pump is preferably used. As an exhaustion unit, a turbo molecular pump to which a cold trap is added may be used. In the chamber in which exhaustion is performed with the use of a cryopump, a hydrogen molecule, a compound including a hydrogen atom such as water ($H_2O$), or the like, for example, is exhausted. Accordingly, the concentration of impurities included in the insulating layer 407 formed in the chamber can be reduced.

It is preferable that a high-purity gas in which an impurity such as hydrogen, water, a hydroxyl group, or hydride is removed to 1 ppm or less, preferably 10 ppb or less be used as the sputtering gas for the deposition of the insulating layer 407.

Examples of a sputtering method include an RF sputtering method in which a high-frequency power source is used as a sputtering power source, a DC sputtering method, and a pulsed DC sputtering method in which a bias is applied in a pulsed manner. The RF sputtering method is mainly used in the case where an insulating film is formed, and the DC sputtering method is mainly used in the case where a metal film is formed.

There is also a multi-target sputtering apparatus in which a plurality of targets which are formed of different materials from each other can be set. With the multi-target sputtering apparatus, films of different materials can be stacked to be formed in the same chamber, or plural kinds of materials can be deposited by electric discharge at the same time in the same chamber.

In addition, there is also a sputtering apparatus provided with a magnet system inside the chamber and used for a magnetron sputtering method, or a sputtering apparatus used for an ECR sputtering method in which plasma generated with the use of microwaves is used without using glow discharge.

Further, as the deposition method using a sputtering method, there is a reactive sputtering method in which a target substance and a sputtering gas component are chemically reacted with each other during deposition to form a thin compound film thereof, or a bias sputtering method in which a voltage is also applied to a substrate during deposition.

The insulating layer 407 may have a stacked-layer structure; for example, a stacked-layer structure in which a nitride insulating layer such as a silicon nitride layer, a silicon nitride oxide layer, an aluminum nitride layer, or an aluminum nitride oxide layer and the above-described oxide insulating layer are stacked in this order over the substrate 400 may be used.

For example, a silicon nitride layer is formed between the silicon oxide layer and the substrate 400 by introducing a sputtering gas containing high-purity nitrogen in which hydrogen and moisture are removed and using a silicon target. In that case, it is preferable to remove residual moisture from the chamber in the formation of the silicon nitride layer as is the case of the deposition of the silicon oxide layer.

The substrate may be heated at the time of the film deposition of the silicon nitride layer.

In the case where the silicon nitride layer and the silicon oxide layer are stacked to form the insulating layer 407, the silicon nitride layer and the silicon oxide layer can be formed in the same chamber with the same silicon target. For example, first, a sputtering gas containing nitrogen is introduced and a silicon target placed inside the chamber is used to form the silicon nitride layer, and then, the sputtering gas is switched to a sputtering gas containing oxygen and the same silicon target is used to form the silicon oxide layer. Since the silicon nitride layer and the silicon oxide layer can be formed in succession without exposure to the air, an impurity such as hydrogen or moisture can be prevented from being adsorbed on a surface of the silicon nitride layer.

Next, an oxide semiconductor film is formed over the insulating layer 407.

In order to prevent the oxide semiconductor film from containing impurities such as hydrogen, a hydroxyl group, and moisture as much as possible, it is preferable to preheat the substrate 400 provided with the insulating layer 407 in a preheating chamber of the sputtering apparatus before the film formation so that an impurity such as hydrogen or moisture adsorbed on the substrate 400 is eliminated, and perform exhaustion. As an exhaustion unit provided in the preheating chamber, a cryopump is preferable. This preheating step is not necessarily performed.

Note that before the oxide semiconductor film is formed by a sputtering method, it is preferable to perform reverse sputtering in which an argon gas is introduced and plasma is generated so that dust on a surface of the insulating layer 407 is removed. The reverse sputtering is a method by which voltage is applied to a substrate side with a high-frequency power source in an argon atmosphere to generate plasma in the vicinity of the substrate without applying voltage to a target side, so that a surface is modified. Instead of the argon atmosphere, a nitrogen atmosphere, a helium atmosphere, an oxygen atmosphere, or the like may be used.

The oxide semiconductor film is formed by the sputtering method. The oxide semiconductor film is formed using an In—Ga—Zn—O-based oxide semiconductor film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, a Sn—O-based oxide semiconductor film, or a Zn—O-based oxide semiconductor film. In this embodiment, the oxide semiconductor film is formed by a sputtering method using an In—Ga—Zn—O-based oxide semiconductor target. Specifically, a target having a composition ratio of $In_2O_3:Ga_2O_3:ZnO=1:1:1$ [mol %] (that is, In:Ga:Zn=1:1:0.5 [atom %]) is used. Alternatively, a target having a composition ratio of In:Ga:Zn=1:1:1 [atom %] or In:Ga:Zn=1:1:2 [atom %] can be used. In this embodiment, the filling rate of the oxide semiconductor target is equal to or greater than 90% and equal to or less than 100%, preferably equal to or greater than 95% and equal to or less than 99.9%. With use of the oxide semiconductor target having high filling rate, the deposited oxide semiconductor film has high density. The atmosphere for the sputtering may be an atmosphere of a rare gas (typically, argon), an atmosphere of oxygen, or a mixed atmosphere of a rare gas and oxygen. The target may contain $SiO_2$ at 2 wt % or more and 10 wt % or less.

It is preferable that a high-purity gas in which an impurity such as hydrogen, water, a hydroxyl group, or hydride is removed to 1 ppm or less, preferably 10 ppb or less be used as the sputtering gas for the deposition of the oxide semiconductor film.

The oxide semiconductor film is formed over the substrate 400 as follows: the substrate is held in the chamber with pressure reduced, residual moisture in the chamber is removed, a sputtering gas from which hydrogen and moisture are removed is introduced, and the above-described target is used. In order to remove the residual moisture in the chamber, it is preferable to use an adsorption-type vacuum pump. For example, a cryopump, an ion pump, or a titanium sublimation pump is preferably used. As an exhaustion unit, a turbo molecular pump to which a cold trap is added may be used. In the chamber in which exhaustion is performed with the use of a cryopump, a hydrogen molecule, a compound including a hydrogen atom such as water ($H_2O$), a compound including a carbon atom, or the like is exhausted. Accordingly, the concentration of impurities included in the oxide semiconductor film formed in the chamber can be reduced. The substrate may be heated at the time of the film deposition of the oxide semiconductor film.

As an example of the film deposition condition, the following condition is employed: the temperature of the substrate is room temperature; the distance between the substrate and the target is 110 mm; the pressure is 0.4 Pa; the direct current (DC) power is 0.5 kW; and the atmosphere is oxygen and argon (the flow rate ratio of oxygen to argon is 15 sccm:30 sccm). It is preferable that a pulsed direct current (DC) power source be used because dust can be reduced and the film thickness can be made uniform. The oxide semiconductor film has a thickness of 2 nm to 200 nm, preferably 5 nm to 30 nm. Note that appropriate thickness of the oxide semiconductor film varies depending on a material thereof; therefore, the thickness may be determined as appropriate depending on the material.

Figure 6A:
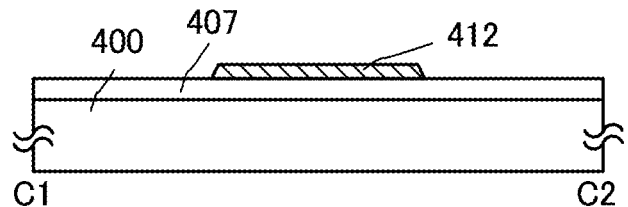
FIGS. 6A to 6E illustrate a method manufacturing a thin film transistor.
Figure 6B:
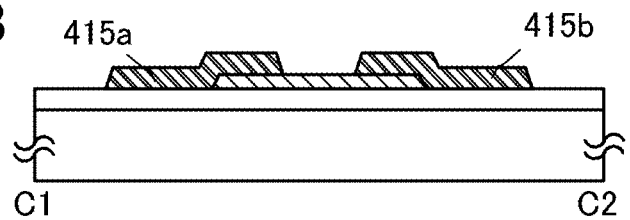

Next, the oxide semiconductor film is processed into the island-shaped oxide semiconductor layer 412 by a first photolithography step (see FIG. 6A). A resist mask for forming the island-shaped oxide semiconductor layer 412 may be formed using an inkjet method. Formation of the resist mask by an inkjet method needs no photomask; thus, manufacturing cost can be reduced.

Note that the etching of the oxide semiconductor film may be dry etching, wet etching, or both dry etching and wet etching.

As an etching gas for the dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel-plate RIE (reactive ion etching) method or an ICP (inductively coupled plasma) etching method can be used. In order to etch the layer into a desired shape, the etching conditions (the amount of electric power applied to a coil-shaped electrode, the amount of electric power applied to an electrode on a substrate side, the temperature of the electrode on the substrate side, or the like) are adjusted as appropriate.

As an etchant used for wet etching, a mixed solution of phosphoric acid, acetic acid, and nitric acid, an ammonium hydroxide/hydrogen peroxide mixture (a 31 wt % hydrogen peroxide solution:28 wt % ammonia water:water=5:2:2), or the like can be used. Alternatively, ITO-07N (produced by KANTO CHEMICAL CO., INC.) may be used.

After the wet etching, the etchant is removed by cleaning together with the material which is etched off. Waste liquid of the etchant containing the removed material may be purified and the material contained in the waste liquid may be reused. The resources can be efficiently used and the cost can be reduced by collecting and reusing a material such as indium included in the oxide semiconductor from the waste liquid after the etching.

The etching conditions (such as an etchant, etching time, or temperature) are appropriately adjusted depending on a material so that the material can be etched into a desired shape.

In this embodiment, the oxide semiconductor film is processed into the island-shaped oxide semiconductor layer 412 by a wet etching method using a solution obtained by mixing phosphoric acid, acetic acid, and nitric acid.

In this embodiment, a first heat treatment is performed on the oxide semiconductor layer 412. The temperature of the first heat treatment is higher than or equal to 400° C. and lower than or equal to 750° C., and higher than or equal to 400° C. and lower than the strain point of the substrate 400 when the strain point of the substrate 400 is lower than or equal to 750° C. In this embodiment, the substrate is put in an electric furnace which is a kind of heat treatment apparatus and heat treatment is performed on the oxide semiconductor layer at 450° C. for 1 hour in a nitrogen atmosphere, and then, the temperature is reduced to room temperature and water or hydrogen is prevented from entering the oxide semiconductor layer, without exposure to the air; thus, an oxide semiconductor layer is obtained. The oxide semiconductor layer 412 can be dehydrated or dehydrogenated by the first heat treatment.

The heat treatment apparatus is not limited to an electric furnace and may be provided with a device that heats an object to be processed by thermal conduction or thermal radiation from a heater such as a resistance heater or the like. For example, an RTA (rapid thermal annealing) apparatus such as a GRTA (gas rapid thermal annealing) apparatus or an LRTA (lamp rapid thermal annealing) apparatus can be used. The LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for heat treatment using a high-temperature gas. As the gas, an inert gas which does not react by heat treatment with the object to be processed, like nitrogen or a rare gas such as argon, is used.

For example, as the first heat treatment, GRTA may be performed as follows: the substrate is transferred into an inert gas heated to a high temperature of 650° C. to 700° C., heated for several minutes, and transferred and taken out of the inert gas heated to the high temperature. GRTA enables a high-temperature heat treatment in a short time.

In the first heat treatment, it is preferable that water, hydrogen, or the like be not contained in nitrogen or a rare gas such as helium, neon, or argon. It is preferable that nitrogen or a rare gas such as helium, neon, or argon which is introduced into the heat treatment apparatus have a purity of 6N (99.9999%) or more, more preferably 7N (99.99999%) or more (that is, the concentration of impurities be 1 ppm or less, more preferably 0.1 ppm or less).

Further, depending on the conditions of the first heat treatment or the material of the oxide semiconductor layer, the oxide semiconductor layer 412 might be crystallized to be a microcrystalline film or a polycrystalline film. For example, the oxide semiconductor layer may be crystallized to be a microcrystalline oxide semiconductor film in which the degree of crystallization is 90% or more, or 80% or more. Further, depending on the conditions of the first heat treatment or the material of the oxide semiconductor layer, the oxide semiconductor layer 412 may be an amorphous oxide semiconductor film which does not contain crystalline components. The oxide semiconductor layer may become an oxide semiconductor film in which a microcrystalline portion (with a grain diameter of 1 nm to 20 nm, typically 2 nm to 4 nm) is mixed in an amorphous oxide semiconductor.

The first heat treatment of the oxide semiconductor layer can also be performed on the oxide semiconductor film before being processed into the island-shaped oxide semiconductor layer 412. In that case, the substrate is taken out from the heat treatment apparatus after the first heat treatment, and then a photolithography step is performed thereon.

The example in which the heat treatment for dehydration or dehydrogenation of the oxide semiconductor layer is performed shortly after the formation of the oxide semiconductor layer 412 is described above. However, the heat treatment for dehydration or dehydrogenation may be performed after a source electrode and a drain electrode are stacked on the oxide semiconductor layer or after a gate insulating layer is formed over a source electrode and a drain electrode as long as it is performed after the deposition of the oxide semiconductor layer.

Next, a conductive film is formed over the insulating layer 407 and the oxide semiconductor layer 412. The conductive film may be formed by a sputtering method or a vacuum evaporation method. As a material of the conductive film, an element selected from Al, Cr, Cu, Ta, Ti, Mo, and W, an alloy containing any of these elements as a component, an alloy film containing any of these elements in combination, or the like can be given. Further, one or more materials selected from manganese, magnesium, zirconium, beryllium, and yttrium may be used. Further, the conductive film may have a single-layer structure or a stacked-layer structure of two or more layers. For example, a single-layer structure of an aluminum film including silicon, a two-layer structure in which a titanium film is stacked over an aluminum film, a three-layer structure in which a titanium film, an aluminum film, and a titanium film are stacked in this order, and the like can be given. Alternatively, a film, an alloy film, or a nitride film which contains aluminum (Al) and one or more elements selected from titanium (Ti), tantalum (Ta), tungsten (W), molybdenum (Mo), chromium (Cr), neodymium (Nd), and scandium (Sc) may be used. In this embodiment, a titanium film with a thickness of 150 nm is formed as the conductive film by a sputtering method.

Next, a resist mask is formed over the conductive film by a second photolithography step. The resist mask may be formed using an inkjet method. Formation of the resist mask by an inkjet method needs no photomask; thus, manufacturing cost can be reduced. After that, selective etching is performed, so that the source and drain electrode layers 415a and 415b are formed, and then, the resist mask is removed (see FIG. 6B). It is preferable that an end portion of each of the source and drain electrode layers have a tapered shape because coverage with a gate insulating layer stacked thereover is improved.

Note that each material and etching conditions are adjusted as appropriate such that the oxide semiconductor layer 412 is not removed by the etching of the conductive film and the insulating layer 407 under the oxide semiconductor layer 412 is not exposed.

In this embodiment, since the Ti film is used as the conductive film and the In—Ga—Zn—O-based oxide semiconductor is used for the oxide semiconductor layer 412, an ammonium hydrogen peroxide solution (a mixed solution of ammonia, water, and a hydrogen peroxide solution) is used as an etchant.

In the second photolithography step, in some cases, part of the oxide semiconductor layer 412 is etched, whereby an oxide semiconductor layer having a groove (a depression portion) may be formed.

Light exposure at the time of the formation of the resist mask in the second photolithography step may be performed using ultraviolet light, KrF laser light, or ArF laser light. The channel length L of a thin film transistor to be formed is determined by a distance between a lower end of the source electrode layer and a lower end of the drain electrode layer, which are adjacent to each other over the oxide semiconductor layer 412. In the case where light exposure is performed for a channel length L of less than 25 nm, the light exposure at the time of the formation of the resist mask in the second photolithography step is performed using extreme ultraviolet light having an extremely short wavelength of several nanometers to several tens of nanometers. In the light exposure by extreme ultraviolet light, the resolution is high and the focus depth is large. Accordingly, the channel length L of the thin film transistor can be made to be 10 nm to 1000 nm, the operation speed of a circuit can be increased, and low power consumption can be achieved by extremely small off-state current.

Figure 6C:
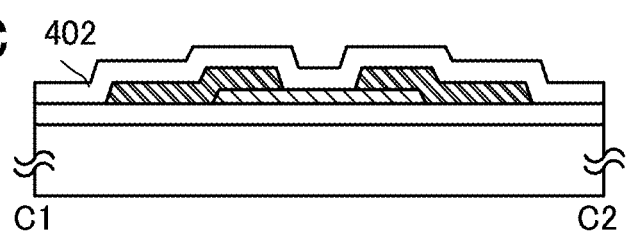

Next, the gate insulating layer 402 is formed over the insulating layer 407, the oxide semiconductor layer 412, and the source and drain electrode layers 415a and 415b (see FIG. 6C).

The gate insulating layer 402 can be formed with a single-layer structure or a stacked-layer structure using one or more of a silicon oxide layer, a silicon nitride layer, a silicon oxynitride layer, a silicon nitride oxide layer, and an aluminum oxide layer by a plasma CVD method, a sputtering method, or the like. In order to prevent the gate insulating layer 402 from containing a large amount of hydrogen, it is preferable to form the gate insulating layer 402 by a sputtering method. In the case of forming a silicon oxide film by a sputtering method, a silicon target or a quartz target is used as a target, and oxygen or a mixed gas of oxygen and argon is used as a sputtering gas. In this embodiment, a 100-nm-thick silicon oxide layer is formed as follows: the pressure is 0.4 Pa; the high-frequency power is 1.5 kW; the atmosphere is oxygen and argon (flow rate ratio of oxygen to argon is 25 sccm:25 sccm=1:1); and an RF sputtering method is used.

The gate insulating layer 402 can have a structure in which a silicon oxide layer and a silicon nitride layer are stacked in this order over the substrate. A gate insulating layer having a thickness of 70 nm to 400 nm, for example, 100 nm, may be formed in such a manner that a silicon oxide layer ($SiO_x$ (x>0)) having a thickness of 5 nm to 300 nm is formed by a sputtering method as a first gate insulating layer and then a silicon nitride layer ($SiN_y$ (y>0)) having a thickness of 50 nm to 200 nm is stacked as a second gate insulating layer over the first gate insulating layer.

Figure 6D:
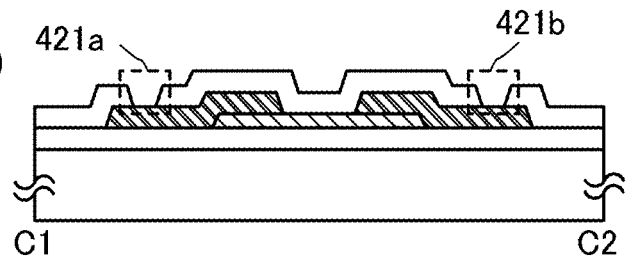

Next, a resist mask is formed by a third photolithography step, and selective etching is performed to remove parts of the gate insulating layer 402, so that openings 421a and 421b reaching the source and drain electrode layers 415a and 415b are formed (see FIG. 6D).

Next, a conductive film is formed over the gate insulating layer 402 and the openings 421a and 421b. In this embodiment, a titanium film with a thickness of 150 nm is formed by a sputtering method. After that, a resist mask is formed over the conductive film by a fourth photolithography step, and the conductive film is selectively etched using the resist mask, so that the gate electrode layer 411 and the wiring layers 414a and 414b are formed. Note that the resist mask may be formed by an inkjet method. Formation of the resist mask by an inkjet method needs no photomask; thus, manufacturing cost can be reduced.

The gate electrode layer 411 and the wiring layers 414a and 414b can each be formed to have a single-layer or stacked-layer structure using a metal material such as molybdenum, titanium, chromium, tantalum, tungsten, aluminum, copper, neodymium, or scandium, or an alloy material which contains any of these materials as its main component.

For example, as a two-layer structure of each of the gate electrode layer 411 and the wiring layers 414a and 414b, any of the following structures is preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. As a three-layer structure, a stack of a tungsten layer or a tungsten nitride layer, a layer of an alloy of aluminum and silicon or an alloy of aluminum and titanium, and a titanium nitride layer or a titanium layer is preferable. The gate electrode layer can be formed using a light transmitting conductive film. As an example of a material of the light transmitting conductive film, a light transmitting conductive oxide can be given.

Next, a second heat treatment (preferably at a temperature of 200° C. to 400° C., for example, at a temperature of 250° C. to 350° C.) is performed in an inert gas atmosphere or an oxygen gas atmosphere. In this embodiment, the second heat treatment is performed at 250° C. for 1 hour in a nitrogen atmosphere. The second heat treatment may be performed after a protective insulating layer or a planarization insulating layer is formed over the thin film transistor 410.

Furthermore, heat treatment may be performed at a temperature of 100° C. to 200° C. for 1 hour to 30 hours in the air. This heat treatment may be performed at a fixed heating temperature. Alternatively, the following change in the heating temperature may be conducted plural times repeatedly: the heating temperature is increased from room temperature to a temperature of 100° C. to 200° C. and then decreased to room temperature. This heat treatment may be performed under a reduced pressure before the formation of the oxide insulating layer. Under the reduced pressure, the heat treatment time can be shortened.

Figure 6E:
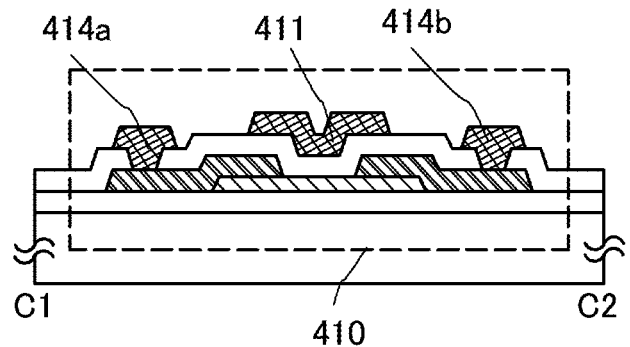

Through the above-described process, the thin film transistor 410 including the oxide semiconductor layer 412 in which the concentration of hydrogen, moisture, hydride, and hydroxide is reduced can be formed (see FIG. 6E). The thin film transistor 410 can be used as the thin film transistor 106 described in Embodiment 1.

A protective insulating layer or a planarization insulating layer for planarization may be provided over the thin film transistor 410. For example, the protective insulating layer can be formed with a single-layer structure or a stacked-layer structure using one or more of a silicon oxide layer, a silicon nitride layer, a silicon oxynitride layer, a silicon nitride oxide layer, and an aluminum oxide layer.

The planarization insulating layer can be formed using a heat-resistant organic material such as polyimide, acrylic, benzocyclobutene, polyamide, or epoxy. Other than such organic materials, it is possible to use a low-dielectric constant material (a low-k material), a siloxane-based resin, PSG (phosphosilicate glass), BPSG (borophosphosilicate glass), or the like. The planarization insulating layer may be formed by stacking a plurality of insulating films formed using these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. The organic group may include a fluoro group.

There is no particular limitation on the method for forming the planarization insulating layer. The planarization insulating layer can be formed, depending on a material thereof, by a method such as a sputtering method, an SOG method, a spin coating method, a dipping method, a spray coating method, or a droplet discharge method (e.g., an inkjet method, screen printing, or offset printing), or with the use of a tool such as a doctor knife, a roll coater, a curtain coater, or a knife coater.

By removing residual moisture in the reaction atmosphere at the time of the film deposition of the oxide semiconductor film as described above, the concentration of hydrogen and hydride in the oxide semiconductor film can be reduced. Accordingly, the oxide semiconductor film can be stabilized.

By using the thin film transistor, which includes the oxide semiconductor layer and is manufactured as described above, in each of a plurality of pixels of a display portion of a liquid crystal display device, the leakage current from the pixel can be reduced. Accordingly, a liquid crystal display device capable of extending the period in which a storage capacitor can hold a voltage and reducing power consumption when displaying a still image or the like can be obtained.

This embodiment can be implemented in appropriate combination with any of the structures described in other embodiments.

Embodiment 3

In this embodiment, another example of a thin film transistor which can be applied to a liquid crystal display device disclosed in this specification will be described. Note that Embodiment 2 can be referred to for the same portions as and the portions and steps having functions similar to those in Embodiment 2, and description thereof is not repeated. Further, a specific description for the same portions is omitted. A thin film transistor 460 described in this embodiment can be used as the thin film transistor 106 of Embodiment 1.

A thin film transistor of this embodiment and an embodiment of a method for manufacturing the thin film transistor are described using FIGS. 7A and 7B and FIGS. 8A to 8E.

Figure 7A:
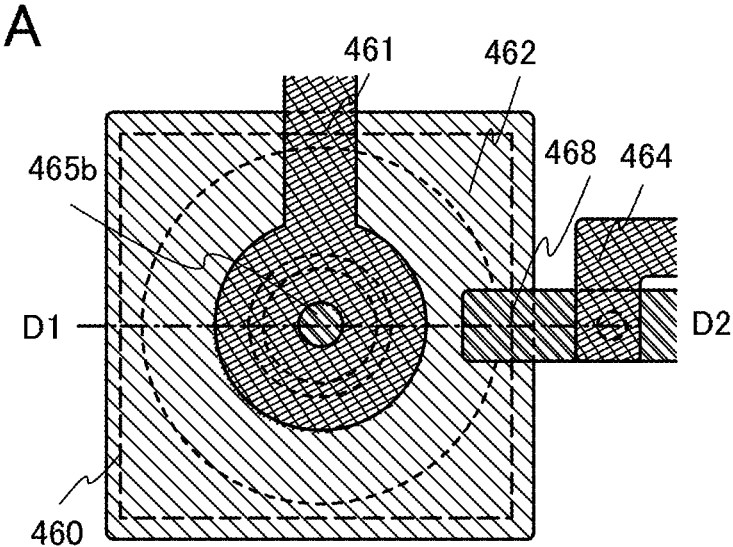
FIGS. 7A and 7B illustrate a thin film transistor.
Figure 7B:
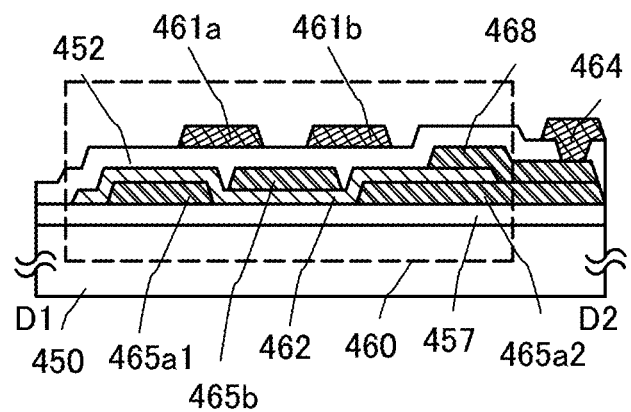

FIG. 7A illustrates an example of a planar structure of the thin film transistor, and FIG. 7B illustrates an example of a cross-sectional structure thereof. The thin film transistor 460 shown in FIGS. 7A and 7B is a top-gate thin film transistor.

FIG. 7A is a plan view of the top-gate thin film transistor 460 and FIG. 7B is a cross-sectional view along line D1-D2 in FIG. 7A.

The thin film transistor 460 includes over, a substrate 450 having an insulating surface, an insulating layer 457, a source or drain electrode layer 465a (465a1 and 465a2), an oxide semiconductor layer 462, a source or drain electrode layer 465b, a wiring layer 468, a gate insulating layer 452, and a gate electrode layer 461 (461a and 461b). The source or drain electrode layer 465a (465a1 and 465a2) is electrically connected to a wiring layer 464 through the wiring layer 468. Further, although not shown, the source or drain electrode layer 465b is also electrically connected to the wiring layer in an opening formed in the gate insulating layer 452.

A process for manufacturing the thin film transistor 460 over the substrate 450 is described below with reference to FIGS. 8A to 8E.

First, the insulating layer 457 which functions as a base film is formed over the substrate 450 having an insulating surface.

In this embodiment, a silicon oxide layer is formed as the insulating layer 457 by a sputtering method. The substrate 450 is transferred into a chamber, a sputtering gas containing high-purity oxygen in which hydrogen and moisture are removed is introduced into the chamber, and a silicon target or quartz (preferably, synthetic quartz) is used, so that the silicon oxide layer is deposited to the substrate 450 as the insulating layer 457. As a sputtering gas, oxygen or a mixed gas of oxygen and argon is used in this embodiment.

For example, a silicon oxide film is formed in this embodiment as follows: quartz (preferably, synthetic quartz) which has a purity of 6N is used as the target; the substrate temperature is 108° C.; the distance between the target and the substrate (T-S distance) is 60 mm; the pressure is 0.4 Pa; the high-frequency power is 1.5 kW; the atmosphere is oxygen and argon (flow rate ratio of oxygen to argon is 25 sccm:25 sccm=1:1); and an RF sputtering method is used. The thickness of the silicon oxide film is 100 nm in this embodiment. A silicon target may be used instead of the quartz (preferably, synthetic quartz) to form the silicon oxide film.

In that case, it is preferable to remove residual moisture in the chamber in the deposition of the insulating layer 457. This is in order to prevent the insulating layer 457 from containing hydrogen, a hydroxyl group, or moisture. In the chamber in which exhaustion is performed with the use of a cryopump, a hydrogen molecule, a compound including a hydrogen atom such as water ($H_2O$), or the like, for example, is exhausted. Accordingly, the concentration of impurities included in the insulating layer 457 formed in the chamber can be reduced.

It is preferable that a high-purity gas in which an impurity such as hydrogen, water, a hydroxyl group, or hydride is removed to 1 ppm or less, preferably 10 ppb or less, be used as the sputtering gas for the deposition of the insulating layer 457.

The insulating layer 457 may have a stacked-layer structure; for example, a stacked-layer structure in which a nitride insulating layer such as a silicon nitride layer, a silicon nitride oxide layer, an aluminum nitride layer, or an aluminum nitride oxide layer and the above-described oxide insulating layer are stacked in this order over the substrate 450 may be used.

For example, a silicon nitride layer is formed between the silicon oxide layer and the substrate 450 by introducing a sputtering gas containing high-purity nitrogen in which hydrogen and moisture are removed and using a silicon target. In that case, it is also preferable to remove residual moisture in the chamber in the formation of the silicon nitride layer as is the case of the deposition of the silicon oxide layer.

Next, a conductive film is formed over the insulating layer 457. As a material of the conductive film, an element selected from Al, Cr, Cu, Ta, Ti, Mo, and W, an alloy containing any of these elements as a component, an alloy film containing any of these elements in combination, or the like can be given. Further, one or more materials selected from manganese, magnesium, zirconium, beryllium, and yttrium may be used. Further, the conductive film may have a single-layer structure or a stacked-layer structure of two or more layers. For example, a single-layer structure of an aluminum film including silicon, a two-layer structure in which a titanium film is stacked over an aluminum film, a three-layer structure in which a titanium film, an aluminum film, and a titanium film are stacked in this order, and the like can be given. Alternatively, a film, an alloy film, or a nitride film which contains aluminum (Al) and one or a plurality of elements selected from titanium (Ti), tantalum (Ta), tungsten (W), molybdenum (Mo), chromium (Cr), neodymium (Nd), and scandium (Sc) may be used. In this embodiment, a titanium film with a thickness of 150 nm is formed as the conductive film by a sputtering method. Next, a resist mask is formed over the conductive film by a first photolithography step, and the source or drain electrode layers 465a1 and 465a2 are formed by selective etching, and then, the resist mask is removed (see FIG. 8A). The source or drain electrode layers 465a1 and 465a2, which are shown as being cut in the cross-sectional view, are one continuous film. It is preferable that an end portion of the each of the source or drain electrode layers have a tapered shape because coverage with a gate insulating layer stacked thereover is improved.

Next, an oxide semiconductor film with a thickness of 2 nm to 200 nm is formed. Note that appropriate thickness of the oxide semiconductor film varies depending on a material thereof; therefore, the thickness may be determined as appropriate depending on the material. In this embodiment, the oxide semiconductor film is formed by a sputtering method with the use of an In—Ga—Zn—O-based oxide semiconductor target.

The oxide semiconductor film is formed over the substrate 450 as follows: the substrate is held in the chamber with pressure reduced, residual moisture in the chamber is removed, a sputtering gas from which hydrogen and moisture are removed is introduced, and a target is used. In order to remove the residual moisture in the chamber, it is preferable to use an adsorption-type vacuum pump. For example, a cryopump, an ion pump, or a titanium sublimation pump is preferably used. As an exhaustion unit, a turbo molecular pump to which a cold trap is added may be used.

In the chamber in which exhaustion is performed with the use of a cryopump, a hydrogen molecule, a compound including a hydrogen atom such as water ($H_2O$), a compound including a carbon atom, or the like is exhausted. Accordingly, the concentration of impurities included in the oxide semiconductor film formed in the chamber can be reduced. The substrate may be heated at the time of the film deposition of the oxide semiconductor film.

It is preferable that a high-purity gas in which an impurity such as hydrogen, water, a hydroxyl group, or hydride is removed to 1 ppm or less, preferably 10 ppb or less be used as the sputtering gas for the deposition of the oxide semiconductor film.

As an example of the film deposition condition, the following condition is employed: the temperature of the substrate is room temperature; the distance between the substrate and the target is 110 mm; the pressure is 0.4 Pa; the direct current (DC) power is 0.5 kW; and the atmosphere is oxygen and argon (the flow rate ratio of oxygen to argon is 15 sccm:30 sccm).

Figure 8A:
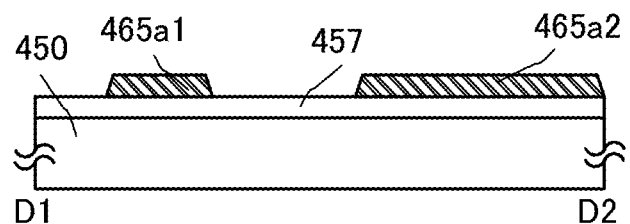
FIGS. 8A to 8E illustrate a thin film transistor.
Figure 8B:
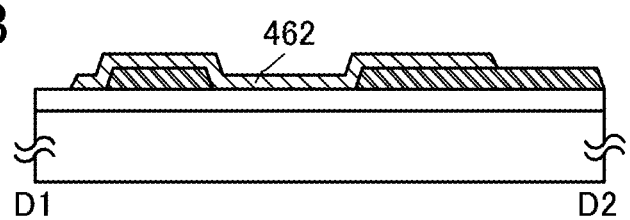
Figure 8C:
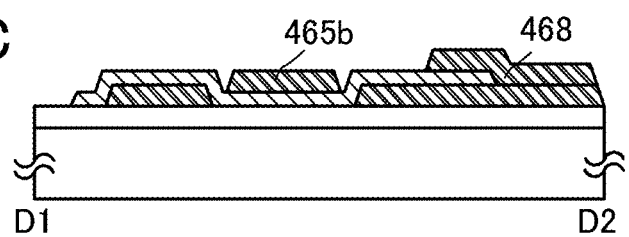

Next, the oxide semiconductor film is processed into the island-shaped oxide semiconductor layer 462 by a second photolithography step (see FIG. 8B). In this embodiment, the oxide semiconductor film is processed into the island-shaped oxide semiconductor layer 462 by a wet etching method using a solution obtained by mixing phosphoric acid, acetic acid, and nitric acid.

In this embodiment, a first heat treatment is performed on the oxide semiconductor layer 462. The temperature of the first heat treatment is higher than or equal to 400° C. and lower than or equal to 750° C., and higher than or equal to 400° C. and lower than the strain point of the substrate 450 when the strain point of the substrate 450 is lower than or equal to 750° C. In this embodiment, the substrate is put in an electric furnace which is a kind of heat treatment apparatus and heat treatment is performed on the oxide semiconductor layer at 450° C. for 1 hour in a nitrogen atmosphere, and then, the temperature is reduced to room temperature and water or hydrogen is prevented from entering the oxide semiconductor layer, without exposure to the air; thus, an oxide semiconductor layer is obtained. The oxide semiconductor layer 462 can be dehydrated or dehydrogenated by the first heat treatment.

The heat treatment apparatus is not limited to an electric furnace and may be provided with a device that heats an object to be processed by thermal conduction or thermal radiation from a heater such as a resistance heater or the like. For example, an RTA (rapid thermal annealing) apparatus such as a GRTA (gas rapid thermal annealing) apparatus or an LRTA (lamp rapid thermal annealing) apparatus can be used. For example, as the first heat treatment, GRTA may be performed as follows: the substrate is transferred into an inert gas heated to a high temperature of 650° C. to 700° C., heated for several minutes, and transferred and taken out of the inert gas heated to the high temperature. GRTA enables a high-temperature heat treatment in a short time.

In the first heat treatment, it is preferable that water, hydrogen, or the like be not contained in nitrogen or a rare gas such as helium, neon, or argon. It is preferable that nitrogen or a rare gas such as helium, neon, or argon which is introduced into the heat treatment apparatus have a purity of 6N (99.9999%) or more, more preferably 7N (99.99999%) or more (that is, the concentration of impurities be 1 ppm or less, more preferably 0.1 ppm or less).

Further, depending on the conditions of the first heat treatment or the material of the oxide semiconductor layer, the oxide semiconductor layer 462 might be crystallized to be a microcrystalline film or a polycrystalline film.

The first heat treatment of the oxide semiconductor layer can also be performed on the oxide semiconductor film before being processed into the island-shaped oxide semiconductor layer. In that case, the substrate is taken out from the heat treatment apparatus after the first heat treatment, and then a photolithography step is performed thereon.

The example in which the heat treatment for dehydration or dehydrogenation of the oxide semiconductor layer is performed shortly after the formation of the oxide semiconductor layer 462 is described above. However, the heat treatment for dehydration or dehydrogenation may be performed after the source or drain electrode 465b is stacked on the oxide semiconductor layer or after the gate insulating layer 452 is formed over the source or drain electrode 465b as long as it is performed after the deposition of the oxide semiconductor layer.

Next, a conductive film is formed over the insulating layer 457 and the oxide semiconductor layer 462. After that, a resist mask is formed over the conductive film by a third photolithography step, the conductive film is selectively etched to form the source or drain electrode layer 465b and the wiring layer 468, and then, the resist mask is removed (see FIG. 8C). The source or drain electrode layer 465b and the wiring layer 468 may be each formed by a similar material and a similar step to the material and the step of each of the source or drain electrode layers 465a1 and 465a2.

In this embodiment, a 150-nm-thick titanium film is formed as each of the source or drain electrode layer 465b and the wiring layer 468 by a sputtering method. In this embodiment, since the source or drain electrode layers 465a1 and 465a2 and the source or drain electrode layer 465b are titanium films which are the same as each other, etching selectivity between the source or drain electrode layer 465b and each of the source or drain electrode layers 465a1 and 465a2 cannot be provided. Therefore, in order to prevent the source or drain electrode layers 465a1 and 465a2 from being etched when the source or drain electrode layer 465b is etched, the wiring layer 468 is provided over the source or drain electrode layer 465a2 which is not covered with the oxide semiconductor layer 462. In the case where different materials which have high selectivity at the time of etching are used to form the source or drain electrode layers 465a1 and 465a2 and the source or drain electrode layer 465b, the wiring layer 468 by which the source or drain electrode layer 465a2 is protected at the time of etching is not necessarily provided.

The oxide semiconductor layer 462 may be partly etched off by the etching of the conductive film. Materials and the etching conditions are controlled as appropriate so as not to remove the oxide semiconductor layer 462 beyond necessity.

In this embodiment, since the Ti film is used as the conductive film and the In—Ga—Zn—O-based oxide semiconductor is used as the oxide semiconductor layer 462, an ammonium hydrogen peroxide solution (a mixed solution of ammonia, water, and a hydrogen peroxide solution) is used as an etchant.

In the second photolithography step, in some cases, part of the oxide semiconductor layer 462 is etched, whereby an oxide semiconductor layer having a groove (a depression portion) may be formed. The resist mask used for forming the source or drain electrode layer 465b and the wiring layer 468 may be formed by an inkjet method. Formation of the resist mask by an inkjet method needs no photomask; thus, manufacturing cost can be reduced.

Next, the gate insulating layer 452 is formed over the insulating layer 457, the oxide semiconductor layer 462, the source or drain electrode layers 465a1 and 465a2, and the source or drain electrode layer 465b.

The gate insulating layer 452 can be formed with a single-layer structure or a stacked-layer structure using one or more of a silicon oxide layer, a silicon nitride layer, a silicon oxynitride layer, a silicon nitride oxide layer, and an aluminum oxide layer by a plasma CVD method, a sputtering method, or the like. In order to prevent the gate insulating layer 452 from containing a large amount of hydrogen, it is preferable to form the gate insulating layer 452 by a sputtering method. In the case of forming a silicon oxide film by a sputtering method, a silicon target or a quartz target is used as a target, and oxygen or a mixed gas of oxygen and argon is used as a sputtering gas.

The gate insulating layer 452 may have a structure in which a silicon oxide layer and a silicon nitride layer are stacked in this order over the source or drain electrode layers 465a1 and 465a2 and the source or drain electrode layer 465b. In this embodiment, a 100-nm-thick silicon oxide layer is formed as follows: the pressure is 0.4 Pa; the high-frequency power is 1.5 kW; the atmosphere is oxygen and argon (flow rate ratio of oxygen to argon is 25 sccm:25 sccm=1:1); and an RF sputtering method is used.

Figure 8D:
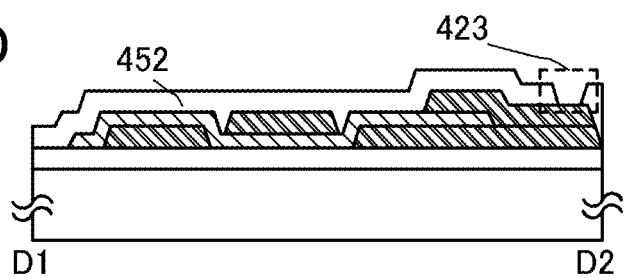

Next, a resist mask is formed by a fourth photolithography step, and etching is selectively performed to remove part of the gate insulating layer 452, so that an opening 423 reaching the wiring layer 468 is formed (see FIG. 8D). An opening reaching the source or drain electrode layer 465b may be formed when the opening 423 is formed, though not shown. In this embodiment, the opening reaching the source or drain electrode layer 465b is formed after stacking an interlayer insulating layer, and a wiring layer for electrical connection is formed in the opening.

Next, a conductive film is formed over the gate insulating layer 452 and the opening 423. After that, a fifth photolithography step is performed, so that the gate electrode layer 461 (461a and 461b) and the wiring layer 464 are formed. Note that a resist mask may be formed by an inkjet method. Formation of the resist mask by an inkjet method needs no photomask; thus, manufacturing cost can be reduced.

The gate electrode layer 461 (461a and 461b) and the wiring layer 464 can each be formed to have a single-layer or stacked-layer structure using a metal material such as molybdenum, titanium, chromium, tantalum, tungsten, aluminum, copper, neodymium, or scandium, or an alloy material which contains any of these materials as its main component.

In this embodiment, a 150-nm-thick titanium film is formed as each of the gate electrode layer 461 (461a and 461b) and the wiring layer 464 by a sputtering method. Although the gate electrode layer 461 (461a and 461b) is shown as being divided in FIG. 8E, the gate electrode layer 461 (461a and 461b) is formed so as to overlap a torus-shaped void formed by the source or drain electrode layers 465a1 and 465a2 and the source or drain electrode layer 465b as shown in FIG. 7A.

Next, a second heat treatment (preferably at a temperature of 200° C. to 400° C., for example, at a temperature of 250° C. to 350° C.) is performed in an inert gas atmosphere or an oxygen gas atmosphere. In this embodiment, the second heat treatment is performed at 250° C. for 1 hour in a nitrogen atmosphere. The second heat treatment may be performed after a protective insulating layer or a planarization insulating layer is formed over the thin film transistor 460.

Furthermore, heat treatment may be performed at a temperature of 100° C. to 200° C. for 1 hour to 30 hours in the air. This heat treatment may be performed at a fixed heating temperature. Alternatively, the following change in the heating temperature may be conducted plural times repeatedly: the heating temperature is increased from room temperature to a temperature of 100° C. to 200° C. and then decreased to room temperature. This heat treatment may be performed under a reduced pressure before the formation of the oxide insulating layer. Under the reduced pressure, the heat treatment time can be shortened.

Figure 8E:
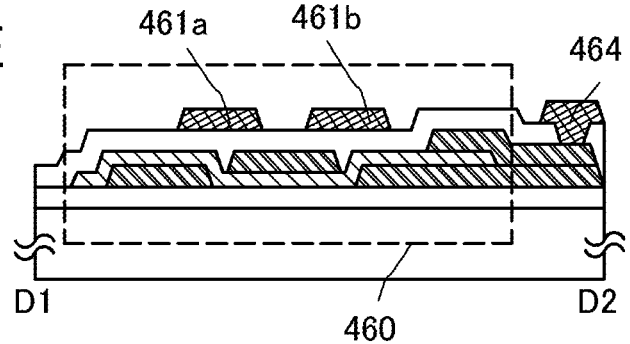

Through the above-described process, the thin film transistor 460 including the oxide semiconductor layer 462 in which the concentration of hydrogen, moisture, hydride, and hydroxide is reduced can be formed (see FIG. 8E). The thin film transistor 460 can be used as the thin film transistor 106 of Embodiment 1.

A protective insulating layer or a planarization insulating layer for planarization may be provided over the thin film transistor 460. Although not shown, in this embodiment, an opening reaching the source or drain electrode layer 465b is formed in the gate insulating layer 452 and the protective insulating layer and/or the planarization insulating layer, and a wiring layer which is electrically connected to the source or drain electrode layer 465b is formed in the opening.

By removing residual moisture in the reaction atmosphere at the time of the film deposition of the oxide semiconductor film as described above, the concentration of hydrogen and hydride in the oxide semiconductor film can be reduced. Accordingly, the oxide semiconductor film can be stabilized.

In a plurality of pixels of a display portion of a liquid crystal display device including the thin film transistor using the oxide semiconductor layer, off-state current can be reduced. Accordingly, a liquid crystal display device capable of extending the period in which a storage capacitor can hold a voltage and reducing power consumption when displaying a still image or the like can be obtained. In this embodiment, the shape of a channel is circular and the source electrode layer and the drain electrode layer are formed using different layers, whereby the channel length can be decreased and the channel width can be increased. In this manner, a thin film transistor having a large channel width can be formed even in a relatively small area, which enables switching for large current. In addition, although the channel width is large, the off-state current is extremely small since a purified oxide semiconductor is used.

This embodiment can be implemented in appropriate combination with any of the structures described in other embodiments.

Embodiment 4

In this embodiment, other examples of a thin film transistor which can be applied to a liquid crystal display device disclosed in this specification will be described. Note that Embodiment 2 can be referred to for the same portions as and the portions and steps having functions similar to those in Embodiment 2, and description thereof is not repeated. Further, a specific description for the same portions is omitted. Thin film transistors 425 and 426 described in this embodiment can each be used as the thin film transistor 106 of Embodiment 1.

Figure 9A:
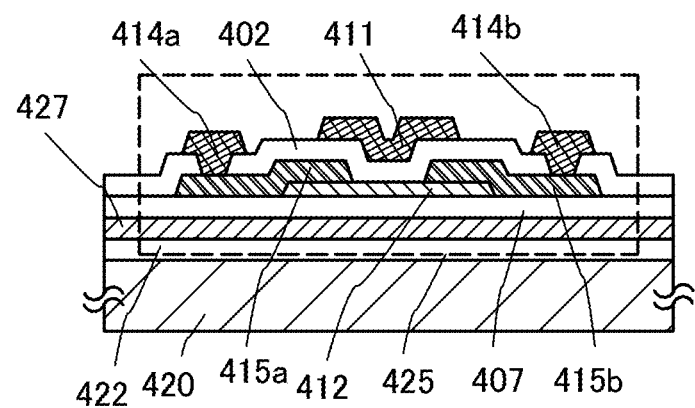
FIGS. 9A and 9B each illustrate a thin film transistor.
Figure 9B:
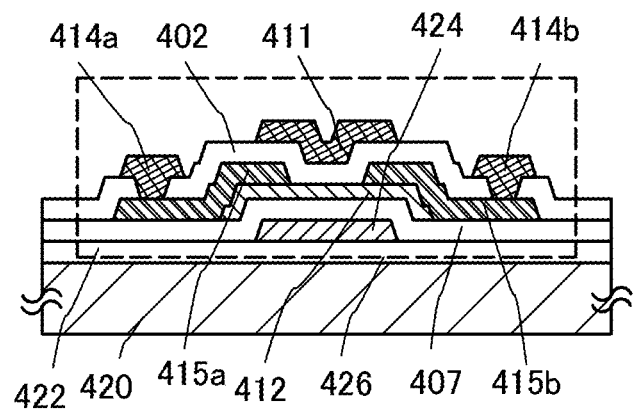

Thin film transistors in this embodiment are described using FIGS. 9A and 9B.

FIGS. 9A and 9B illustrate examples of a cross-sectional structure of a thin film transistor. The thin film transistors 425 and 426 shown in FIGS. 9A and 9B are each a kind of thin film transistor having a structure in which an oxide semiconductor layer is interposed between a conductive layer and a gate electrode layer.

In FIGS. 9A and 9B, a silicon substrate 420 is used, and each of the thin film transistors 425 and 426 is provided over an insulating layer 422 provided over the silicon substrate 420.

In FIG. 9A, a conductive layer 427 is provided between the insulating layer 422 provided over the silicon substrate 420 and an insulating layer 407 so as to overlap at least an oxide semiconductor layer 412 entirely.

FIG. 9B is an example in which a conductive layer between the insulating layer 422 and the insulating layer 407 is processed by etching to be a conductive layer 424 and overlaps at least a portion including a channel region of the oxide semiconductor layer 412.

The conductive layers 427 and 424 each are formed by a metal material which is resistant to the temperature of a heat treatment performed later. An element selected from titanium (Ti), tantalum (Ta), tungsten (W), molybdenum (Mo), chromium (Cr), neodymium (Nd), and scandium (Sc), an alloy including any of the above elements as its component, an alloy film including a combination of any of these elements, a nitride including any of the above elements as its component, or the like can be used. A single-layer structure or a stacked-layer structure may be used; for example, a single layer of a tungsten layer, a stacked-layer structure of a tungsten nitride layer and a tungsten layer, or the like can be used.

The potential of each of the conductive layers 427 and 424 may be equal to or different from the potential of the gate electrode layer 411 of each of the thin film transistors 425 and 426, and each of the conductive layers 427 and 424 may function as a second gate electrode layer. The potentials of the conductive layers 427 and 424 may each be a fixed potential such as GND or 0 V.

Electrical characteristics of the thin film transistors 425 and 426 can be controlled by the conductive layers 427 and 424.

This embodiment can be implemented in appropriate combination with any of other embodiments.

Embodiment 5

In this embodiment, an example of a thin film transistor which can be applied to a liquid crystal display device disclosed in this specification will be described.

A thin film transistor of this embodiment and an embodiment of a method for manufacturing the thin film transistor are described using FIGS. 10A to 10E.

FIGS. 10A to 10E illustrate an example of a cross-sectional structure of a thin film transistor. A thin film transistor 390 shown in FIGS. 10A to 10E is a kind of bottom-gate structure and is also referred to as an inverted staggered thin film transistor.

Although the thin film transistor 390 is described using a single-gate thin film transistor, a multi-gate thin film transistor including a plurality of channel formation regions can be formed as necessary.

Hereinafter, a process for manufacturing the thin film transistor 390 over a substrate 394 is described using FIGS. 10A to 10E.

First, a conductive film is formed over the substrate 394 having an insulating surface, and then, a first photolithography step is performed, so that a gate electrode layer 391 is formed. It is preferable that an end portion of the gate electrode layer have a tapered shape because coverage with a gate insulating layer stacked thereover is improved. Note that a resist mask may be formed by an inkjet method. Formation of the resist mask by an inkjet method needs no photomask; thus, manufacturing cost can be reduced.

Although there is no particular limitation on a substrate which can be used as the substrate 394 having an insulating surface, it is necessary that the substrate 394 has at least heat resistance high enough to withstand heat treatment to be performed later.

For example, in the case where a glass substrate is used as the substrate 394, if the temperature of the heat treatment to be performed later is high, it is preferable to use a glass substrate whose strain point is 730° C. or higher. As a material of the glass substrate, a glass material such as aluminosilicate glass, aluminoborosilicate glass, or barium borosilicate glass is used, for example. Note that by containing a larger amount of barium oxide (BaO) than boron oxide, a heat-resistant glass substrate which is of more practical use can be formed. Therefore, it is preferable that a glass substrate containing more BaO than $B_2O_3$ be used.

Note that a substrate formed using an insulator such as a ceramic substrate, a quartz substrate, or a sapphire substrate may be used instead of the above-described glass substrate, as the substrate 394. Alternatively, a crystallized glass substrate or the like may be used. Further alternatively, a plastic substrate or the like may be used.

An insulating film which functions as a base film may be provided between the substrate 394 and the gate electrode layer 391. The base film has a function of preventing diffusion of an impurity element from the substrate 394, and can be formed with a single-layer structure or a stacked-layer structure using one or more of a silicon nitride film, a silicon oxide film, a silicon nitride oxide film, and a silicon oxynitride film.

The gate electrode layer 391 can be formed to have a single-layer or stacked-layer structure using a metal material such as molybdenum, titanium, chromium, tantalum, tungsten, aluminum, copper, neodymium, or scandium, or an alloy material which contains any of these materials as its main component.

For example, as a two-layer structure of the gate electrode layer 391, any of the following structures is preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, a two-layer structure of a titanium nitride layer and a molybdenum layer, and a two-layer structure of a tungsten nitride layer and a tungsten layer stacked thereover. As a three-layer structure, a stack of a tungsten layer or a tungsten nitride layer, a layer of an alloy of aluminum and silicon or an alloy of aluminum and titanium, and a titanium nitride layer or a titanium layer is preferable. The gate electrode layer can be formed using a light transmitting conductive film. As an example of a material of the light transmitting conductive film, a light transmitting conductive oxide can be given.

Next, a gate insulating layer 397 is formed over the gate electrode layer 391.

The gate insulating layer 397 can be formed with a single-layer structure or a stacked-layer structure using one or more of a silicon oxide layer, a silicon nitride layer, a silicon oxynitride layer, a silicon nitride oxide layer, and an aluminum oxide layer by a plasma CVD method, a sputtering method, or the like. In order to prevent the gate insulating layer 397 from containing a large amount of hydrogen, it is preferable to form the gate insulating layer 397 by a sputtering method. In the case of forming a silicon oxide film by a sputtering method, a silicon target or a quartz target is used as a target, and oxygen or a mixed gas of oxygen and argon is used as a sputtering gas.

The gate insulating layer 397 can have a structure in which a silicon nitride layer and a silicon oxide layer are stacked in this order over the gate electrode layer 391. For example, a 100-nm-thick gate insulating layer is formed in such a manner that a silicon nitride layer ($SiN_y$ (y>0)) having a thickness of 50 nm to 200 nm is formed by a sputtering method as a first gate insulating layer and then a silicon oxide layer ($SiO_x$ (x>0)) having a thickness of 5 nm to 300 nm is stacked as a second gate insulating layer over the first gate insulating layer.

In order to prevent the gate insulating layer 397 and an oxide semiconductor film 393 film from containing hydrogen, a hydroxyl group, and moisture as much as possible, it is preferable to preheat the substrate 394 provided with the gate electrode layer 391 or the substrate 394 provided with the gate electrode layer 391 and the gate insulating layer 397 in a preheating chamber of a sputtering apparatus before the film formation so that an impurity such as hydrogen or moisture adsorbed on the substrate 394 is eliminated, and perform exhaustion. The temperature of the preheating be higher than or equal to 100° C. and lower than or equal to 400° C., preferably higher than or equal to 150° C. and lower than or equal to 300° C. As an exhaustion unit provided in the preheating chamber, a cryopump is preferable. This preheating step is not necessarily performed. This preheating step may be performed in a similar manner on the substrate 394 provided with components up to and including a source electrode layer 395a and a drain electrode layer 395b shown in FIG. 10C before an oxide insulating layer 396 is formed.

Figure 10A:
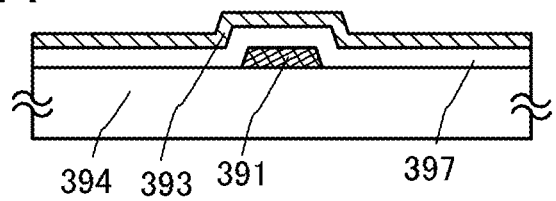
FIGS. 10A to 10E illustrate a thin film transistor.

Next, over the gate insulating layer 397, the oxide semiconductor film 393 is formed to a thickness of 2 nm to 200 nm, preferably 5 nm to 30 nm by a sputtering method (see FIG. 10A). Note that appropriate thickness of the oxide semiconductor film varies depending on a material thereof; therefore, the thickness may be determined as appropriate depending on the material.

Note that before the oxide semiconductor film 393 is formed by a sputtering method, it is preferable to perform reverse sputtering in which an argon gas is introduced and plasma is generated so that dust on a surface of the gate insulating layer 397 is removed. The reverse sputtering is a method by which voltage is applied to a substrate side with an RF power source in an argon atmosphere to generate plasma in the vicinity of the substrate without applying voltage to a target side, so that a surface is modified. Instead of the argon atmosphere, a nitrogen atmosphere, a helium atmosphere, an oxygen atmosphere, or the like may be used.

The oxide semiconductor film 393 is formed using an In—Ga—Zn—O-based oxide semiconductor film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, a Sn—O-based oxide semiconductor film, or a Zn—O-based oxide semiconductor film. In this embodiment, the oxide semiconductor film 393 is formed by a sputtering method using an In—Ga—Zn—O-based oxide semiconductor target. Specifically, a target having a composition ratio of $In_2O_3$:$Ga_2O_3$:ZnO=1:1:1 [mol %] (that is, In:Ga:Zn=1:1:0.5 [atom %]) is used. Alternatively, a target having a composition ratio of In:Ga:Zn=1:1:1 [atom %] or In:Ga:Zn=1:1:2 [atom %] can be used. In this embodiment, the filling rate of the oxide semiconductor target is equal to or greater than 90% and equal to or less than 100%, preferably equal to or greater than 95% and equal to or less than 99.9%. With use of the oxide semiconductor target having high filling rate, the deposited oxide semiconductor film has high density. The oxide semiconductor film 393 can be formed by a sputtering method in an atmosphere of a rare gas (typically, argon), an atmosphere of oxygen, or a mixed atmosphere of a rare gas and oxygen. The target may contain $SiO_2$ at 2 wt % or more and 10 wt % or less.

The oxide semiconductor film 393 is formed over the substrate 394 as follows: the substrate is held in the chamber with pressure reduced, and the substrate is heated to room temperature or a temperature lower than 400° C.; and residual moisture in the chamber is removed, a sputtering gas from which hydrogen and moisture are removed is introduced, and the above-described target is used. In order to remove residual moisture from the chamber, an adsorption-type vacuum pump is preferably used. For example, a cryopump, an ion pump, or a titanium sublimation pump is preferably used. As an exhaustion unit, a turbo molecular pump to which a cold trap is added may be used. In the chamber in which exhaustion is performed with the use of a cryopump, a hydrogen molecule, a compound including a hydrogen atom such as water ($H_2O$), a compound including a carbon atom, or the like, for example, is exhausted. Accordingly, the concentration of impurities included in the oxide semiconductor film formed in the chamber can be reduced. By performing deposition by sputtering while removing residual moisture in the chamber using a cryopump pump, the substrate temperature during the formation of the oxide semiconductor film 393 can be set higher than or equal to room temperature and lower than 400° C.

As an example of the film deposition condition, the following condition is employed: the distance between the substrate and the target is 100 mm; the pressure is 0.6 Pa; the direct current (DC) power is 0.5 kW; and the atmosphere is oxygen (the proportion of oxygen flow is 100%). It is preferable that a pulsed direct current (DC) power source be used because dust can be reduced and the film thickness can be made uniform.

Examples of a sputtering method include an RF sputtering method in which a high-frequency power source is used as a sputtering power source, a DC sputtering method, and a pulsed DC sputtering method in which a bias is applied in a pulsed manner. The RF sputtering method is mainly used in the case where an insulating film is formed, and the DC sputtering method is mainly used in the case where a metal film is formed.

There is also a multi-target sputtering apparatus in which a plurality of targets which are formed of different materials from each other can be set. With the multi-target sputtering apparatus, films of different materials can be stacked to be formed in the same chamber, or plural kinds of materials can be deposited by electric discharge at the same time in the same chamber.

In addition, there is also a sputtering apparatus provided with a magnet system inside the chamber and used for a magnetron sputtering method, or a sputtering apparatus used for an ECR sputtering method in which plasma generated with the use of microwaves is used without using glow discharge.

Further, as the deposition method using a sputtering method, there is a reactive sputtering method in which a target substance and a sputtering gas component are chemically reacted with each other during deposition to form a thin compound film thereof, or a bias sputtering method in which a voltage is also applied to a substrate during deposition.

Figure 10B:
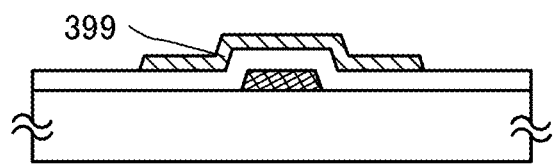

Next, the oxide semiconductor film is processed into an island-shaped oxide semiconductor layer 399 by a second photolithography step (see FIG. 10B). A resist mask for forming the island-shaped oxide semiconductor layer 399 may be formed using an inkjet method. Formation of the resist mask by an inkjet method needs no photomask; thus, manufacturing cost can be reduced.

In the case where a contact hole is formed in the gate insulating layer 397, a step thereof can be performed at the time of the formation of the oxide semiconductor layer 399.

Note that the etching of the oxide semiconductor film 393 may be dry etching, wet etching, or both dry etching and wet etching.

As an etching gas for the dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel-plate RIE (reactive ion etching) method or an ICP (inductively coupled plasma) etching method can be used. In order to etch the layer into a desired shape, the etching conditions (the amount of electric power applied to a coil-shaped electrode, the amount of electric power applied to an electrode on a substrate side, the temperature of the electrode on the substrate side, or the like) are adjusted as appropriate.

As an etchant used for wet etching, a mixed solution of phosphoric acid, acetic acid, and nitric acid, an ammonium hydroxide/hydrogen peroxide mixture (a 31 wt % hydrogen peroxide solution:28 wt % ammonia water:water=5:2:2), or the like can be used. Alternatively, ITO-07N (produced by KANTO CHEMICAL CO., INC.) may be used.

After the wet etching, the etchant is removed by cleaning together with the material which is etched off. Waste liquid of the etchant containing the removed material may be purified and the material contained in the waste liquid may be reused. The resources can be efficiently used and the cost can be reduced by collecting and reusing a material such as indium included in the oxide semiconductor from the waste liquid after the etching.

The etching conditions (such as an etchant, etching time, or temperature) are appropriately adjusted depending on a material so that the material can be etched into a desired shape.

Note that in that case, before a conductive film is formed in the following step, it is preferable to perform reverse sputtering to remove a resist residue or the like from a surface of the oxide semiconductor layer 399 and the gate insulating layer 397.

Next, a conductive film is formed over the gate insulating layer 397 and the oxide semiconductor layer 399. The conductive film may be formed by a sputtering method or a vacuum evaporation method. As a material of the conductive film, an element selected from Al, Cr, Cu, Ta, Ti, Mo, and W, an alloy containing any of these elements as a component, an alloy film containing any of these elements in combination, or the like can be given. Further, one or more materials selected from manganese, magnesium, zirconium, beryllium, and yttrium may be used. Further, the conductive film may have a single-layer structure or a stacked-layer structure of two or more layers. For example, a single-layer structure of an aluminum film including silicon, a two-layer structure in which a titanium film is stacked over an aluminum film, a three-layer structure in which a titanium film, an aluminum film, and a titanium film are stacked in this order, and the like can be given. Alternatively, a film, an alloy film, or a nitride film which contains aluminum (Al) and one or more elements selected from titanium (Ti), tantalum (Ta), tungsten (W), molybdenum (Mo), chromium (Cr), neodymium (Nd), and scandium (Sc) may be used.

Figure 10C:
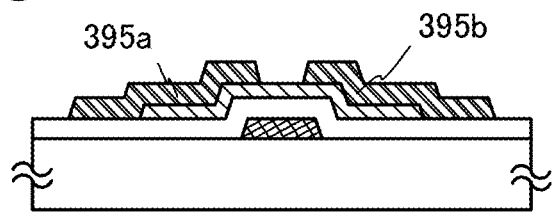

A resist mask is formed over the conductive film by a third photolithography step, and the source electrode layer 395a and the drain electrode layer 395b are formed by selective etching, and then, the resist mask is removed (see FIG. 10C).

Light exposure at the time of the formation of the resist mask in the third photolithography step is performed using ultraviolet light, KrF laser light, or ArF laser light. The channel length L of a thin film transistor to be formed is determined by a distance between a lower end of the source electrode layer and a lower end of the drain electrode layer, which are adjacent to each other over the oxide semiconductor layer 399. In the case where light exposure is performed for a channel length L of less than 25 nm, the light exposure at the time of the formation of the resist mask in the third photolithography step may be performed using extreme ultraviolet light having an extremely short wavelength of several nanometers to several tens of nanometers. In the light exposure by extreme ultraviolet light, the resolution is high and the focus depth is large. Accordingly, the channel length L of the thin film transistor can be made to be 10 nm to 1000 nm, the operation speed of a circuit can be increased, and low power consumption can be achieved by extremely small off-state current.

Note that each material and etching conditions are adjusted as appropriate such that the oxide semiconductor layer 399 is not removed by the etching of the conductive film.

In this embodiment, since a Ti film is used as the conductive film and the In—Ga—Zn—O-based oxide semiconductor is used for the oxide semiconductor layer 399, an ammonium hydrogen peroxide solution (a mixed solution of ammonia, water, and a hydrogen peroxide solution) is used as an etchant.

In the third photolithography step, in some cases, part of the oxide semiconductor layer 399 is etched, whereby an oxide semiconductor layer having a groove (a depression portion) may be formed. The resist mask used for forming the source electrode layer 395a and the drain electrode layer 395b may be formed by an inkjet method. Formation of the resist mask by an inkjet method needs no photomask; thus, manufacturing cost can be reduced.

In order to reduce the number of photomasks and steps in the photolithography step, etching may be performed with the use of a resist mask formed using a multi-tone mask which is a light-exposure mask through which light is transmitted so as to have a plurality of intensities. Since a resist mask formed using a multi-tone mask has a plurality of thicknesses and can be further changed in shape by performing etching, the resist mask can be used in a plurality of etching steps to provide different patterns. Therefore, a resist mask corresponding to at least two kinds of different patterns can be formed by using one multi-tone mask. Thus, the number of light-exposure masks can be reduced and the number of corresponding photolithography steps can also be reduced, whereby simplification of the manufacturing process can be realized.

After the removal of the resist mask, plasma treatment using a gas such as $N_2O$, $N_2$, or Ar may be performed to remove water or the like adsorbed on a surface of the oxide semiconductor layer 399 which is exposed. Plasma treatment may be performed using a mixed gas of oxygen and argon.

Figure 10D:
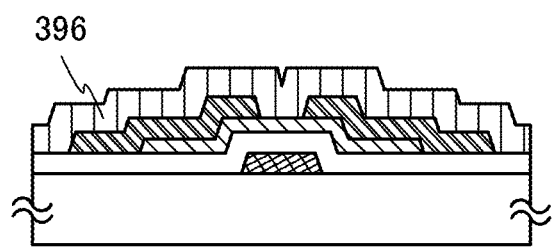

Next, the oxide insulating layer 396 is formed as an oxide insulating layer which functions as a protective insulating layer which is in contact with part of the oxide semiconductor layer (see FIG. 10D). In the case where the plasma treatment is performed, the oxide insulating layer 396 may be formed without exposure of the oxide semiconductor layer 399 to the air successively after the plasma treatment. In this embodiment, the oxide semiconductor layer 399 is in contact with the oxide insulating layer 396 in a region where the oxide semiconductor layer 399 overlaps neither the source electrode layer 395a nor the drain electrode layer 395b.

In this embodiment, as the oxide insulating layer 396, a silicon oxide layer including a defect is formed as follows: the substrate 394 over which the island-shaped oxide semiconductor layer 399, the source electrode layer 395a, and the drain electrode layer 395b are formed is heated at room temperature to a temperature lower than 100° C.; a sputtering gas containing high-purity oxygen from which hydrogen and moisture are removed is introduced; and a silicon semiconductor target is used.

For example, the silicon oxide film is formed as follows: a silicon target doped with boron (with a resistivity of 0.01 Ω·cm) and which has a purity of 6N is used; the distance between the target and the substrate (T-S distance) is 89 mm; the pressure is 0.4 Pa; the direct current (DC) power source is 6 kW; the atmosphere is oxygen (the proportion of oxygen flow is 100%); and a pulsed DC sputtering method is used. The thickness of the silicon oxide film is 300 nm in this embodiment. Quartz (preferably, synthetic quartz) may be used instead of the silicon target to form the silicon oxide film.

In that case, it is preferable to remove residual moisture in the chamber in the deposition of the oxide insulating layer 396. This is in order to prevent the oxide semiconductor layer 399 and the oxide insulating layer 396 from containing hydrogen, a hydroxyl group, or moisture.

In order to remove residual moisture from the chamber, an adsorption-type vacuum pump is preferably used. For example, a cryopump, an ion pump, or a titanium sublimation pump is preferably used. As an exhaustion unit, a turbo molecular pump to which a cold trap is added may be used. In the chamber in which exhaustion is performed with the use of a cryopump, a hydrogen molecule, a compound including a hydrogen atom such as water ($H_2O$), or the like, for example, is exhausted. Accordingly, the concentration of impurities included in the oxide insulating layer 396 formed in the chamber can be reduced.

As the oxide insulating layer 396, instead of the silicon oxide layer, a silicon oxynitride layer, an aluminum oxide layer, an aluminum oxynitride layer, or the like can be used.

Further, after the formation of the oxide insulating layer 396, heat treatment at 100° C. to 400° C. may be performed in a state where the oxide insulating layer 396 is in contact with the oxide semiconductor layer 399. Since the oxide insulating layer 396 in this embodiment includes many defects, an impurity such as hydrogen, moisture, a hydroxyl group, or hydride included in the oxide semiconductor layer 399 is diffused into the oxide insulating layer 396 by this heat treatment, so that the impurity included in the oxide semiconductor layer 399 can further be reduced.

Figure 10E:
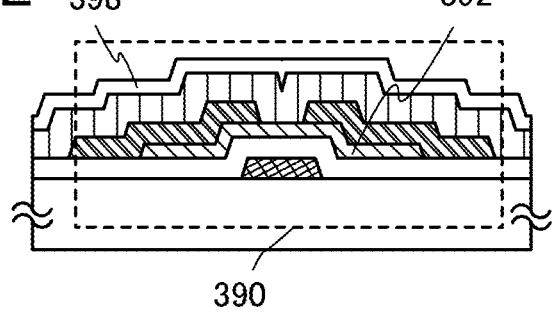

Through the above-described process, the thin film transistor 390 including an oxide semiconductor layer 392 in which the concentration of hydrogen, moisture, a hydroxyl group, or hydride is reduced can be formed (see FIG. 10E).

By removing residual moisture in the reaction atmosphere at the time of the film deposition of the oxide semiconductor film as described above, the concentration of hydrogen and hydride in the oxide semiconductor film can be reduced. Accordingly, the oxide semiconductor film can be stabilized.

A protective insulating layer may be provided over the oxide insulating layer. In this embodiment, a protective insulating layer 398 is formed over the oxide insulating layer 396. As the protective insulating layer 398, a silicon nitride film, a silicon nitride oxide film, an aluminum nitride film, or an aluminum nitride oxide film, or the like can be used.

As the protective insulating layer 398, a silicon nitride film is formed by heating the substrate 394, over which layers up to and including the oxide insulating layer 396 are formed, to a temperature of 100° C. to 400° C., introducing a sputtering gas containing high-purity nitrogen from which hydrogen and moisture are removed, and using a target of silicon semiconductor. In that case, it is also preferable that residual moisture be removed from the treatment chamber in the formation of the protective insulating layer 398 as is the case of the oxide insulating layer 396.

In the case where the protective insulating layer 398 is formed, the substrate 394 is heated to a temperature of 100° C. to 400° C. at the time of the formation of the protective insulating layer 398, whereby hydrogen or moisture included in the oxide semiconductor layer can be diffused into the oxide insulating layer. In such a case, heat treatment after the formation of the oxide insulating layer 396 is not necessarily performed.

In the case where the silicon oxide layer is formed as the oxide insulating layer 396 and the silicon nitride layer is stacked as the protective insulating layer 398, the silicon oxide layer and the silicon nitride layer can be formed in the same chamber using a common silicon target. First, a sputtering gas containing oxygen is introduced and a silicon target placed inside the chamber is used, so that a silicon oxide layer is formed; and then, the sputtering gas is switched to a sputtering gas containing nitrogen and the same silicon target is used, so that a silicon nitride layer is formed. Since the silicon oxide layer and the silicon nitride layer can be formed in succession without exposure to the air, an impurity such as hydrogen or moisture can be prevented from being adsorbed on a surface of the silicon oxide layer. In that case, after the silicon oxide layer is formed as the oxide insulating layer 396 and the silicon nitride layer is stacked as the protective insulating layer 398, heat treatment (at a temperature of 100° C. to 400° C.) for diffusing hydrogen or moisture included in the oxide semiconductor layer into the oxide insulating layer may be performed.

After the formation of the protective insulating layer, heat treatment may be performed at a temperature of 100° C. to 200° C. in the air for 1 hour to 30 hours. This heat treatment may be performed at a fixed heating temperature. Alternatively, the following change in the heating temperature may be conducted plural times repeatedly: the heating temperature is increased from room temperature to a temperature of 100° C. to 200° C. and then decreased to room temperature. Further, this heat treatment may be performed under a reduced pressure before the formation of the oxide insulating layer. Under the reduced pressure, the heat treatment time can be shortened. With this heat treatment, a thin film transistor which is normally off (which has a positive threshold voltage in the case of an n-channel transistor) can be obtained. Therefore, reliability of the liquid crystal display device can be improved.

Further, by removing residual moisture in the reaction atmosphere at the time of the formation of the oxide semiconductor layer, in which a channel formation region is to be formed, over the gate insulating layer, the concentration of hydrogen or hydride in the oxide semiconductor layer can be reduced.

The above-described process can be used for manufacturing a backplane (a substrate over which a thin film transistor is formed) of a liquid crystal display panel, an electroluminescent display panel, a display device using electronic ink, or the like. Since the above-described process is performed at a temperature of 400° C. or lower, the process can be applied to a manufacturing process using a glass substrate having a side longer than one meter and a thickness of one millimeter or less. Further, since the whole process can be performed at a treatment temperature of 400° C. or lower, a display panel can be manufactured without consuming too much energy.

In a plurality of pixels of a display portion of a liquid crystal display device including the thin film transistor using the oxide semiconductor layer, off-state current can be reduced. Accordingly, a liquid crystal display device capable of extending the period in which a storage capacitor can hold a voltage and reducing power consumption when displaying a still image or the like can be obtained.

This embodiment can be implemented in appropriate combination with any of the structures described in other embodiments.

Embodiment 6

In this embodiment, another example of a thin film transistor which can be applied to a liquid crystal display device disclosed in this specification will be described. A thin film transistor 310 described in this embodiment can be used as the thin film transistor 106 of Embodiment 1.

A thin film transistor of this embodiment and an embodiment of a method for manufacturing the thin film transistor are described using FIGS. 11A to 11E.

FIGS. 11A to 11E illustrate an example of a cross-sectional structure of a thin film transistor. A thin film transistor 310 shown in FIGS. 11A to 11E is a kind of bottom-gate structure and is also referred to as an inverted staggered thin film transistor.

Although the thin film transistor 310 is described using a single-gate thin film transistor, a multi-gate thin film transistor including a plurality of channel formation regions can be formed as necessary.

Hereinafter, a process for manufacturing the thin film transistor 310 over a substrate 300 is described using FIGS. 11A to 11E.

First, a conductive film is formed over the substrate 300 having an insulating surface, and then, a first photolithography step is performed, so that a gate electrode layer 311 is formed. Note that a resist mask may be formed by an inkjet method. Formation of the resist mask by an inkjet method needs no photomask; thus, manufacturing cost can be reduced.

Although there is no particular limitation on a substrate which can be used as the substrate 300 having an insulating surface, it is necessary that the substrate 300 has at least heat resistance high enough to withstand heat treatment to be performed later.

For example, in the case where a glass substrate is used as the substrate 300, if the temperature of the heat treatment to be performed later is high, it is preferable to use a glass substrate whose strain point is 730° C. or higher. As a material of the glass substrate, a glass material such as aluminosilicate glass, aluminoborosilicate glass, or barium borosilicate glass is used, for example. Note that by containing a larger amount of barium oxide (BaO) than boron oxide, a heat-resistant glass substrate which is of more practical use can be formed. Therefore, it is preferable that a glass substrate containing more BaO than $B_2O_3$ be used.

Note that a substrate formed using an insulator such as a ceramic substrate, a quartz substrate, or a sapphire substrate may be used instead of the above-described glass substrate, as the substrate 300. Alternatively, a crystallized glass substrate or the like may be used. Further alternatively, a plastic substrate or the like may be used.

An insulating film which functions as a base film may be provided between the substrate 300 and the gate electrode layer 311. The base film has a function of preventing diffusion of an impurity element from the substrate 300, and can be formed with a single-layer structure or a stacked-layer structure using one or more of a silicon nitride film, a silicon oxide film, a silicon nitride oxide film, and a silicon oxynitride film.

The gate electrode layer 311 can be formed to have a single-layer or stacked-layer structure using a metal material such as molybdenum, titanium, chromium, tantalum, tungsten, aluminum, copper, neodymium, or scandium, or an alloy material which contains any of these materials as its main component.

For example, as a two-layer structure of the gate electrode layer 311, any of the following structures is preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, a two-layer structure of a titanium nitride layer and a molybdenum layer, and a two-layer structure of a tungsten nitride layer and a tungsten layer stacked thereover. As a three-layer structure, a stack of a tungsten layer or a tungsten nitride layer, a layer of an alloy of aluminum and silicon or an alloy of aluminum and titanium, and a titanium nitride layer or a titanium layer is preferable.

Next, a gate insulating layer 302 is formed over the gate electrode layer 311.

The gate insulating layer 302 can be formed with a single-layer structure or a stacked-layer structure using one or more of a silicon oxide layer, a silicon nitride layer, a silicon oxynitride layer, a silicon nitride oxide layer, and an aluminum oxide layer by a plasma CVD method, a sputtering method, or the like. For example, a silicon oxynitride layer may be formed by a plasma CVD method using $SiH_4$, oxygen, and nitrogen as a deposition gas. In this embodiment, the thickness of the gate insulating layer 302 is greater than or equal to 100 nm and less than or equal to 500 nm. In the case of a stacked-layer structure, a first gate insulating layer with a thickness of 50 nm to 200 nm and a second gate insulating layer with a thickness of 5 nm to 300 nm are stacked on the first gate insulating layer.

In this embodiment, a silicon oxynitride layer having a thickness of 100 nm or less is formed as the gate insulating layer 302 by a plasma CVD method.

Next, over the gate insulating layer 302, an oxide semiconductor film 330 having a thickness of 2 nm to 200 nm, preferably 5 nm to 30 nm is formed over the gate insulating layer 302. Note that appropriate thickness of the oxide semiconductor film varies depending on a material thereof; therefore, the thickness may be determined as appropriate depending on the material. A cross-sectional view at this stage is FIG. 11A.

Note that before the oxide semiconductor film 330 is formed by a sputtering method, it is preferable to perform reverse sputtering in which an argon gas is introduced and plasma is generated so that dust on a surface of the gate insulating layer 302 is removed. Instead of the argon atmosphere, a nitrogen atmosphere, a helium atmosphere, an oxygen atmosphere, or the like may be used.

The oxide semiconductor film 330 is formed using an In—Ga—Zn—O-based oxide semiconductor film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, a Sn—O-based oxide semiconductor film, or a Zn—O-based oxide semiconductor film. In this embodiment, the oxide semiconductor film 330 is formed by a sputtering method using an In—Ga—Zn—O-based oxide semiconductor target. Specifically, a target having a composition ratio of $In_2O_3$:$Ga_2O_3$:ZnO=1:1:1 [mol %] (that is, In:Ga:Zn=1:1:0.5 [atom %]) is used. Alternatively, a target having a composition ratio of In:Ga:Zn=1:1:1 [atom %] or In:Ga:Zn=1:1:2 [atom %] can be used. In this embodiment, the filling rate of the oxide semiconductor target is equal to or greater than 90% and equal to or less than 100%, preferably equal to or greater than 95% and equal to or less than 99.9%. With use of the oxide semiconductor target having high filling rate, the deposited oxide semiconductor film has high density. The target may contain $SiO_2$ at 2 wt % or more and 10 wt % or less.

It is preferable that a high-purity gas in which an impurity such as hydrogen, water, a hydroxyl group, or hydride is removed to 1 ppm or less, preferably 10 ppb or less be used as the sputtering gas for the deposition of the oxide semiconductor film 330.

The sputtering is performed by holding the substrate in the chamber with pressure reduced at a substrate temperature of 100° C. to 600° C., preferably 200° C. to 400° C. By heating the substrate in the film deposition, the concentration of impurities contained in the oxide semiconductor film can be decreased. Further, damage by the sputtering can be suppressed. Then, residual moisture in the chamber is removed, a sputtering gas from which hydrogen and moisture are removed is introduced, and the above-described target is used, so that the oxide semiconductor film 330 is formed over the substrate 300. In order to remove residual moisture from the chamber, an adsorption-type vacuum pump is preferably used. For example, a cryopump, an ion pump, or a titanium sublimation pump is preferably used. As an exhaustion unit, a turbo molecular pump to which a cold trap is added may be used. In the chamber in which exhaustion is performed with the use of a cryopump, a hydrogen molecule, a compound including a hydrogen atom such as water ($H_2O$), a compound including a carbon atom, or the like, for example, is exhausted. Accordingly, the concentration of impurities included in the oxide semiconductor film formed in the chamber can be reduced.

As an example of the film deposition condition, the following condition is employed: the distance between the substrate and the target is 100 mm; the pressure is 0.6 Pa; the direct current (DC) power is 0.5 kW; and the atmosphere is oxygen (the proportion of oxygen flow is 100%). It is preferable that a pulsed direct current (DC) power source be used because dust can be reduced and the film thickness can be made uniform.

Next, the oxide semiconductor film 330 is processed into an island-shaped oxide semiconductor layer 331 by a second photolithography step. A resist mask for forming the island-shaped oxide semiconductor layer may be formed using an inkjet method. Formation of the resist mask by an inkjet method needs no photomask; thus, manufacturing cost can be reduced.

Next, a first heat treatment is performed on the oxide semiconductor layer 331. The oxide semiconductor layer 331 can be dehydrated or dehydrogenated by the first heat treatment. The temperature of the first heat treatment is higher than or equal to 400° C. and lower than or equal to 750° C., preferably higher than or equal to 400° C. and lower than the strain point of the substrate. In this embodiment, the substrate is put in an electric furnace which is a kind of heat treatment apparatus and heat treatment is performed on the oxide semiconductor layer at 450° C. for 1 hour in a nitrogen atmosphere, and then, water or hydrogen is prevented from entering the oxide semiconductor layer, without exposure to the air; thus, the oxide semiconductor layer 331 is obtained (see FIG. 11B).

The heat treatment apparatus is not limited to an electric furnace and may be provided with a device that heats an object to be processed by thermal conduction or thermal radiation from a heater such as a resistance heater or the like. For example, an RTA (rapid thermal annealing) apparatus such as a GRTA (gas rapid thermal annealing) apparatus or an LRTA (lamp rapid thermal annealing) apparatus can be used. The LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for heat treatment using a high-temperature gas. As the gas, an inert gas which does not react by heat treatment with the object to be processed, like nitrogen or a rare gas such as argon, is used.

For example, as the first heat treatment, GRTA may be performed as follows: the substrate is transferred into an inert gas heated to a high temperature of 650° C. to 700° C., heated for several minutes, and transferred and taken out of the inert gas heated to the high temperature. GRTA enables a high-temperature heat treatment in a short time.

In the first heat treatment, it is preferable that water, hydrogen, or the like be not contained in nitrogen or a rare gas such as helium, neon, or argon. It is preferable that nitrogen or a rare gas such as helium, neon, or argon which is introduced into the heat treatment apparatus have a purity of 6N (99.9999%) or more, more preferably 7N (99.99999%) or more (that is, the concentration of impurities be 1 ppm or less, more preferably 0.1 ppm or less).

By the first heat treatment, hydrogen or the like contained in the oxide semiconductor layer 331 can be removed, but at the same time, oxygen deficiency is caused, so that the oxide semiconductor layer 331 becomes an n-type semiconductor (a semiconductor with reduced resistance). Further, depending on the conditions of the first heat treatment or the material of the oxide semiconductor layer, the oxide semiconductor layer 331 might be crystallized to be a microcrystalline film or a polycrystalline film. For example, the oxide semiconductor layer may be crystallized to be a microcrystalline oxide semiconductor film in which the degree of crystallization is 90% or more, or 80% or more. Further, depending on the conditions of the first heat treatment or the material of the oxide semiconductor layer, the oxide semiconductor layer 331 may be an amorphous oxide semiconductor film which does not contain crystalline components. The oxide semiconductor layer may become an oxide semiconductor film in which a microcrystalline portion (with a grain diameter of 1 nm to 20 nm, typically 2 nm to 4 nm) is mixed in an amorphous oxide semiconductor.

The first heat treatment of the oxide semiconductor layer can also be performed on the oxide semiconductor film 330 before being processed into the island-shaped oxide semiconductor layer. In that case, the substrate is taken out from the heat treatment apparatus after the first heat treatment, and then a photolithography step is performed thereon.

The heat treatment which is effective for dehydration or dehydrogenation may be performed after a source electrode and a drain electrode are stacked on the oxide semiconductor layer or after a protective insulating film is formed over the source electrode and the drain electrode as long as it is performed after the deposition of the oxide semiconductor layer.

In the case where a contact hole is formed in the gate insulating layer 302, a step thereof can be performed before or after the dehydration or dehydrogenation is performed on the oxide semiconductor film 330 or the oxide semiconductor layer 331.

The etching of the oxide semiconductor film is not limited to wet etching and may be dry etching.

The etching conditions (such as an etchant, etching time, or temperature) are appropriately adjusted depending on a material so that the material can be etched into a desired shape.

Next, a conductive film is formed over the gate insulating layer 302 and the oxide semiconductor layer 331. The conductive film may be formed by a sputtering method or a vacuum evaporation method. As a material of the conductive film, an element selected from Al, Cr, Cu, Ta, Ti, Mo, and W, an alloy containing any of these elements as a component, an alloy film containing any of these elements in combination, or the like can be given. Further, one or more materials selected from manganese, magnesium, zirconium, beryllium, and yttrium may be used. Further, the conductive film may have a single-layer structure or a stacked-layer structure of two or more layers. For example, a single-layer structure of an aluminum film including silicon, a two-layer structure in which a titanium film is stacked over an aluminum film, a three-layer structure in which a titanium film, an aluminum film, and a titanium film are stacked in this order, and the like can be given. Alternatively, a film, an alloy film, or a nitride film which contains aluminum (Al) and one or more elements selected from titanium (Ti), tantalum (Ta), tungsten (W), molybdenum (Mo), chromium (Cr), neodymium (Nd), and scandium (Sc) may be used.

In the case where heat treatment is performed after the deposition of the conductive film, it is preferable that the conductive film have heat resistance high enough to withstand the heat treatment.

Figure 11A:
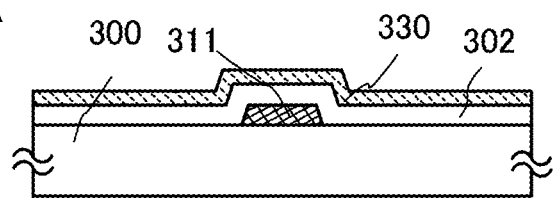
FIGS. 11A to 11E illustrate a thin film transistor.
Figure 11B:
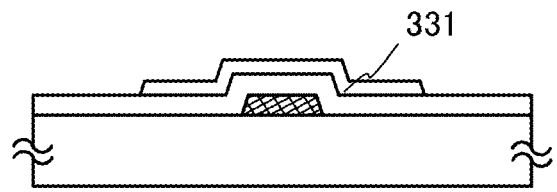
Figure 11C:
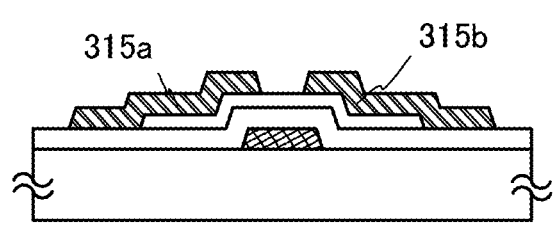
Figure 11D:
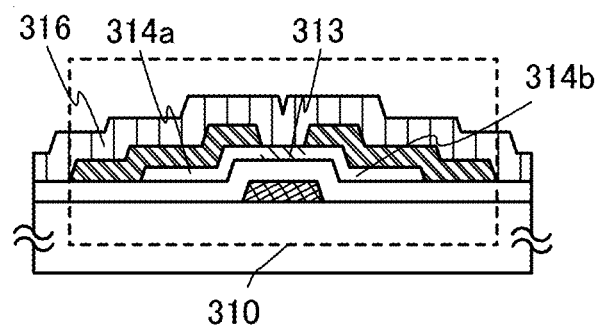
Figure 11E:
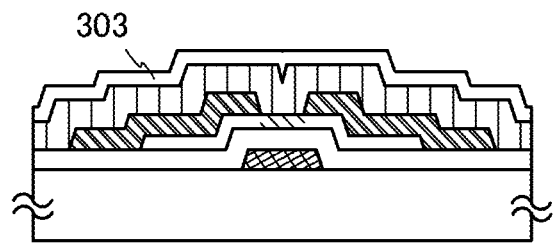

A resist mask is formed over the conductive film by a third photolithography step, and a source electrode layer 315a and a drain electrode layer 315b are formed by selective etching, and then, the resist mask is removed (see FIG. 11C).

Light exposure at the time of the formation of the resist mask in the third photolithography step is performed using ultraviolet light, KrF laser light, or ArF laser light. The channel length L of a thin film transistor to be formed is determined by a distance between a lower end of the source electrode layer and a lower end of the drain electrode layer, which are adjacent to each other over an oxide semiconductor layer 331. In the case where light exposure is performed for a channel length L of less than 25 nm, the light exposure at the time of the formation of the resist mask in the third photolithography step is performed using extreme ultraviolet light having an extremely short wavelength of several nanometers to several tens of nanometers. In the light exposure by extreme ultraviolet light, the resolution is high and the focus depth is large. Accordingly, the channel length L of the thin film transistor can be made to be 10 nm to 1000 nm, the operation speed of a circuit can be increased, and low power consumption can be achieved by extremely small off-state current.

Note that each material and etching conditions are adjusted as appropriate such that the oxide semiconductor layer 331 is not removed by the etching of the conductive film.

In this embodiment, since a Ti film is used as the conductive film and the In—Ga—Zn—O-based oxide semiconductor is used for the oxide semiconductor layer 331, an ammonium hydrogen peroxide solution (a mixed solution of ammonia, water, and a hydrogen peroxide solution) is used as an etchant.

In the third photolithography step, in some cases, part of the oxide semiconductor layer 331 is etched, whereby an oxide semiconductor layer having a groove (a depression portion) may be formed. The resist mask used for forming the source electrode layer 315a and the drain electrode layer 315b may be formed by an inkjet method. Formation of the resist mask by an inkjet method needs no photomask; thus, manufacturing cost can be reduced.

Further, an oxide conductive layer may be formed between the oxide semiconductor layer and the source and drain electrode layers. The oxide conductive layer and the metal layer for forming the source and drain electrode layers can be formed successively. The oxide conductive layer can function as a source region and a drain region.

By providing the oxide conductive layer as the source region and the drain region between the oxide semiconductor layer and the source and drain electrode layers, the resistance of the source region and the drain region can be decreased and the transistor can be operated at high speed.

In order to reduce the number of photomasks and steps in the photolithography step, etching may be performed with the use of a resist mask formed using a multi-tone mask which is a light-exposure mask through which light is transmitted so as to have a plurality of intensities. Since a resist mask formed using a multi-tone mask has a plurality of thicknesses and can be further changed in shape by performing etching, the resist mask can be used in a plurality of etching steps to provide different patterns. Therefore, a resist mask corresponding to at least two kinds of different patterns can be formed by using one multi-tone mask. Thus, the number of light-exposure masks can be reduced and the number of corresponding photolithography steps can also be reduced, whereby simplification of the manufacturing process can be realized.

Next, plasma treatment using a gas such as $N_2O$, $N_2$, or Ar is performed. By this plasma treatment, water or the like adsorbed on a surface of the oxide semiconductor layer which is exposed is removed. Plasma treatment may be performed using a mixed gas of oxygen and argon.

After the plasma treatment, an oxide insulating layer 316 which functions as a protective insulating film and is in contact with part of the oxide semiconductor layer is formed without exposure to the air.

The oxide insulating layer 316 can be formed to a thickness of at least 1 nm by a method by which an impurity such as water or hydrogen does not enter the oxide insulating layer 316, such as a sputtering method as appropriate. When hydrogen is contained in the oxide insulating layer 316, entry of the hydrogen to the oxide semiconductor layer, or extraction of oxygen in the oxide semiconductor layer by hydrogen and oxygen deficiency may occur, thereby causing the backchannel of the oxide semiconductor layer to have lower resistance (to be n-type), so that a parasitic channel may be formed. Therefore, it is important that a formation method in which hydrogen is not used is employed so that the oxide insulating layer 316 is formed containing as little hydrogen as possible.

In this embodiment, a 200-nm-thick silicon oxide film is deposited as the oxide insulating layer 316 by a sputtering method. The substrate temperature at the time of film deposition may be higher than or equal to room temperature and lower than or equal to 300° C., and in this embodiment, is 100° C. The silicon oxide film can be formed by a sputtering method in a rare gas (typically, argon) atmosphere, an oxygen atmosphere, or a mixed atmosphere containing a rare gas and oxygen. As a target, a silicon oxide target or a silicon target may be used. For example, with the use of a silicon target, silicon oxide can be deposited by a sputtering method in an atmosphere of oxygen and nitrogen. As the oxide insulating layer 316 which is formed in contact with the oxide semiconductor layer whose resistance is reduced, an inorganic insulating film which does not include impurities such as moisture, a hydrogen ion, or OH⁻ and blocks the entry of these impurities from the outside is used. Typically, a silicon oxide film, a silicon oxynitride film, an aluminum oxide film, an aluminum oxynitride film, or the like is used.

In that case, it is preferable to remove residual moisture in the chamber in the deposition of the oxide insulating layer 316. This is in order to prevent the oxide semiconductor layer 331 and the oxide insulating layer 316 from containing hydrogen, a hydroxyl group, or moisture.

In order to remove residual moisture from the chamber, an adsorption-type vacuum pump is preferably used. For example, a cryopump, an ion pump, or a titanium sublimation pump is preferably used. As an exhaustion unit, a turbo molecular pump to which a cold trap is added may be used. In the chamber in which exhaustion is performed with the use of a cryopump, a hydrogen molecule, a compound including a hydrogen atom such as water ($H_2O$), or the like, for example, is exhausted. Accordingly, the concentration of impurities included in the oxide insulating layer 316 formed in the chamber can be reduced.

It is preferable that a high-purity gas in which an impurity such as hydrogen, water, a hydroxyl group, or hydride is removed to 1 ppm or less, preferably 10 ppb or less be used as the sputtering gas for the deposition of the oxide insulating layer 316.

Next, a second heat treatment (preferably at a temperature of 200° C. to 400° C., for example, at a temperature of 250° C. to 350° C.) is performed in an inert gas atmosphere or an oxygen gas atmosphere. For example, the second heat treatment is performed at 250° C. for 1 hour in a nitrogen atmosphere. With the second heat treatment, heat is applied in a state where part of the oxide semiconductor layer (the channel formation region) is in contact with the oxide insulating layer 316.

Through the above process, heat treatment for dehydration or dehydrogenation is performed on the deposited oxide semiconductor film to decrease the resistance, and thus, a part of the oxide semiconductor film is selectively made to include excessive oxygen. As a result, a channel formation region 313 overlapping the gate electrode layer 311 becomes i-type, and a high-resistance source region 314a which overlaps the source electrode layer 315a and which is formed using the low-resistance oxide semiconductor and a high-resistance drain region 314b which overlaps the drain electrode layer 315b and which is formed using the low-resistance oxide semiconductor are formed in a self-aligned manner. Through the above steps, the thin film transistor 310 is formed (see FIG. 11D).

Furthermore, heat treatment may be performed at a temperature of 100° C. to 200° C. in the air for 1 hour to 30 hours. In this embodiment, heat treatment is performed at 150° C. for 10 hours. This heat treatment may be performed at a fixed heating temperature. Alternatively, the following change in the heating temperature may be conducted plural times repeatedly: the heating temperature is increased from room temperature to a temperature of 100° C. to 200° C. and then decreased to room temperature. Further, this heat treatment may be performed under a reduced pressure before the formation of the oxide insulating film. Under the reduced pressure, the heat treatment time can be shortened. With this heat treatment, hydrogen is introduced from the oxide semiconductor layer to the oxide insulating layer; thus, a normally-off thin film transistor can be obtained. Therefore, reliability of the liquid crystal display device can be improved. Further, by using a silicon oxide layer containing many defects as the oxide insulating layer, impurities such as hydrogen, moisture, a hydroxyl group, or hydride contained in the oxide semiconductor layer are diffused into the oxide insulating layer by this heat treatment to further reduce the impurities contained in the oxide semiconductor layer.

The high-resistance drain region 314b (or the high-resistance source region 314a) is formed in a portion of the oxide semiconductor layer which overlaps the drain electrode layer 315b (or the source electrode layer 315a), so that the reliability of the thin film transistor can be increased. Specifically, by the formation of the high-resistance drain region 314b, the conductivity can gradually changes from the drain electrode layer 315b to the high-resistance drain region 314b and the channel formation region 313 in the transistor. Therefore, in the case where the thin film transistor operates using the drain electrode layer 315b connected to a wiring for supplying a high power supply potential VDD, the high-resistance drain region serves as a buffer and a high electric field is not applied locally even if a high electric field is applied between the gate electrode layer 311 and the drain electrode layer 315b, so that the withstand voltage of the transistor can be improved.

The high-resistance source region or the high-resistance drain region may be formed entirely in the film thickness direction in the oxide semiconductor layer in the case where the oxide semiconductor layer is as thin as 15 nm or less; whereas in the case where the oxide semiconductor layer is as thick as 30 nm to 50 nm, the resistance of part of the oxide semiconductor layer, that is, a region of the oxide semiconductor layer, which is in contact with the source or drain electrode layer and the vicinity thereof may be decreased, so that the high-resistance source region or the high-resistance drain region is formed and a region of the oxide semiconductor layer which is near the gate insulating layer can be made to be i-type.

A protective insulating layer may be formed over the oxide insulating layer 316. For example, a silicon nitride film is formed by an RF sputtering method. An RF sputtering method is preferable as a method for forming a protective insulating layer because it has high productivity. As the protective insulating layer, an inorganic insulating film which does not contain impurities such as moisture, a hydrogen ion, or OH⁻ and blocks the entry of these impurities from the outside is used; a silicon nitride film, an aluminum nitride film, a silicon nitride oxide film, an aluminum nitride oxide film, or the like is used. In this embodiment, a protective insulating layer 303 is formed using a silicon nitride film as the protective insulating layer (see FIG. 11E).

As the protective insulating layer 303 in this embodiment, a silicon nitride film is formed by heating the substrate 300, over which layers up to and including the oxide insulating layer 316 are formed, to a temperature of 100° C. to 400° C., introducing a sputtering gas containing high-purity nitrogen from which hydrogen and moisture are removed, and using a target of silicon semiconductor. In that case, it is also preferable that residual moisture be removed from the treatment chamber in the formation of the protective insulating layer 303 as is the case of the oxide insulating layer 316.

A planarization insulating layer for planarization may be provided over the protective insulating layer 303.

In a plurality of pixels of a display portion of a liquid crystal display device including the thin film transistor using the oxide semiconductor layer, off-state current can be reduced. Accordingly, a liquid crystal display device capable of extending the period in which a storage capacitor can hold a voltage and reducing power consumption when displaying a still image or the like can be obtained.

This embodiment can be implemented in appropriate combination with any of the structures described in other embodiments.

Embodiment 7

In this embodiment, another example of a thin film transistor which can be applied to a liquid crystal display device disclosed in this specification will be described. A thin film transistor 360 described in this embodiment can be used as the thin film transistor 106 of Embodiment 1.

A thin film transistor of this embodiment and an embodiment of a method for manufacturing the thin film transistor are described using FIGS. 12A to 12D.

FIGS. 12A to 12D illustrate an example of a cross-sectional structure of a thin film transistor. The thin film transistor 360 shown in FIGS. 12A to 12D is a kind of bottom-gate structure which is called a channel protective type (also called a channel stop type), and is also referred to as an inverted staggered thin film transistor.

Although the thin film transistor 360 is described using a single-gate thin film transistor, a multi-gate thin film transistor including a plurality of channel formation regions can be formed as necessary.

Hereinafter, a process for manufacturing the thin film transistor 360 over a substrate 320 is described using FIGS. 12A to 12D.

First, a conductive film is formed over the substrate 320 having an insulating surface, a first photolithography step is performed to form a resist mask, and the conductive film is selectively etched by using the resist mask, so that a gate electrode layer 361 is formed. After that, the resist mask is removed. Note that the resist mask may be formed by an inkjet method. Formation of the resist mask by an inkjet method needs no photomask; thus, manufacturing cost can be reduced.

The gate electrode layer 361 can be formed to have a single-layer or stacked-layer structure using a metal material such as molybdenum, titanium, chromium, tantalum, tungsten, aluminum, copper, neodymium, or scandium, or an alloy material which contains any of these materials as its main component.

Next, a gate insulating layer 322 is formed over the gate electrode layer 361.

In this embodiment, a silicon oxynitride layer having a thickness of 100 nm or less is formed as the gate insulating layer 322 by a plasma CVD method.

Next, an oxide semiconductor film having a thickness of 2 nm to 200 nm is formed over the gate insulating layer 322, and is processed into an island-shaped oxide semiconductor layer by a second photolithography step. In this embodiment, the oxide semiconductor film is formed by a sputtering method using an In—Ga—Zn—O-based oxide semiconductor target.

In that case, it is preferable to remove residual moisture in the chamber in the deposition of the oxide semiconductor film. This is in order to prevent the oxide semiconductor film from containing hydrogen, a hydroxyl group, or moisture.

In order to remove residual moisture from the chamber, an adsorption-type vacuum pump is preferably used. For example, a cryopump, an ion pump, or a titanium sublimation pump is preferably used. As an exhaustion unit, a turbo molecular pump to which a cold trap is added may be used. In the chamber in which exhaustion is performed with the use of a cryopump, a hydrogen molecule, a compound including a hydrogen atom such as water ($H_2O$), or the like, for example, is exhausted. Accordingly, the concentration of impurities included in the oxide semiconductor film formed in the chamber can be reduced.

It is preferable that a high-purity gas in which an impurity such as hydrogen, water, a hydroxyl group, or hydride is removed to 1 ppm or less, preferably 10 ppb or less be used as the sputtering gas for the deposition of the oxide semiconductor film.

Next, the oxide semiconductor layer is dehydrated or dehydrogenated. The temperature of the first heat treatment for the dehydration or dehydrogenation is higher than or equal to 400° C. and lower than or equal to 750° C., preferably higher than or equal to 400° C. and lower than the strain point of the substrate. In this embodiment, the substrate is put in an electric furnace which is a kind of heat treatment apparatus and heat treatment is performed on the oxide semiconductor layer at 450° C. for 1 hour in a nitrogen atmosphere, and then, water or hydrogen is prevented from entering the oxide semiconductor layer, without exposure to the air; thus, an oxide semiconductor layer 332 is obtained (see FIG. 12A).

Next, plasma treatment using a gas such as $N_2O$, $N_2$, or Ar is performed. By this plasma treatment, water or the like adsorbed on a surface of the oxide semiconductor layer which is exposed is removed. Plasma treatment may be performed using a mixed gas of oxygen and argon.

Next, an oxide insulating layer is formed over the gate insulating layer 322 and the oxide semiconductor layer 332. After that, a resist mask is formed by a third photolithography step, and an oxide insulating layer 366 is formed by selective etching. After that, the resist mask is removed.

In this embodiment, a 200-nm-thick silicon oxide film is deposited as the oxide insulating layer 366 by a sputtering method. The substrate temperature at the time of film deposition may be higher than or equal to room temperature and lower than or equal to 300° C., and in this embodiment, is 100° C. The silicon oxide film can be formed by a sputtering method in a rare gas (typically, argon) atmosphere, an oxygen atmosphere, or a mixed atmosphere containing a rare gas and oxygen. As a target, a silicon oxide target or a silicon target may be used. For example, with the use of a silicon target, silicon oxide can be deposited by a sputtering method in an atmosphere of oxygen and nitrogen. As the oxide insulating layer 366 which is formed in contact with the oxide semiconductor layer, an inorganic insulating film which does not include impurities such as moisture, a hydrogen ion, or OH⁻ and blocks the entry of these impurities from the outside is used. Typically, a silicon oxide film, a silicon oxynitride film, an aluminum oxide film, an aluminum oxynitride film, or the like is used.

In that case, it is preferable to remove residual moisture in the chamber in the deposition of the oxide insulating layer 366. This is in order to prevent the oxide semiconductor layer 332 and the oxide insulating layer 366 from containing hydrogen, a hydroxyl group, or moisture.

In order to remove residual moisture from the chamber, an adsorption-type vacuum pump is preferably used. For example, a cryopump, an ion pump, or a titanium sublimation pump is preferably used. As an exhaustion unit, a turbo molecular pump to which a cold trap is added may be used. In the chamber in which exhaustion is performed with the use of a cryopump, a hydrogen molecule, a compound including a hydrogen atom such as water ($H_2O$), or the like, for example, is exhausted. Accordingly, the concentration of impurities included in the oxide insulating layer 366 formed in the chamber can be reduced.

It is preferable that a high-purity gas in which an impurity such as hydrogen, water, a hydroxyl group, or hydride is removed to 1 ppm or less, preferably 10 ppb or less be used as the sputtering gas for the deposition of the oxide insulating layer 366.

Next, a second heat treatment (preferably at a temperature of 200° C. to 400° C., for example, at a temperature of 250° C. to 350° C.) may be performed in an inert gas atmosphere or an oxygen gas atmosphere. For example, the second heat treatment is performed at 250° C. for 1 hour in a nitrogen atmosphere. With the second heat treatment, heat is applied in a state where part of the oxide semiconductor layer (the channel formation region) is in contact with the oxide insulating layer 366.

In this embodiment, the oxide semiconductor layer 332 which is provided with the oxide insulating layer 366 and is partly exposed is further subjected to heat treatment in a nitrogen atmosphere or an inert gas atmosphere or under a reduced pressure. By the heat treatment in a nitrogen atmosphere or an inert gas atmosphere or under a reduced pressure, the resistance of the exposed region of the oxide semiconductor layer 332, which is not covered by the oxide insulating layer 366, can be decreased. For example, heat treatment is performed at 250° C. for 1 hour in a nitrogen atmosphere.

With the heat treatment of the oxide semiconductor layer 332 provided with the oxide insulating layer 366 in a nitrogen atmosphere, the resistance of the exposed region of the oxide semiconductor layer 332 is decreased, so that an oxide semiconductor layer 362 including regions with different resistances (indicated as a shaded region and a white region in FIG. 12B) is formed.

Figure 12A:
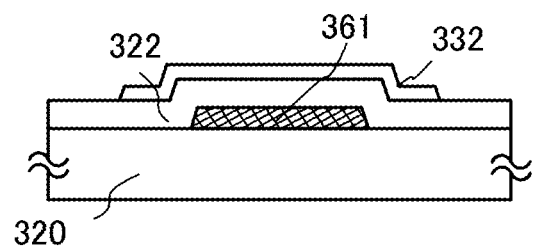
FIGS. 12A to 12D illustrate a thin film transistor.
Figure 12B:
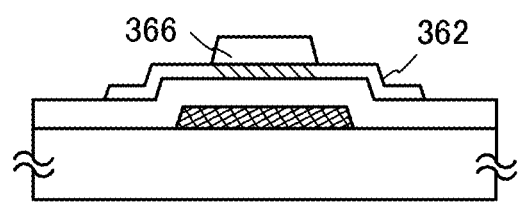
Figure 12C:
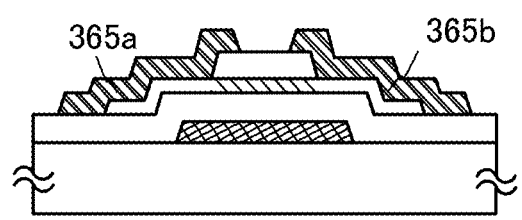
Figure 12D:
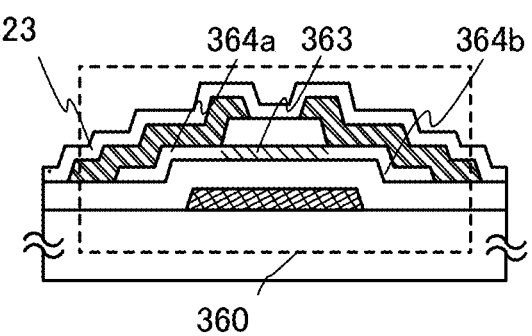

Next, after a conductive film is formed over the gate insulating layer 322, the oxide semiconductor layer 362, and the oxide insulating layer 366, a resist mask is formed over the conductive film by a fourth photolithography step, and a source electrode layer 365a and a drain electrode layer 365b are formed by selective etching, and then, the resist mask is removed (see FIG. 12C).

As a material of the source electrode layer 365a and the drain electrode layer 365b, an element selected from Al, Cr, Cu, Ta, Ti, Mo, and W, an alloy containing any of these elements as a component, an alloy film containing any of these elements in combination, or the like can be given. Further, the source electrode layer 365a and the drain electrode layer 365b may have a single-layer structure or a stacked-layer structure of two or more layers.

Through the above process, a part of the oxide semiconductor film is selectively made to include excessive oxygen. As a result, a channel formation region 363 overlapping the gate electrode layer 361 becomes i-type, and a high-resistance source region 364a which overlaps the source electrode layer 365a and a high-resistance drain region 364b which overlaps the drain electrode layer 365b are formed in a self-aligned manner. Through the above steps, the thin film transistor 360 is formed.

Furthermore, heat treatment may be performed at a temperature of 100° C. to 200° C. in the air for 1 hour to 30 hours. In this embodiment, heat treatment is performed at 150° C. for 10 hours. This heat treatment may be performed at a fixed heating temperature. Alternatively, the following change in the heating temperature may be conducted plural times repeatedly: the heating temperature is increased from room temperature to a temperature of 100° C. to 200° C. and then decreased to room temperature. Further, this heat treatment may be performed under a reduced pressure before the formation of the oxide insulating film. Under the reduced pressure, the heat treatment time can be shortened. With this heat treatment, hydrogen is introduced from the oxide semiconductor layer to the oxide insulating layer; thus, a normally-off thin film transistor can be obtained. Therefore, reliability of the liquid crystal display device can be improved.

The high-resistance drain region 364b (or the high-resistance source region 364a) which is formed using the low-resistance oxide semiconductor is formed in a portion of the oxide semiconductor layer which overlaps the drain electrode layer 365b (or the source electrode layer 365a), so that the reliability of the thin film transistor can be increased. Specifically, by the formation of the high-resistance drain region 364b, the conductivity can gradually changes from the drain electrode layer 365b to the high-resistance drain region 364b and the channel formation region 363 in the transistor. Therefore, in the case where the thin film transistor operates using the drain electrode layer 365b connected to a wiring for supplying a high power supply potential VDD, the high-resistance drain region serves as a buffer and a high electric field is not applied locally even if a high electric field is applied between the gate electrode layer 361 and the drain electrode layer 365b, so that the withstand voltage of the transistor can be improved.

A protective insulating layer 323 is formed over the source electrode layer 365a, the drain electrode layer 365b, and the oxide insulating layer 366. In this embodiment, the protective insulating layer 323 is formed using a silicon nitride film (see FIG. 12D).

Note that an oxide insulating layer may be formed over the source electrode layer 365a, the drain electrode layer 365b, and the oxide insulating layer 366, and the protective insulating layer 323 may be stacked over the oxide insulating layer.

In a plurality of pixels of a display portion of a liquid crystal display device including the thin film transistor using the oxide semiconductor layer, off-state current can be reduced. Accordingly, a liquid crystal display device capable of extending the period in which a storage capacitor can hold a voltage and reducing power consumption when displaying a still image or the like can be obtained.

This embodiment can be implemented in appropriate combination with any of the structures described in other embodiments.

Embodiment 8

In this embodiment, another example of a thin film transistor which can be applied to a liquid crystal display device disclosed in this specification will be described. A thin film transistor 350 described in this embodiment can be used as the thin film transistor 106 of Embodiment 1.

A thin film transistor of this embodiment and an embodiment of a method for manufacturing the thin film transistor are described using FIGS. 13A to 13D.

Although the thin film transistor 350 is described using a single-gate thin film transistor, a multi-gate thin film transistor including a plurality of channel formation regions can be formed as necessary.

Hereinafter, a process for manufacturing the thin film transistor 350 over a substrate 340 is described using FIGS. 13A to 13D.

First, a conductive film is formed over the substrate 340 having an insulating surface, and then, a first photolithography step is performed, so that a gate electrode layer 351 is formed. In this embodiment, a 150-nm-thick tungsten film is formed as the gate electrode layer 351 by a sputtering method.

Next, a gate insulating layer 342 is formed over the gate electrode layer 351. In this embodiment, a silicon oxynitride layer having a thickness of 100 nm or less is formed as the gate insulating layer 342 by a plasma CVD method.

Figure 13A:
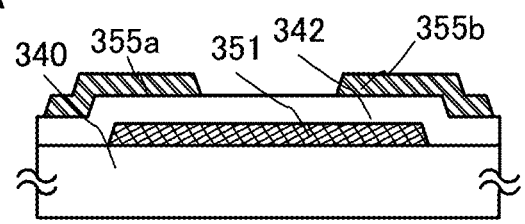
FIGS. 13A to 13D illustrate a thin film transistor.

Next, a conductive film is formed over the gate insulating layer 342; a resist mask is formed over the conductive film by a second photolithography step; a source electrode layer 355a and a drain electrode layer 355b are formed by selective etching, and then, the resist mask is removed (see FIG. 13A).

Figure 13B:
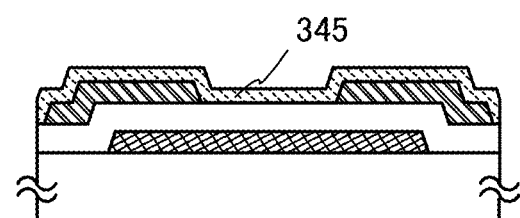
Figure 13C:
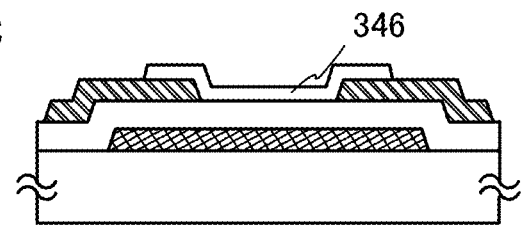
Figure 13D:
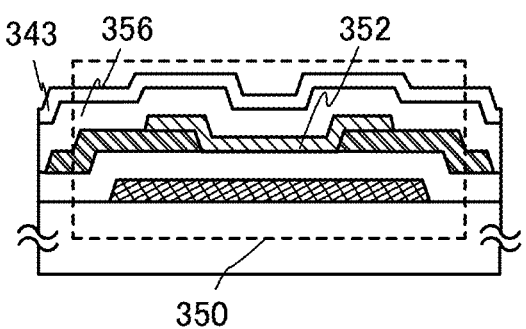

Next, an oxide semiconductor film 345 is formed (see FIG. 13B). In this embodiment, the oxide semiconductor film 345 is formed by a sputtering method using an In—Ga—Zn—O-based oxide semiconductor target. The oxide semiconductor film 345 is processed into an island-shaped oxide semiconductor layer by a third photolithography step.

In that case, it is preferable to remove residual moisture in the chamber in the deposition of the oxide semiconductor film 345. This is in order to prevent the oxide semiconductor film 345 from containing hydrogen, a hydroxyl group, or moisture.

In order to remove residual moisture from the chamber, an adsorption-type vacuum pump is preferably used. For example, a cryopump, an ion pump, or a titanium sublimation pump is preferably used. As an exhaustion unit, a turbo molecular pump to which a cold trap is added may be used. In the chamber in which exhaustion is performed with the use of a cryopump, a hydrogen molecule, a compound including a hydrogen atom such as water ($H_2O$), or the like, for example, is exhausted. Accordingly, the concentration of impurities included in the oxide semiconductor film 345 formed in the chamber can be reduced.

It is preferable that a high-purity gas in which an impurity such as hydrogen, water, a hydroxyl group, or hydride is removed to 1 ppm or less, preferably 10 ppb or less be used as the sputtering gas for the deposition of the oxide semiconductor film 345.

Next, the oxide semiconductor layer is dehydrated or dehydrogenated. The temperature of the first heat treatment for the dehydration or dehydrogenation is higher than or equal to 400° C. and lower than or equal to 750° C., preferably higher than or equal to 400° C. and lower than the strain point of the substrate. In this embodiment, the substrate is put in an electric furnace which is a kind of heat treatment apparatus and heat treatment is performed on the oxide semiconductor layer at 450° C. for 1 hour in a nitrogen atmosphere, and then, water or hydrogen is prevented from entering the oxide semiconductor layer, without exposure to the air; thus, an oxide semiconductor layer 346 is obtained (see FIG. 13C).

As the first heat treatment, GRTA may be performed as follows: the substrate is transferred into an inert gas heated to a high temperature of 650° C. to 700° C., heated for several minutes, and transferred and taken out of the inert gas heated to the high temperature. GRTA enables a high-temperature heat treatment in a short time.

An oxide insulating layer 356 serving as a protective insulating film is formed in contact with the oxide semiconductor layer 346.

The oxide insulating layer 356 can be formed to a thickness of at least 1 nm by a method by which an impurity such as water or hydrogen does not enter the oxide insulating layer 356, such as a sputtering method as appropriate. When hydrogen is contained in the oxide insulating layer 356, entry of the hydrogen to the oxide semiconductor layer, or extraction of oxygen in the oxide semiconductor layer by hydrogen and oxygen deficiency may occur, thereby causing the backchannel of the oxide semiconductor layer to have lower resistance (to be n-type), so that a parasitic channel may be formed. Therefore, it is important that a formation method in which hydrogen is not used is employed so that the oxide insulating layer 356 is formed containing as little hydrogen as possible.

In this embodiment, a 200-nm-thick silicon oxide film is deposited as the oxide insulating layer 356 by a sputtering method. The substrate temperature at the time of film deposition may be higher than or equal to room temperature and lower than or equal to 300° C., and in this embodiment, is 100° C. The silicon oxide film can be formed by a sputtering method in a rare gas (typically, argon) atmosphere, an oxygen atmosphere, or a mixed atmosphere containing a rare gas and oxygen. As a target, a silicon oxide target or a silicon target may be used. For example, with the use of a silicon target, silicon oxide can be deposited by a sputtering method in an atmosphere of oxygen and nitrogen. As the oxide insulating layer 356 which is formed in contact with the oxide semiconductor layer, an inorganic insulating film which does not include impurities such as moisture, a hydrogen ion, or OH⁻ and blocks the entry of these impurities from the outside is used. Typically, a silicon oxide film, a silicon oxynitride film, an aluminum oxide film, an aluminum oxynitride film, or the like is used.

In that case, it is preferable to remove residual moisture in the chamber in the deposition of the oxide insulating layer 356. This is in order to prevent the oxide semiconductor layer 346 and the oxide insulating layer 356 from containing hydrogen, a hydroxyl group, or moisture.

In order to remove residual moisture from the chamber, an adsorption-type vacuum pump is preferably used. For example, a cryopump, an ion pump, or a titanium sublimation pump is preferably used. As an exhaustion unit, a turbo molecular pump to which a cold trap is added may be used. In the chamber in which exhaustion is performed with the use of a cryopump, a hydrogen molecule, a compound including a hydrogen atom such as water ($H_2O$), or the like, for example, is exhausted. Accordingly, the concentration of impurities included in the oxide insulating layer 356 formed in the chamber can be reduced.

It is preferable that a high-purity gas in which an impurity such as hydrogen, water, a hydroxyl group, or hydride is removed to 1 ppm or less, preferably 10 ppb or less be used as the sputtering gas for the deposition of the oxide insulating layer 356.

Next, a second heat treatment (preferably at a temperature of 200° C. to 400° C., for example, at a temperature of 250° C. to 350° C.) is performed in an inert gas atmosphere or an oxygen gas atmosphere. For example, the second heat treatment is performed at 250° C. for 1 hour in a nitrogen atmosphere. With the second heat treatment, heat is applied in a state where part of the oxide semiconductor layer (the channel formation region) is in contact with the oxide insulating layer 356.

Through the above process, the oxide semiconductor film is made to include excessive oxygen. As a result, an i-type oxide semiconductor layer 352 is formed. Through the above steps, the thin film transistor 350 is formed.

Furthermore, heat treatment may be performed at a temperature of 100° C. to 200° C. in the air for 1 hour to 30 hours. In this embodiment, heat treatment is performed at 150° C. for 10 hours. This heat treatment may be performed at a fixed heating temperature. Alternatively, the following change in the heating temperature may be conducted plural times repeatedly: the heating temperature is increased from room temperature to a temperature of 100° C. to 200° C. and then decreased to room temperature. Further, this heat treatment may be performed under a reduced pressure before the formation of the oxide insulating film. Under the reduced pressure, the heat treatment time can be shortened. With this heat treatment, hydrogen is introduced from the oxide semiconductor layer to the oxide insulating layer; thus, a normally-off thin film transistor can be obtained. Therefore, reliability of the liquid crystal display device can be improved.

A protective insulating layer may be formed over the oxide insulating layer 356. For example, a silicon nitride film is formed by an RF sputtering method. In this embodiment, a protective insulating layer 343 is formed using a silicon nitride film as the protective insulating layer (see FIG. 13D).

A planarization insulating layer for planarization may be provided over the protective insulating layer 343.

In a plurality of pixels of a display portion of a liquid crystal display device including the thin film transistor using the oxide semiconductor layer, off-state current can be reduced. Accordingly, a liquid crystal display device capable of extending the period in which a storage capacitor can hold a voltage and reducing power consumption when displaying a still image or the like can be obtained.

This embodiment can be implemented in appropriate combination with any of the structures described in other embodiments.

Embodiment 9

In this embodiment, another example of a thin film transistor which can be applied to a liquid crystal display device disclosed in this specification will be described. A thin film transistor 380 described in this embodiment can be used as the thin film transistor 106 of Embodiment 1.

Figure 14:
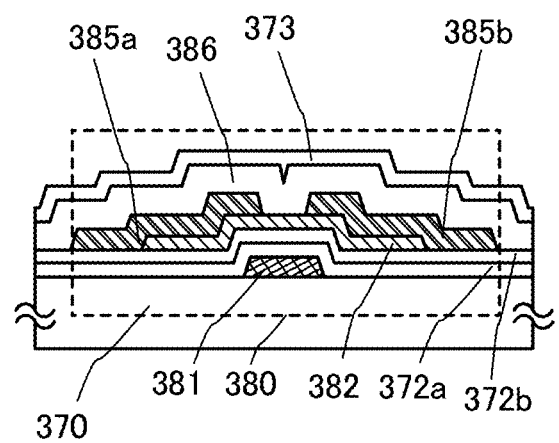
FIG. 14 illustrates a thin film transistor.

In this embodiment, an example which is different from Embodiment 6 in part of the manufacturing process of a thin film transistor will be described using FIG. 14. Since FIG. 14 is the same as FIGS. 11A to 11E except for part of the process, the same reference numerals are used for the same portions, and detailed description of the same portions is not repeated.

In accordance with Embodiment 6, a gate electrode layer 381 is formed over a substrate 370, and a first gate insulating layer 372a and a second gate insulating layer 372b are stacked. In this embodiment, a gate insulating layer has a two-layer structure, in which a nitride insulating layer is used as the first gate insulating layer 372a and an oxide insulating layer is used as the second gate insulating layer 372b.

As the oxide insulating layer, a silicon oxide layer, a silicon oxynitride layer, an aluminum oxide layer, an aluminum oxynitride layer, or the like can be used. As the nitride insulating layer, a silicon nitride layer, a silicon nitride oxide layer, an aluminum nitride layer, an aluminum nitride oxide layer, or the like can be used.

In the structure of this embodiment, a silicon nitride layer and a silicon oxide layer are stacked in this order over the gate electrode layer 381. For example, a 150-nm-thick gate insulating layer is formed in such a manner that a silicon nitride layer ($SiN_y$ (y>0)) having a thickness of 50 nm to 200 nm (in this embodiment, 50 nm) is formed by a sputtering method as the first gate insulating layer 372a and then a silicon oxide layer ($SiO_x$ (x>0)) having a thickness of 5 nm to 300 nm (in this embodiment, 100 nm) is stacked as the second gate insulating layer 372b over the first gate insulating layer 372a.

Next, an oxide semiconductor film is formed and is processed into an island-shaped oxide semiconductor layer by a photolithography step. In this embodiment, the oxide semiconductor film is formed by a sputtering method using an In—Ga—Zn—O-based oxide semiconductor target.

In that case, it is preferable to remove residual moisture in the chamber in the deposition of the oxide semiconductor film. This is in order to prevent the oxide semiconductor film from containing hydrogen, a hydroxyl group, or moisture.

In order to remove residual moisture from the chamber, an adsorption-type vacuum pump is preferably used. For example, a cryopump, an ion pump, or a titanium sublimation pump is preferably used. As an exhaustion unit, a turbo molecular pump to which a cold trap is added may be used. In the chamber in which exhaustion is performed with the use of a cryopump, a hydrogen molecule, a compound including a hydrogen atom such as water ($H_2O$), or the like, for example, is exhausted. Accordingly, the concentration of impurities included in the oxide semiconductor film formed in the chamber can be reduced.

It is preferable that a high-purity gas in which an impurity such as hydrogen, water, a hydroxyl group, or hydride is removed to 1 ppm or less, preferably 10 ppb or less be used as the sputtering gas for the deposition of the oxide semiconductor film.

Next, the oxide semiconductor layer is dehydrated or dehydrogenated. The temperature of the first heat treatment for the dehydration or dehydrogenation is higher than or equal to 400° C. and lower than or equal to 750° C., preferably higher than or equal to 425° C. Note that in the case where the temperature of the first heat treatment is 425° C. or higher, the heat treatment time may be one hour or less, while in the case where the temperature of the first heat treatment is lower than 425° C., the heat treatment time is set to more than one hour. In this embodiment, the substrate is put in an electric furnace which is a kind of heat treatment apparatus and heat treatment is performed on the oxide semiconductor layer in a nitrogen atmosphere, and then, water or hydrogen is prevented from entering the oxide semiconductor layer, without exposure to the air; thus, an oxide semiconductor layer is obtained. After that, cooling is performed by introduction of a high-purity oxygen gas, a high-purity $N_2O$ gas, or ultra-dry air (having a dew point of −40° C. or lower, preferably −60° C. or lower) into the same furnace. It is preferable that the oxygen gas or the $N_2O$ gas do not contain water, hydrogen, or the like. Alternatively, the purity of an oxygen gas or an $N_2O$ gas which is introduced into the heat treatment apparatus is preferably 6N (99.9999%) or higher, more preferably 7N (99.99999%) or higher (that is, the concentration of impurities in the oxygen gas or the $N_2O$ gas is 1 ppm or less, preferably 0.1 ppm or less).

Note that the heat treatment apparatus is not limited to an electric furnace. For example, an RTA (rapid thermal annealing) apparatus such as a GRTA (gas rapid thermal annealing) apparatus or an LRTA (lamp rapid thermal annealing) apparatus can be used. The LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The LRTA apparatus may be provided with not only a lamp but also a device that heats an object to be processed by thermal conduction or thermal radiation from a heater such as a resistance heater or the like. GRTA is a method for heat treatment using a high-temperature gas. As the gas, an inert gas which does not react by heat treatment with the object to be processed, like nitrogen or a rare gas such as argon, is used. The heat treatment may be performed at 600° C. to 750° C. for several minutes by an RTA method.

After the first heat treatment for dehydration or dehydrogenation, heat treatment may be performed at a temperature of 200° C. to 400° C., preferably 200° C. to 300° C., in an oxygen gas atmosphere or a $N_2O$ gas atmosphere.

The first heat treatment of the oxide semiconductor layer can also be performed on the oxide semiconductor film before being processed into the island-shaped oxide semiconductor layer. In that case, the substrate is taken out from the heat treatment apparatus after the first heat treatment, and then a photolithography step is performed thereon.

The entire oxide semiconductor film is made to contain an excess amount of oxygen through the above steps, whereby the oxide semiconductor film has higher resistance, that is, becomes i-type. Accordingly, an oxide semiconductor layer 382 whose entire region is i-type is formed.

Next, a conductive film is formed over the oxide semiconductor layer 382. After that, a resist mask is formed by a photolithography step, and selective etching is performed to form a source electrode layer 385a and a drain electrode layer 385b, and then, an oxide insulating layer 386 is formed by a sputtering method.

In that case, it is preferable to remove residual moisture in the chamber in the deposition of the oxide insulating layer 386. This is in order to prevent the oxide semiconductor layer 382 and the oxide insulating layer 386 from containing hydrogen, a hydroxyl group, or moisture.

In order to remove residual moisture from the chamber, an adsorption-type vacuum pump is preferably used. For example, a cryopump, an ion pump, or a titanium sublimation pump is preferably used. As an exhaustion unit, a turbo molecular pump to which a cold trap is added may be used. In the chamber in which exhaustion is performed with the use of a cryopump, a hydrogen molecule, a compound including a hydrogen atom such as water ($H_2O$), or the like, for example, is exhausted. Accordingly, the concentration of impurities included in the oxide insulating layer 386 formed in the chamber can be reduced.

It is preferable that a high-purity gas in which an impurity such as hydrogen, water, a hydroxyl group, or hydride is removed to 1 ppm or less, preferably 10 ppb or less be used as the sputtering gas for the deposition of the oxide insulating layer 386.

Through the above steps, the thin film transistor 380 can be formed.

Next, heat treatment (preferably at a temperature higher than or equal to 150° C. and lower than 350° C.) may be performed in an inert gas atmosphere or a nitrogen gas atmosphere in order to suppress variation of electrical characteristics of the thin film transistor. For example, heat treatment is performed at 250° C. for 1 hour in a nitrogen atmosphere.

In addition, heat treatment may be performed at a temperature of 100° C. to 200° C. in the air for 1 hour to 30 hours. In this embodiment, heat treatment is performed at 150° C. for 10 hours. This heat treatment may be performed at a fixed heating temperature. Alternatively, the following change in the heating temperature may be conducted plural times repeatedly: the heating temperature is increased from room temperature to a temperature of 100° C. to 200° C. and then decreased to room temperature. Further, this heat treatment may be performed under a reduced pressure before the formation of the oxide insulating film. Under the reduced pressure, the heat treatment time can be shortened. With this heat treatment, hydrogen is introduced from the oxide semiconductor layer to the oxide insulating layer; thus, a normally-off thin film transistor can be obtained. Therefore, reliability of the liquid crystal display device can be improved.

A protective insulating layer 373 is formed over the oxide insulating layer 386. In this embodiment, a 100-nm-thick silicon nitride film is formed as the protective insulating layer 373 by a sputtering method.

The protective insulating layer 373 and the first gate insulating layer 372a, which are nitride insulating layers, do not contain impurities such as moisture, hydrogen, hydride, or hydroxide and has the advantageous effect of preventing the entry of these impurities from the outside.

Therefore, in the manufacturing process after the formation of the protective insulating layer 373, the entry of impurities such as moisture from the outside can be prevented. Further, even after a device is completed as a liquid crystal display device, the entry of impurities such as moisture from the outside can be prevented in the long term; therefore, long-term reliability of the device can be improved.

The insulating layers provided between the protective insulating layer 373 and the first gate insulating layer 372a which are nitride insulating layers may be removed to make the protective insulating layer 373 in contact with the first gate insulating layer 372a.

Accordingly, impurities such as moisture, hydrogen, hydride, or hydroxide in the oxide semiconductor layer can be reduced to the minimum and the re-entry thereof can be prevented, so that the concentration of impurities in the oxide semiconductor layer can be kept low.

A planarization insulating layer for planarization may be provided over the protective insulating layer 373.

In a plurality of pixels of a display portion of a liquid crystal display device including the thin film transistor using the oxide semiconductor layer, off-state current can be reduced. Accordingly, a liquid crystal display device capable of extending the period in which a storage capacitor can hold a voltage and reducing power consumption when displaying a still image or the like can be obtained.

This embodiment can be implemented in appropriate combination with any of the structures described in other embodiments.

Embodiment 10

In this embodiment, another example of a thin film transistor which can be applied to a liquid crystal display device disclosed in this specification will be described. A thin film transistor described in this embodiment can be applied to the thin film transistors of Embodiment 2 to 8.

In this embodiment, an example of using a conductive material having a light transmitting property for a gate electrode layer, a source electrode layer, and a drain electrode layer will be described. Note that the other part of this embodiment is similar to the above embodiments, and the description of the same portions as and the portions and steps having functions similar to those in the above embodiments is not repeated. Further, a specific description for the same portions is omitted.

As a material of a gate electrode layer, a source electrode layer, and a drain electrode layer, a conductive material that transmits visible light can be used. For example, any of the following metal oxides can be used: an In—Sn—O-based metal oxide; an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. The thickness thereof is set in the range of 50 nm to 300 nm as appropriate. As a deposition method of the metal oxide used for the gate electrode layer, the source electrode layer, and the drain electrode layer, a sputtering method, a vacuum evaporation method (an electron beam evaporation method or the like), an arc discharge ion plating method, or a spray method is used. In the case where a sputtering method is employed, it is preferable that deposition be performed using a target containing $SiO_2$ at 2 wt % to 10 wt % and $SiO_x$ (x>0) which inhibits crystallization be contained in the light transmitting conductive film so as to prevent crystallization at the time of heat treatment in a later step.

Note that the unit of the percentage of components in the light transmitting conductive film is atomic percent, and the percentage of components is evaluated by analysis using an electron probe X-ray microanalyzer (EPMA).

In a pixel provided with a thin film transistor, when a pixel electrode layer, another electrode layer (such as a capacitor electrode layer), or a wiring layer (such as a capacitor wiring layer) is formed using a conductive film that transmits visible light, a display device having high aperture ratio can be realized. Needless to say, it is preferable that a gate insulating layer, an oxide insulating layer, a protective insulating layer, and a planarization insulating layer in the pixel be also each formed using a film that transmits visible light.

In this specification, a film that transmits visible light means a film having such a thickness as to have a visible light transmittance of 75% to 100%. In the case where the film has conductivity, the film is also referred to as a transparent conductive film. Further, a conductive film which is semi-transmissive with respect to visible light may be used as metal oxide applied to the gate electrode layer, the source electrode layer, the drain electrode layer, the pixel electrode layer, another electrode layer, or another wiring layer. The conductive film which is semi-transmissive with respect to visible light refers to a film having a visible light transmittance of 50% to 75%.

When a thin film transistor has a light transmitting property, the aperture ratio can be increased. For small-size liquid crystal display panels of 10 inches or smaller in particular, a high aperture ratio can be achieved even when the size of pixels is decreased in order to realize higher resolution of display images by increasing the number of gate wirings, for example. Further, by using a film having a light transmitting property for components of a thin film transistor, a high aperture ratio can be achieved even when one pixel is divided into a plurality of sub-pixels in order to realize a wide viewing angle. That is, a high aperture ratio can be obtained even when a high-density group of thin film transistors is provided, so that a sufficient area of a display region can be secured. For example, in the case where one pixel includes two to four sub-pixels, an aperture ratio can be improved because the thin film transistor has a light transmitting property. Further, a storage capacitor may be formed using the same material and in the same step as the component in the thin film transistor so that the storage capacitor can have a light transmitting property, whereby the aperture ratio can be further improved.

This embodiment can be implemented in appropriate combination with any of other embodiments.

Embodiment 11

The appearance and the cross section of a liquid crystal display panel, which is an embodiment of a liquid crystal display device, are described with reference to FIGS. 15A to 15C. FIGS. 15A and 15C are each a top view of a panel in which thin film transistors 4010 and 4011 and a liquid crystal element 4013, which are formed over a first substrate 4001, are sealed between the first substrate 4001 and a second substrate 4006 with a sealant 4505. FIG. 15B corresponds to a cross-sectional view of FIG. 15A or 15C along line M-N.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that a connection method of a driver circuit which is separately formed is not particularly limited, and a COG method, a wire bonding method, a TAB method, or the like can be used. FIG. 15A illustrates an example of mounting the signal line driver circuit 4003 by a COG method, and FIG. 15C illustrates an example of mounting the signal line driver circuit 4003 by a TAB method.

Further, the pixel portion 4002 and the scan line driver circuit 4004 provided over the first substrate 4001 each include a plurality of thin film transistors. FIG. 15B illustrates the thin film transistor 4010 included in the pixel portion 4002 and the thin film transistor 4011 included in the scan line driver circuit 4004. Over or below the thin film transistors 4010 and 4011, insulating layers 4041, 4042, 4020, and 4021 are provided.

Any one of the thin film transistors described in Embodiments 2 to 9 can be used as each of the thin film transistors 4010 and 4011 as appropriate, and can be formed using a similar process and a similar material. In the oxide semiconductor layer of each of the thin film transistors 4010 and 4011, hydrogen or water is reduced. Thus, the thin film transistors 4010 and 4011 have high reliability. In this embodiment, the thin film transistors 4010 and 4011 are n-channel thin film transistors.

A conductive layer 4040 is provided over part of the insulating layer 4021, which overlaps with a channel formation region of the oxide semiconductor layer in the thin film transistor 4011 for the drive circuit. The conductive layer 4040 is provided at the position overlapping with the channel formation region of the oxide semiconductor layer, whereby the amount of change in threshold voltage of the thin film transistor 4011 before and after a BT test can be reduced. A potential of the conductive layer 4040 may be the same as or different from that of a gate electrode layer of the thin film transistor 4011. The conductive layer 4040 can also function as a second gate electrode layer. In addition, the potential of the conductive layer 4040 may be GND or 0 V, or the conductive layer 4040 may be in a floating state.

A pixel electrode layer 4030 included in the liquid crystal element 4013 is electrically connected to a source electrode layer or a drain electrode layer of the thin film transistor 4010. A counter electrode layer 4031 of the liquid crystal element 4013 is provided on the second substrate 4006. A portion where the pixel electrode layer 4030, the counter electrode layer 4031, and the liquid crystal layer 4008 overlap with each other corresponds to the liquid crystal element 4013. Note that the pixel electrode layer 4030 and the counter electrode layer 4031 are provided with an insulating layer 4032 and an insulating layer 4033 respectively which each function as an alignment film, and the liquid crystal layer 4008 is sandwiched between the pixel electrode layer 4030 and the counter electrode layer 4031 with the insulating layers 4032 and 4033 interposed therebetween.

Note that the first substrate 4001 and the second substrate 4006 can be light transmitting substrates and can be formed of glass, ceramic, or plastic. As plastic, a fiberglass-reinforced plastic (FRP) plate, a polyvinyl fluoride (PVF) film, a polyester film, or an acrylic resin film can be used.

A spacer 4035 is a columnar spacer obtained by selective etching of an insulating film and is provided in order to control the distance (a cell gap) between the pixel electrode layer 4030 and the counter electrode layer 4031. Alternatively, a spherical spacer may be used. In addition, the counter electrode layer 4031 is electrically connected to a common potential line formed over the same substrate as the thin film transistor 4010. With the use of a common connection portion, the counter electrode layer 4031 and the common potential line can be electrically connected to each other by conductive particles arranged between a pair of substrates. Note that the conductive particles are included in the sealant 4005.

In addition, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is only generated within a narrow range of temperatures, a liquid crystal composition containing a chiral agent at greater than or equal to 5 wt % is used for the liquid crystal layer 4008 in order to widen the temperature range. The liquid crystal composition which includes a liquid crystal exhibiting a blue phase and a chiral agent has a short response time of less than or equal to 1 msec, has optical isotropy, which makes the alignment process unneeded, and has a small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced. Thus, productivity of the liquid crystal display device can be improved. A thin film transistor including an oxide semiconductor layer particularly has a possibility that electrical characteristics of the thin film transistor may significantly change and deviate from the designed range by the influence of static electricity. Therefore, it is more effective to use a blue phase liquid crystal material for a liquid crystal display device having a thin film transistor including an oxide semiconductor layer.

Note that the liquid crystal display device described in this embodiment is an example of a transmissive liquid crystal display device; however, an embodiment of the present invention can also be applied to either a semitransmissive (transflective) or reflective liquid crystal display device.

An example of the liquid crystal display device is illustrated in which a polarizing plate is provided on the outer surface of the substrate (on the viewer side) and a coloring layer and an electrode layer used for a display element are provided on the inner surface of the substrate in this order; however, the polarizing plate may be provided on the inner surface of the substrate. The layered structure of the polarizing plate and the coloring layer is not limited to that described in this embodiment and may be set as appropriate depending on materials of the polarizing plate and the coloring layer or conditions of the manufacturing process. Further, a light blocking film serving as a black matrix may be provided in a region other than a display portion.

Over the thin film transistors 4011 and 4010, the insulating layer 4041 is formed in contact with the oxide semiconductor layers. Here, as the insulating layer 4041, a silicon oxide layer is formed by a sputtering method. Further, the protective insulating layer 4042 is formed on and in contact with the insulating layer 4041. For the protective insulating layer 4042, a silicon nitride film can be used, for example. In addition, in order to reduce the surface roughness of the thin film transistors, the protective insulating layer 4042 is covered with the insulating layer 4021 functioning as a planarization insulating film.

The insulating layer 4021 is formed as the planarization insulating film. As the insulating layer 4021, an organic material having heat resistance such as polyimide, acrylic, benzocyclobutene, polyamide, or epoxy can be used. Other than such organic materials, it is also possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating films formed of these materials.

There is no particular limitation on the method for forming the insulating layer 4021. The insulating layer 4021 can be formed, depending on the material, by a method such as a sputtering method, an SOG method, a spin coating method, a dipping method, a spray coating method, or a droplet discharge method (e.g., an inkjet method, screen printing, or offset printing), or a tool (equipment) such as a doctor knife, a roll coater, a curtain coater, or a knife coater. The baking step of the insulating layer 4021 also serves as annealing of the semiconductor layer, whereby a liquid crystal display device can be manufactured efficiently.

The pixel electrode layer 4030 and the counter electrode layer 4031 can be formed using a light transmitting conductive material, such as indium tin oxide (ITO), indium zinc oxide (IZO) in which zinc oxide (ZnO) is mixed in indium oxide, a conductive material in which silicon oxide ($SiO_2$) is mixed in indium oxide, organoindium, organotin, indium oxide containing tungsten oxide, indium zinc oxide containing tungsten oxide, indium oxide containing titanium oxide, or indium tin oxide containing titanium oxide. Alternatively, in the case where a light transmitting property is not needed or a reflective property is needed for the pixel electrode layer 4030 or the counter electrode layer 4031 in a reflective liquid crystal display device, the pixel electrode layer 4030 or the counter electrode layer 4031 can be formed using one kind or plural kinds selected from metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag), an alloy thereof, and a nitride thereof.

A conductive composition containing a conductive high molecule (also referred to as a conductive polymer) can be used for the pixel electrode layer 4030 and the counter electrode layer 4031. The pixel electrode formed using the conductive composition preferably has a sheet resistance of 10000 ohms per square or less and a transmittance of 70% or more at a wavelength of 550 nm. Further, the resistivity of the conductive high molecule contained in the conductive composition is preferably 0.1 Ω·cm or less.

As the conductive high molecule, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

Furthermore, a variety of signals and potentials are supplied to the signal line driver circuit 4003 which is formed separately, the scan line driver circuit 4004, or the pixel portion 4002 from an FPC 4018.

A connection terminal electrode 4015 is formed from the same conductive film as the pixel electrode layer 4030 included in the liquid crystal element 4013, and a terminal electrode 4016 is formed from the same conductive film as the source and drain electrode layers of the thin film transistors 4010 and 4011.

The connection terminal electrode 4015 is electrically connected to a terminal included in the FPC 4018 via an anisotropic conductive film 4019.

FIGS. 15A to 15C illustrate an example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

A black matrix (a light blocking layer), an optical member (an optical substrate) such as a polarizing member, a retardation member, or an anti-reflection member, and the like are provided as appropriate. For example, circular polarization may be employed by using a polarizing substrate and a retardation substrate. In addition, a backlight, a sidelight, or the like may be used as a light source.

In an active matrix liquid crystal display device, display patterns are formed on a screen by driving of pixel electrodes that are arranged in matrix. Specifically, voltage is applied between a selected pixel electrode and a counter electrode corresponding to the pixel electrode, and thus, a liquid crystal layer disposed between the pixel electrode and the counter electrode is optically modulated. This optical modulation is recognized as a display pattern by a viewer.

Since the thin film transistor is easily damaged due to static electricity or the like, a protective circuit is preferably provided over the same substrate as the pixel portion or the driver circuit portion. The protective circuit is preferably formed with a non-linear element including an oxide semiconductor layer. For example, a protective circuit is provided between the pixel portion, and a scan line input terminal and a signal line input terminal. In this embodiment, a plurality of protective circuits is provided so that the pixel transistor and the like are not damaged when surge voltage due to static electricity or the like is applied to the scan line, the signal line, or a capacitor bus line. Accordingly, the protective circuit is configured to release charges to a common wiring when surge voltage is applied to the protective circuit. The protective circuit includes non-linear elements which are arranged in parallel between the scan line, the signal line, or the capacitor bus and the common wiring. Each of the non-linear elements includes a two-terminal element such as a diode or a three-terminal element such as a transistor. For example, the non-linear element can be formed through the same steps as the thin film transistor of the pixel portion. For example, characteristics similar to those of a diode can be achieved by connecting a gate terminal to a drain terminal.

Further, for a liquid crystal display module, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

There is no particular limitation on the kind of liquid crystal element in the liquid crystal display device disclosed in this specification, and a transmissive liquid crystal display device including a TN liquid crystal, an OCB liquid crystal, an STN liquid crystal, a VA liquid crystal, an ECB liquid crystal, a GH liquid crystal, a polymer dispersed liquid crystal, a discotic liquid crystal, or the like can be used. In particular, a normally black liquid crystal panel such as a transmissive liquid crystal display device utilizing a vertical alignment (VA) mode is preferable. These liquid crystal materials exhibit a cholesteric phase, a smectic phase, a cubic phase, a chiral nematic phase, an isotropic phase, or the like depending on conditions. Some examples are given as a vertical alignment mode. For example, a multi-domain vertical alignment (MVA) mode, a patterned vertical alignment (PVA) mode, an ASV mode, or the like can be employed.

Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a direction perpendicular to a panel surface when no voltage is applied. Moreover, it is possible to use a method called domain multiplication or multi-domain design, in which a pixel is divided into some regions (subpixels) and molecules are aligned in different directions in their respective regions.

Note that an embodiment of the present invention is not limited to a liquid crystal display device and can also be applied to a pixel of an EL display device which includes a light emitting element such as an electroluminescent element (also referred to as an EL element) as a display element.

This embodiment can be implemented in appropriate combination with any of other embodiments.

Embodiment 12

In this embodiment, examples of electronic devices including any of the liquid crystal display devices of the embodiments described above are described.

Figure 16A:
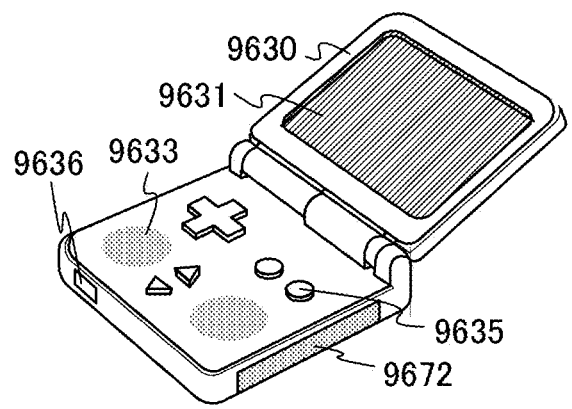
FIGS. 16A to 16C illustrate electronic devices.

FIG. 16A illustrates a portable game machine, which can include a housing 9630, a display portion 9631, a speaker 9633, operation keys 9635, a connection terminal 9636, a recording medium reading portion 9672, and the like. The portable game machine illustrated in FIG. 16A can have a function of reading a program or data stored in a recording medium to display it on the display portion, a function of sharing information with another portable game machine by wireless communication, and the like. Note that the portable game machine illustrated in FIG. 16A can have various functions besides those given above.

Figure 16B:
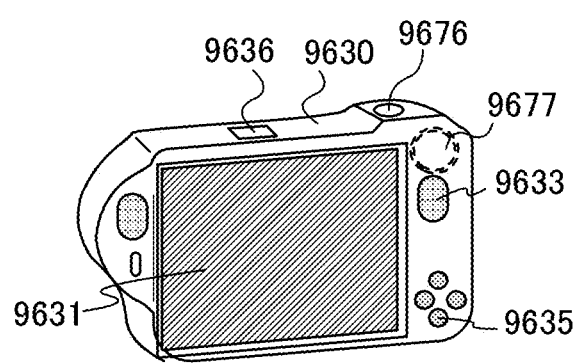

FIG. 16B illustrates a digital camera, which can include the housing 9630, the display portion 9631, the speaker 9633, the operation keys 9635, the connection terminal 9636, a shutter button 9676, an image receiving portion 9677, and the like. The digital camera having a television reception function in FIG. 16B can have a function of photographing a still image and/or a moving image, a function of automatically or manually correcting the photographed image, a function of obtaining various kinds of information from an antenna, a function of storing the photographed image or the information obtained from the antenna, and a function of displaying the photographed image or the information obtained from the antenna on the display portion. Note that the digital camera having the television reception function in FIG. 16B can have various functions besides those given above.

Figure 16C:
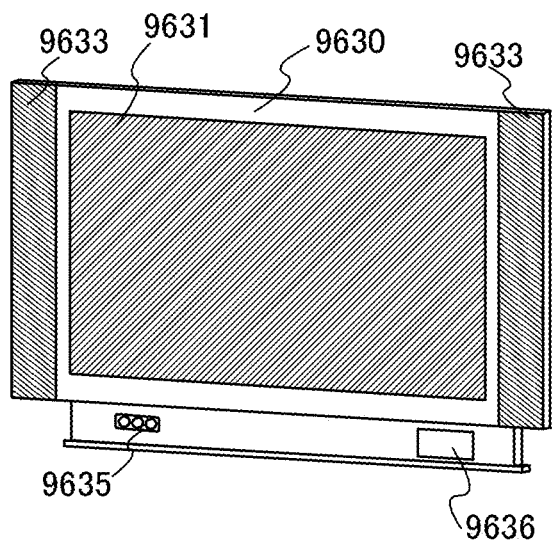

FIG. 16C illustrates a television set, which can include the housing 9630, the display portion 9631, the speaker 9633, the operation keys 9635, the connection terminal 9636, and the like. The television set in FIG. 16C can have a function of processing and converting an electric wave for television into an image signal, a function of processing and converting the image signal into a signal suitable for display, a function of converting a frame frequency of the image signal, and the like. Note that the television set in FIG. 16C can have various functions besides those given above.

Figure 17A:
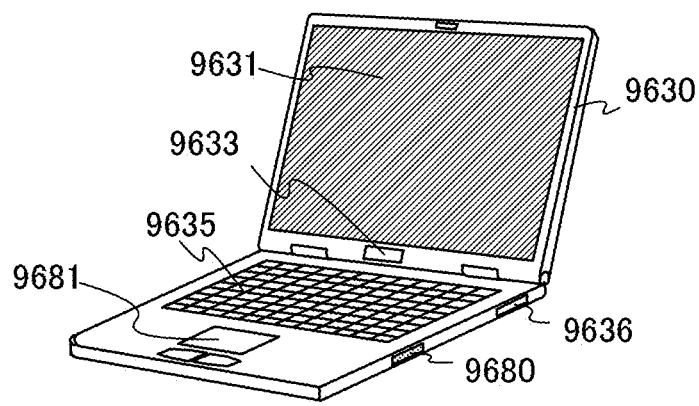
FIGS. 17A to 17C illustrate electronic devices.

FIG. 17A illustrates a computer, which can include the housing 9630, the display portion 9631, the speaker 9633, the operation keys 9635, the connection terminal 9636, a pointing device 9681, an external connection port 9680, and the like. The computer in FIG. 17A can have a function of displaying a variety of information (e.g., a still image, a moving image, and a text image) on the display portion, a function of controlling processing by a variety of software (programs), a communication function such as wireless communication or wired communication, a function of being connected to various computer networks with the communication function, a function of transmitting or receiving a variety of data with the communication function, and the like. Note that the computer illustrated in FIG. 17A can have various functions besides those given above.

Figure 17B:
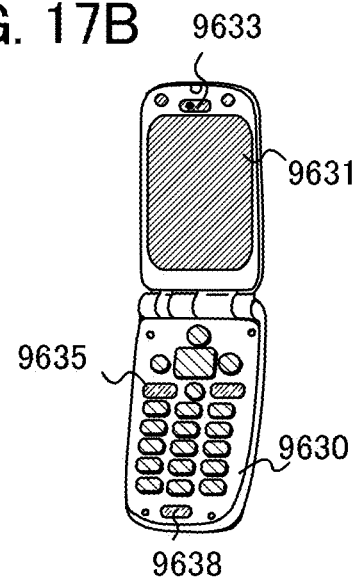

FIG. 17B illustrates a mobile phone, which can include the housing 9630, the display portion 9631, the speaker 9633, the operation keys 9635, a microphone 9638, and the like. The mobile phone in FIG. 17B can have a function of displaying a variety of information (e.g., a still image, a moving image, and a text image) on the display portion, a function of displaying a calendar, a date, the time, or the like on the display portion, a function of operating or editing the information displayed on the display portion, a function of controlling processing by various kinds of software (programs), and the like. Note that the mobile phone in FIG. 17B can have various functions besides those given above.

Figure 17C:
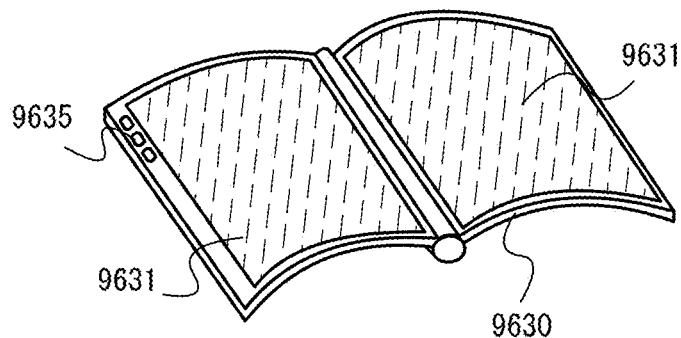

FIG. 17C illustrates electronic paper (also referred to as an e-book), which can include the housing 9630, the display portion 9631, the operation key 9635, and the like. The electronic paper in FIG. 17C can have a function of displaying a variety of information (e.g., a still image, a moving image, and a text image) on the display portion, a function of displaying a calendar, a date, the time, and the like on the display portion, a function of operating or editing the information displayed on the display portion, a function of controlling processing by various kinds of software (programs), and the like. Note that the electronic paper in FIG. 17C can have various functions besides those given above.

In each of the electronic devices described in this embodiment, off-state current can be decreased in a plurality of pixels included in the display portion. Accordingly, an electronic device including a liquid crystal display device capable of extending the period in which a storage capacitor can hold a voltage and reducing power consumption when displaying a still image or the like can be obtained. Furthermore, by an increase in aperture ratio, a liquid crystal display device having a high-definition display portion can be obtained.

This embodiment can be implemented in appropriate combination with any of the structures described in other embodiments.

Embodiment 13

In this embodiment, a principle of operation of a bottom-gate transistor including an oxide semiconductor will be described.

Figure 18:
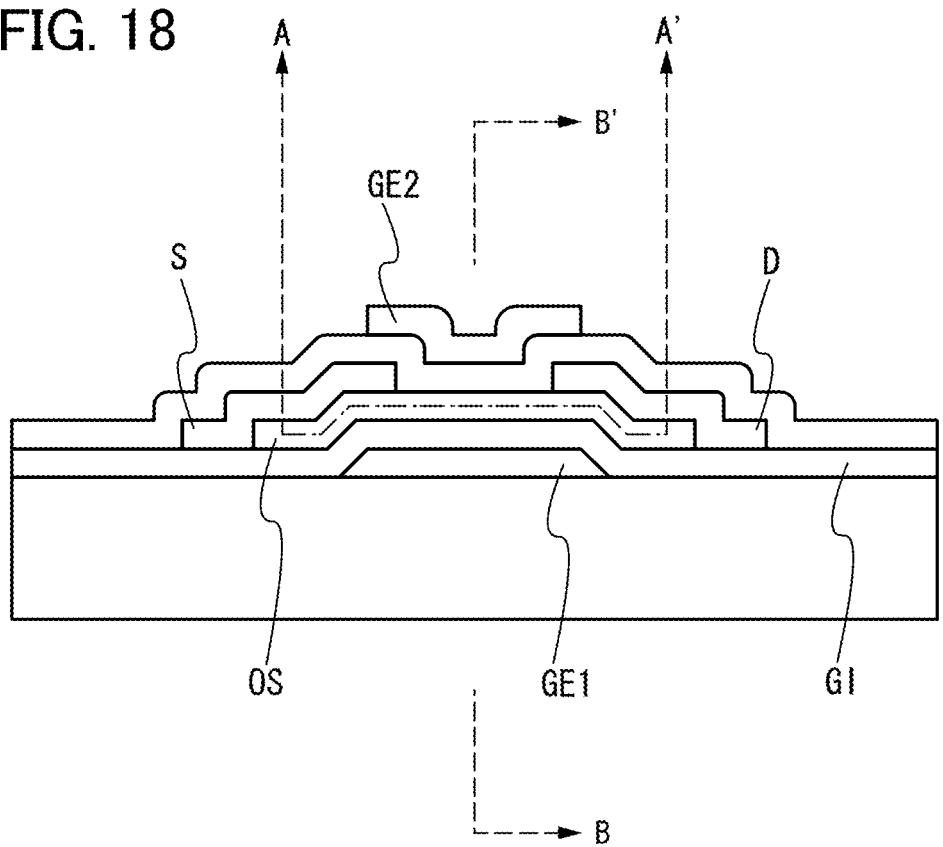
FIG. 18 is a diagram for illustrating Embodiment 13.

FIG. 18 is a cross-sectional view of an inverted-staggered insulated-gate transistor including an oxide semiconductor. An oxide semiconductor layer (OS) is provided over a gate electrode (GE1) with a gate insulating film (GI) interposed therebetween, and a source electrode (S) and a drain electrode (D) are provided thereover.

Figure 19A:
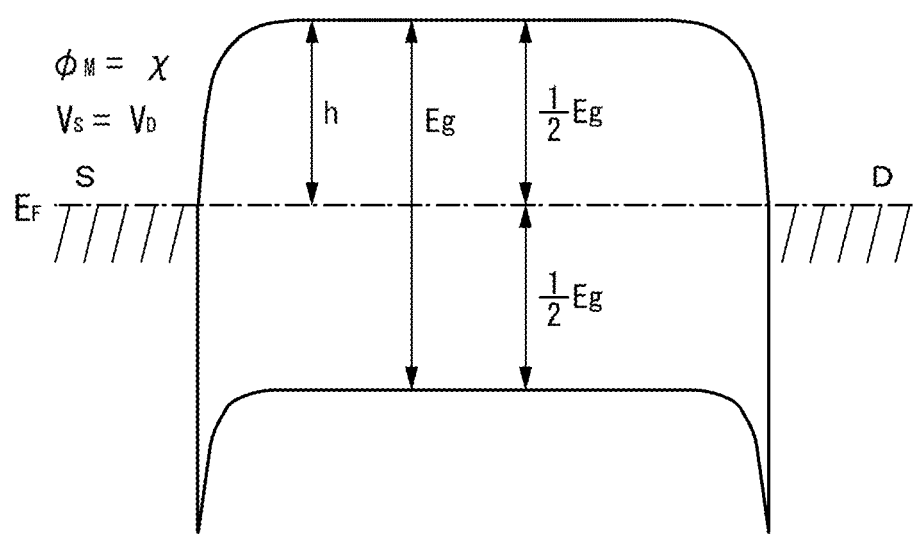
FIGS. 19A and 19B are diagrams for illustrating Embodiment 13.
Figure 19B:
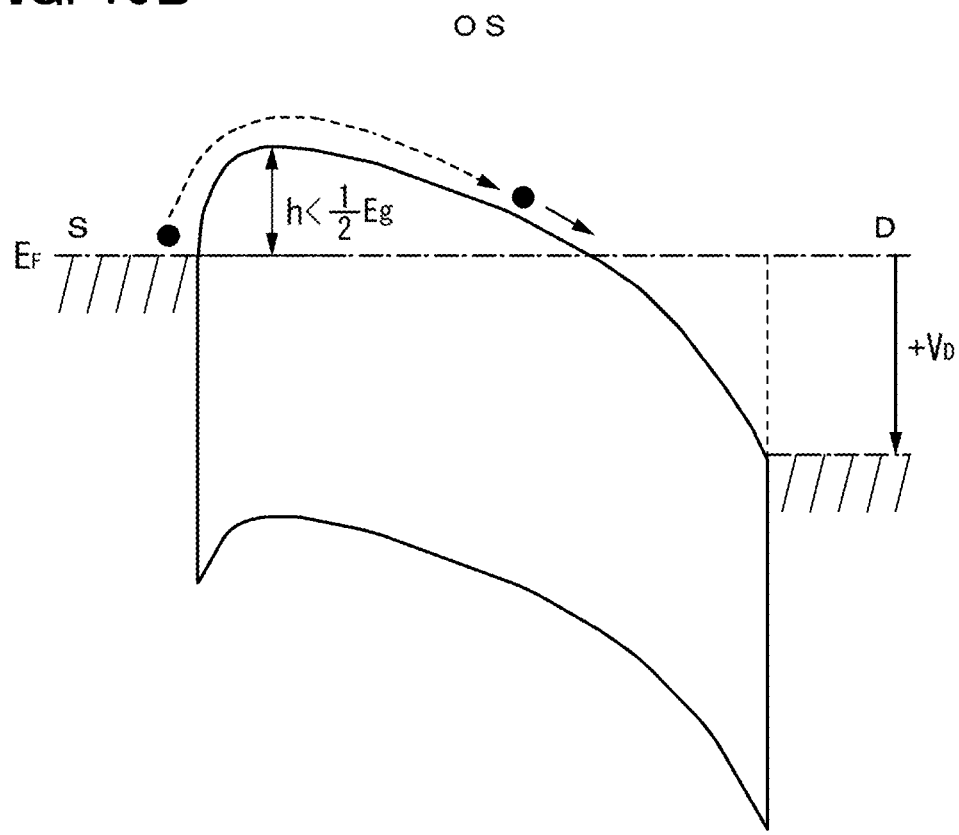

FIGS. 19A and 19B are energy band diagrams (schematic diagrams) along an A-A' section illustrated in FIG. 18. FIG. 19A illustrates the case where the potential of a voltage applied to the source is equal to the potential of a voltage applied to the drain (VD=0 V), and FIG. 19B illustrates the case where a positive potential with respect to the source is applied to the drain (VD>0).

FIGS. 20A and 20B are energy band diagrams (schematic diagrams) along a B-B' section illustrated in FIG. 18. FIG. 20A illustrates an on state in which a positive potential (+VG) is applied to the gate (G1) and carriers (electrons) flow between the source and the drain. FIG. 20B illustrates an off state in which a negative potential (−VG) is applied to the gate (G1) and minority carriers do not flow.

Figure 21:
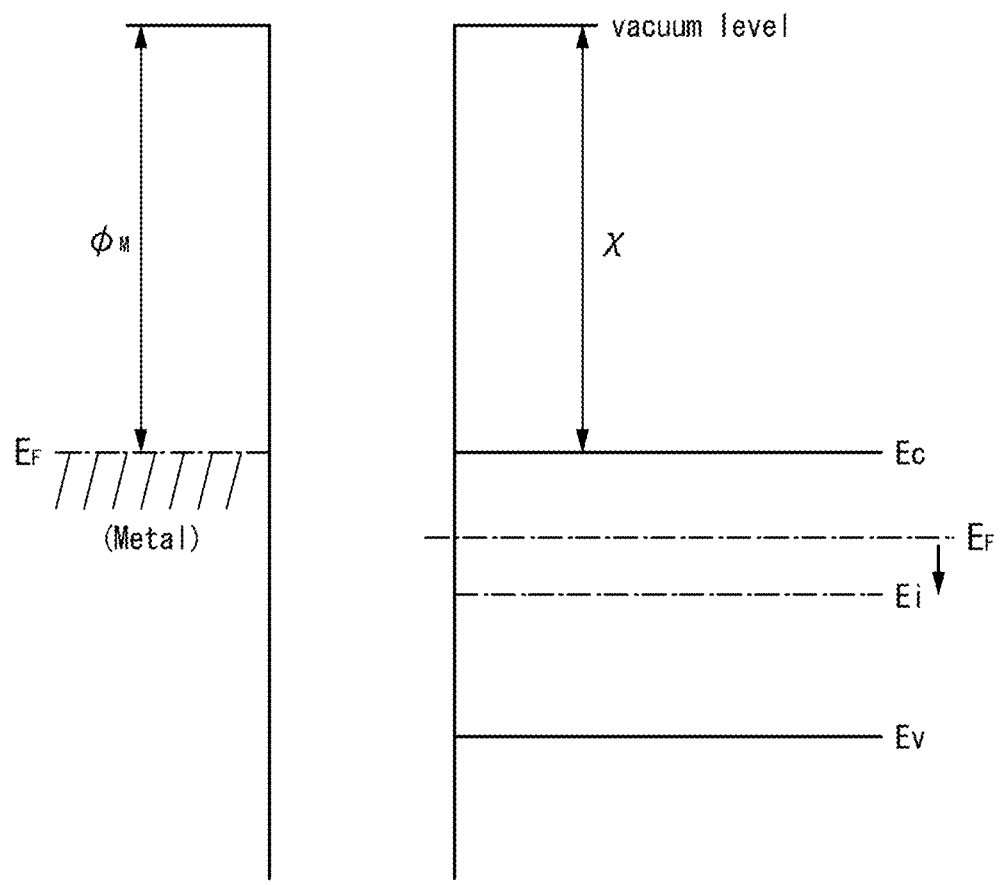
FIG. 21 is a diagram for illustrating Embodiment 13.

FIG. 21 illustrates the relationships between the vacuum level and the work function of a metal ($\phi M$) and between the vacuum level and the electron affinity ($\chi$) of an oxide semiconductor.

Because metal is degenerated, the conduction band and the Fermi level correspond to each other. On the other hand, a conventional oxide semiconductor is typically an n-type semiconductor, in which case the Fermi level (Ef) is away from the intrinsic Fermi level (Ei) located in the middle of a band gap and is located closer to the conduction band. Note that it is known that hydrogen is a donor in an oxide semiconductor and is one factor causing an oxide semiconductor to be an n-type semiconductor.

On the other hand, an oxide semiconductor of the present invention is an intrinsic (i-type) or a substantially intrinsic oxide semiconductor which is obtained by removing hydrogen that is an n-type impurity from an oxide semiconductor and purifying the oxide semiconductor such that an impurity other than a main component of the oxide semiconductor is prevented from being contained therein as much as possible. In other words, a feature is that a purified i-type (intrinsic) semiconductor, or a semiconductor close thereto, is obtained not by adding an impurity but by removing an impurity such as hydrogen or water as much as possible. This enables the Fermi level (Ef) to be at the same level as the intrinsic Fermi level (Ei).

In the case where the band gap (Eg) of an oxide semiconductor is 3.15 eV, the electron affinity ($\chi$) is said to be 4.3 eV. The work function of titanium (Ti) included in the source electrode and the drain electrode is substantially equal to the electron affinity ($\chi$) of the oxide semiconductor. In that case, a Schottky barrier for electrons is not formed at an interface between the metal and the oxide semiconductor.

In other words, in the case where the work function of metal ($\phi M$) and the electron affinity ($\chi$) of the oxide semiconductor are equal to each other and the metal and the oxide semiconductor are in contact with each other, an energy band diagram (a schematic diagram) as illustrated in FIG. 19A is obtained.

In FIG. 19B, a black circle (●) represents an electron, and when a positive potential is applied to the drain, the electron is injected into the oxide semiconductor over the barrier (h) and flows toward the drain. In that case, the height of the barrier (h) changes depending on the gate voltage and the drain voltage; in the case where a positive drain voltage is applied, the height of the barrier (h) is smaller than the height of the barrier in FIG. 19A where no voltage is applied, i.e., ½ of the band gap (Eg).

The electron injected into the oxide semiconductor at this time flows in the oxide semiconductor as illustrated in FIG. 20A. In addition, in FIG. 20B, when a negative potential (reverse bias) is applied to the gate electrode (G1), the value of current is extremely close to zero because holes that are minority carriers are substantially zero.

For example, even when an insulated-gate transistor as described above has a channel width W of $1 \times 10^4$ μm and a channel length of 3 μm, the off-state current is $10^{13}$ A or less and the subthreshold swing (S value) is 0.1 V/dec (the thickness of the gate insulating film: 100 nm).

Note that the intrinsic carrier concentration of a silicon semiconductor is $1.45 \times 10^{10}/\text{cm}^3$ (300 K) and carriers exist even at room temperature. This means that thermally excited carriers exist even at room temperature. A silicon wafer to which an impurity such as phosphorus or boron is added is practically used. In addition, even in a so-called intrinsic silicon wafer, impurities that cannot be controlled exist. Therefore, carriers exist in practice in a silicon semiconductor at $1 \times 10^{14}/\text{cm}^3$ or more, which contributes to a conduction between the source and the drain. Furthermore, the band gap of a silicon semiconductor is 1.12 eV, and thus the off-state current of a transistor including a silicon semiconductor significantly changes depending on temperature.

Therefore, not by simply using an oxide semiconductor having a wide band gap for a transistor but by purifying the oxide semiconductor such that an impurity other than a main component can be prevented from being contained therein as much as possible so that the carrier concentration becomes less than $1 \times 10^{14}/\text{cm}^3$, preferably $1 \times 10^{12}/\text{cm}^3$ or less, carriers to be thermally excited at a practical operation temperature can be eliminated, and the transistor can be operated only with carriers that are injected from the source side. This makes it possible to decrease the off-state current to $1 \times 10^{-13}$ A or less and to obtain a transistor whose off-state current hardly changes with a change in temperature and which is capable of extremely stable operation.

A technical idea of the present invention is that an impurity is not added to an oxide semiconductor and on the contrary the oxide semiconductor itself is purified by removing an impurity such as water or hydrogen which undesirably exists therein. In other words, a feature of an embodiment of the present invention is that an oxide semiconductor itself is purified by removing water or hydrogen which forms a donor level and further by sufficiently supplying oxygen to eliminate oxygen defects.

In an oxide semiconductor, even shortly after the deposition, hydrogen is observed on the order of $10^{20}/\text{cm}^3$ by secondary ion mass spectrometry (SIMS). One technical idea of the present invention is to purify an oxide semiconductor and obtain an electrically i-type (intrinsic) semiconductor by intentionally removing an impurity such as water or hydrogen which forms a donor level and further by adding oxygen (one of components of the oxide semiconductor), which decreases at the same time as removing water or hydrogen, to the oxide semiconductor.

As a result, it is preferable that the amount of hydrogen be as small as possible, and it is also preferable that the number of carriers in the oxide semiconductor be as small as possible. The oxide semiconductor is a purified i-type (intrinsic) semiconductor from which carriers have been eliminated and to which a meaning as a path of carriers as a semiconductor is given, rather than intentionally including carriers as a semiconductor, when used for an insulated-gate transistor.

As a result, by completely eliminating carriers from an oxide semiconductor or significantly reducing carries therein, the off-state current of an insulated-gate transistor can be decreased, which is a technical idea of an embodiment of the present invention. In other words, as a criterion, the hydrogen concentration should be $1 \times 10^{16}/\text{cm}^3$ or less and the carrier concentration should be less than $1 \times 10^{14}/\text{cm}^3$, preferably $1 \times 10^{12}/\text{cm}^3$ or less. According to a technical idea of the present invention, the ideal hydrogen concentration and carrier concentration are zero or close to zero.

In addition, as a result, the oxide semiconductor functions as a path, and the oxide semiconductor itself is an i-type (intrinsic) semiconductor which is purified so as to include no carriers or extremely few carriers, and carriers are supplied by an electrode on the source side. The degree of supply is determined by the barrier height that is obtained from the electron affinity χ of the oxide semiconductor, the Fermi level, which ideally corresponds to the intrinsic Fermi level, and the work function of the source or drain electrode.

Therefore, it is preferable that off-state current be as small as possible, and a feature of an embodiment of the present invention is that as characteristics of an insulated-gate transistor having a channel length of 10 µm, to which a drain voltage of 1 V to 10 V is applied, the off-state current per micrometer of channel width is 10 aA/µm ($1\times10^{-17}$ A/µm) or less, furthermore, 1 aA/µm ($1\times10^{-18}$ A/µm) or less.

Embodiment 14

In this embodiment, measured values of off-state current using a test element group (also referred to as a TEG) will be described below.

Figure 22:
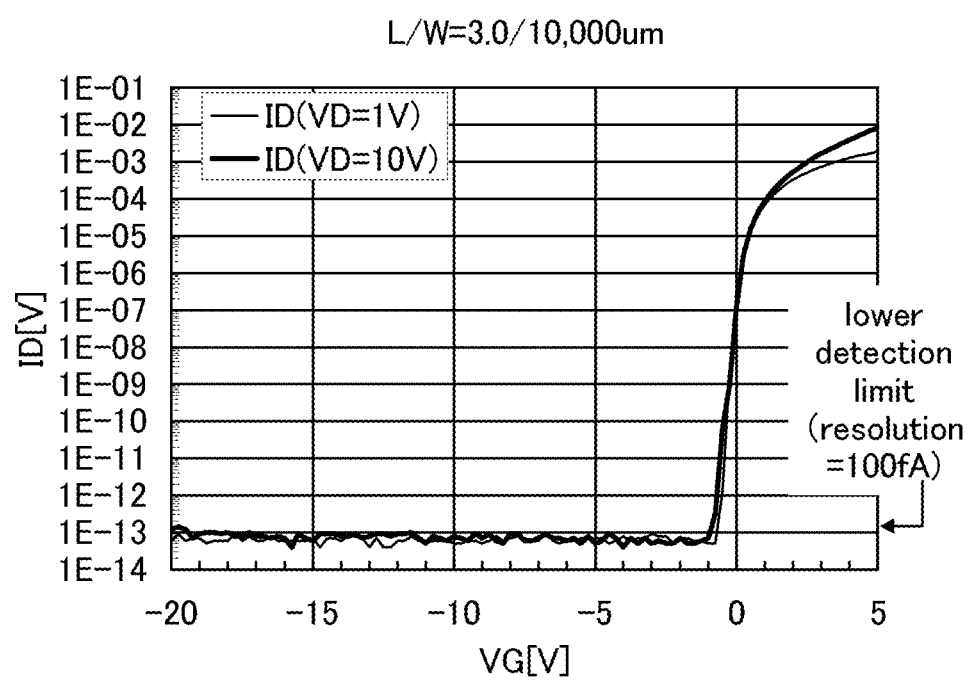
FIG. 22 is a diagram for illustrating Embodiment 14.
Figure 23A:
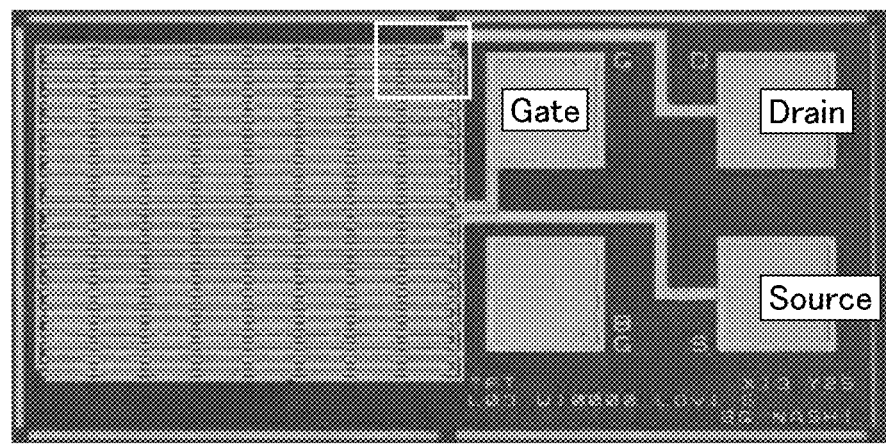
FIGS. 23A and 23B are diagrams for illustrating Embodiment 14.
Figure 23B:
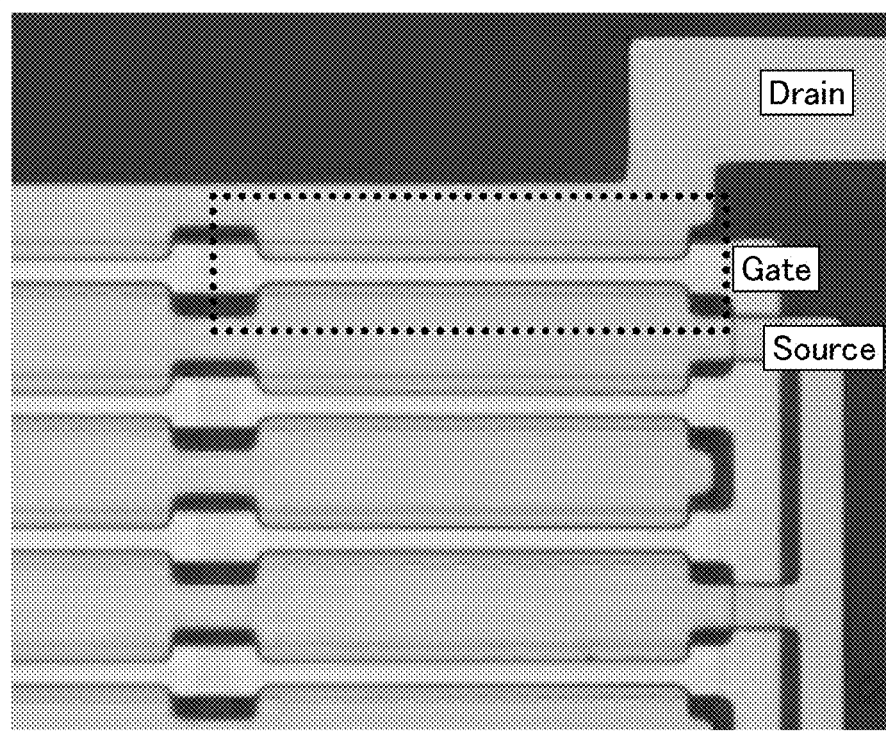

FIG. 22 shows initial characteristics of a thin film transistor with L/W=3 µm/10000 µm in which 200 thin film transistors each with L/W=3 µm/50 µm are connected in parallel. In addition, a top view is shown in FIG. 23A and a partially enlarged top view thereof is show in FIG. 23B. The region enclosed by a dotted line in FIG. 23B is a thin film transistor of one stage with L/W=3 µm/50 µm and Lov=1.5 µm. In order to measure initial characteristics of the thin film transistor, the changing characteristics of the source-drain current (hereinafter referred to as a drain current or Id), i.e., Vg-Id characteristics, were measured, under the conditions where the substrate temperature was set to room temperature, the voltage between source and drain (hereinafter, a drain voltage or Vd) was set to 10 V, and the voltage between source and gate (hereinafter, a gate voltage or Vg) was changed from −20 V to +20 V. Note that FIG. 22 shows Vg in the range of from −20 V to +5 V.

As shown in FIG. 22, the thin film transistor having a channel width W of 10000 µm has an off-state current of $1\times10^{-13}$ A or less at Vd of 1 V and 10 V, which is less than or equal to the resolution (100 fA) of a measurement device (a semiconductor parameter analyzer, Agilent 4156C manufactured by Agilent Technologies Inc.).

A method for manufacturing the thin film transistor used for the measurement is described.

First, a silicon nitride layer was formed as a base layer over a glass substrate by a CVD method, and a silicon oxynitride layer was formed over the silicon nitride layer. A tungsten layer was formed as a gate electrode layer over the silicon oxynitride layer by a sputtering method. Here, the gate electrode layer was formed by selectively etching the tungsten layer.

Then, a silicon oxynitride layer having a thickness of 100 nm was formed as a gate insulating layer over the gate electrode layer by a CVD method.

Then, an oxide semiconductor layer having a thickness of 50 nm was formed over the gate insulating layer by a sputtering method using an In—Ga—Zn—O-based oxide semiconductor target (at a molar ratio of $In_2O_3:Ga_2O_3$:ZnO=1:1:2). Here, an island-shaped oxide semiconductor layer was formed by selectively etching the oxide semiconductor layer.

Then, first heat treatment was performed on the oxide semiconductor layer in a nitrogen atmosphere in a clean oven at 450° C. for 1 hour.

Then, a titanium layer (having a thickness of 150 nm) was formed as a source electrode layer and a drain electrode layer over the oxide semiconductor layer by a sputtering method. Here, the source electrode layer and the drain electrode layer were formed by selective etching such that 200 thin film transistors each having a channel length L of 3 µm and a channel width W of 50 µm were connected in parallel to obtain a thin film transistor with L/W=3 µm/10000 µm.

Then, a silicon oxide layer having a thickness of 300 nm was formed as a protective insulating layer in contact with the oxide semiconductor layer by a reactive sputtering method. Here, opening portions were formed over the gate electrode layer, the source electrode layer, and the drain electrode layer by selectively etching the silicon oxide layer which is a protective layer. After that, second heat treatment was performed in a nitrogen atmosphere at 250° C. for 1 hour.

Then, heat treatment was performed at 150° C. for 10 hours before the measurement of Vg-Id characteristics.

Through the above process, a bottom-gate thin film transistor was manufactured.

The reason why the thin film transistor has an off-state current of approximately $1\times10^{-13}$ A as shown in FIG. 22 is that the concentration of hydrogen in the oxide semiconductor layer could be sufficiently reduced in the above manufacturing process. The concentration of hydrogen in the oxide semiconductor layer is $1\times10^{16}/cm^3$ or less. Note that the concentration of hydrogen in the oxide semiconductor layer was measured by secondary ion mass spectrometry (SIMS).

Although the example of using an In—Ga—Zn—O-based oxide semiconductor is described, this embodiment is not particularly limited thereto. Another oxide semiconductor material, such as an In—Sn—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, an In—Zn—O-based oxide semiconductor, an In—Sn—O-based oxide semiconductor, a Sn—Zn—O-based oxide semiconductor, an Al—Zn—O-based oxide semiconductor, an In—O-based oxide semiconductor, a Sn—O-based oxide semiconductor, or a Zn—O-based oxide semiconductor, can also be used. Furthermore, as an oxide semiconductor material, an In—Al—Zn—O-based oxide semiconductor mixed with $AlO_x$ of 2.5 wt % to 10 wt % or an In—Zn—O-based oxide semiconductor mixed with $SiO_x$ of 2.5 wt % to 10 wt % can be used.

The carrier concentration of the oxide semiconductor layer which is measured by a carrier measurement device is less than $1\times10^{14}/cm^3$, preferably $1\times10^{12}/cm^3$ or less. In other words, the carrier concentration of the oxide semiconductor layer can be made as close to zero as possible.

The thin film transistor can also have a channel length L of 10 nm to 1000 nm, which enables an increase in circuit operation speed, and the off-state current is extremely small, which enables a further reduction in power consumption.

In addition, in circuit design, the oxide semiconductor layer can be regarded as an insulator when the thin film transistor is in an off state.

After that, the temperature characteristics of off-state current of the thin film transistor manufactured in this embodiment were evaluated. Temperature characteristics are important in considering the environmental resistance, maintenance of performance, or the like of an end product in which the thin film transistor is used. It is to be understood that a smaller amount of change is more preferable, which increases the degree of freedom for product designing.

For the temperature characteristics, the Vg-Id characteristics were obtained using a constant-temperature chamber under the conditions where substrates provided with thin film transistors were kept at respective constant temperatures of −30° C., 0° C., 25° C., 40° C., 60° C., 80° C., 100° C., and 120° C., the drain voltage was set to 6 V, and the gate voltage was changed from −20 V to +20V.

Figure 24A:
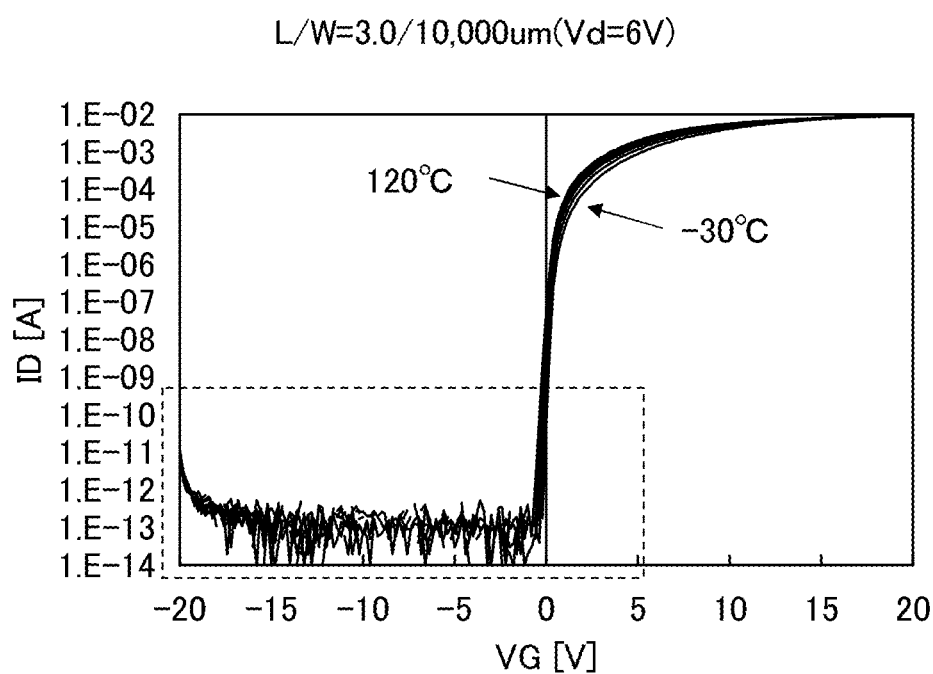
FIGS. 24A and 24B are diagrams for illustrating Embodiment 14.
Figure 24B:
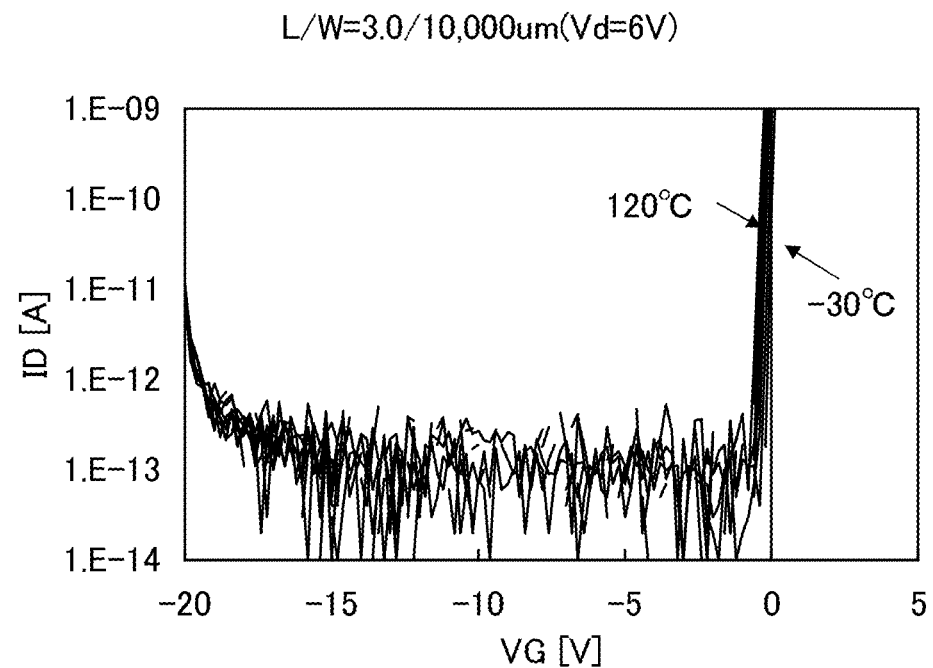

FIG. 24A shows Vg-Id characteristics measured at the above temperatures and superimposed on one another, and FIG. 24B shows an enlarged view of a range of off-state current enclosed by a dotted line in FIG. 24A. The rightmost curve indicated by an arrow in the diagram is a curve obtained at −30° C.; the leftmost curve is a curve obtained at 120° C.; and curves obtained at the other temperatures are located therebetween. The temperature dependence of on-state currents can hardly be observed. On the other hand, as clearly shown also in the enlarged view of FIG. 24B, the off-state currents are less than or equal to $1 \times 10^{-12}$ A, which is near the resolution of the measurement device, at all temperatures except in the vicinity of a gate voltage of −20 V, and the temperature dependence thereof is not observed. In other words, even at a high temperature of 120° C., the off-state current is kept less than or equal to $1 \times 10^{-12}$ A, and given that the channel width W is 10000 μm, it can be seen that the off-state current is significantly small.

A thin film transistor including a purified oxide semiconductor (purified OS) as described above shows almost no dependence of off-state current on temperature. It can be said that an oxide semiconductor does not show temperature dependence when purified because the conductivity type becomes extremely close to an intrinsic type and the Fermi level is located in the middle of the forbidden band, as illustrated in the band diagram of FIG. 20A. This also results from the fact that the oxide semiconductor has an energy gap of 3 eV or more and includes very few thermally excited carriers. In addition, the source region and the drain region are in a degenerated state, which is also a factor for showing no temperature dependence. The thin film transistor is mainly operated with carriers which are injected from the degenerated source region to the oxide semiconductor, and the above characteristics (independence of off-state current on temperature) can be explained by independence of carrier concentration on temperature.

In the case where a display device or the like is manufactured using a thin film transistor having such an extremely small off-state current, there is very little leakage. Therefore, display data can be held for a longer period of time.

Embodiment 15

Figure 25A:
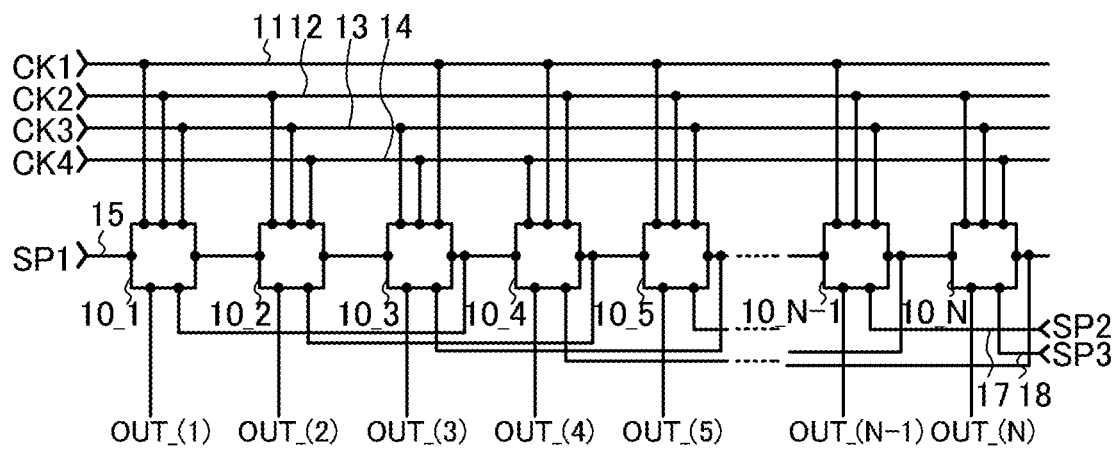
FIGS. 25A to 25C illustrate a structure of a shift register.
Figure 25B:
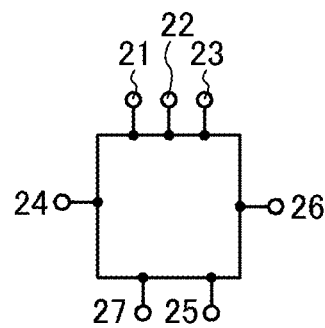
Figure 25C:
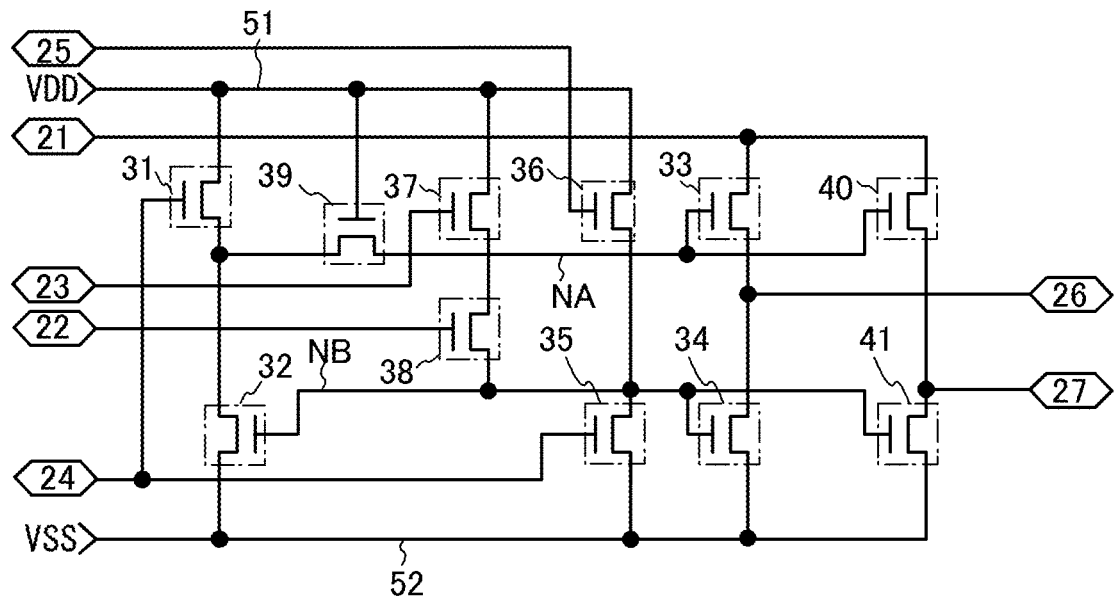

In this embodiment, an example of a structure of a shift register included in each of a scan line driver circuit and a signal line driver circuit of a liquid crystal display device which is one embodiment of the present invention is described using FIGS. 25A to 25C.

The shift register shown in FIG. 25A includes first to N-th pulse output circuits 10_1 to 10_N (N is a natural number of 3 or more). A first clock signal CK1 from a first wiring 11, a second clock signal CK2 from a second wiring 12, a third clock signal CK3 from a third wiring 13, and a fourth clock signal CK4 from a fourth wiring 14 are supplied to the first to the N-th pulse output circuits 10_1 to 10_N of the shift register shown in FIG. 25A. A start pulse SP1 (a first start pulse) from a fifth wiring 15 is input to the first pulse output circuit 10_1. A signal from the pulse output circuit in the previous stage (the signal called a previous stage signal OUT(n−1)) (n is a natural number of more than or equal to 2 and lower than or equal to N) is input to the n-th pulse output circuit 10_N in the second or later stage. A signal from the third pulse output circuit 10_3 in the stage two stages after the first pulse output circuit 10_1 is input to the first pulse output circuit 10_1; similarly, a signal from the (n+2)-th pulse output circuit 10_(n+2) in the stage two stages after the n-th pulse output circuit 10_n (the signal called a subsequent-stage signal OUT(n+2)) is input to the n-th pulse output circuit. In this manner, a first output signal (corresponding one of OUT(1)(SR) to OUT(N)(SR)) to be input to the pulse output circuit of the next stage and/or the two-stage-previous stage and a second output signal (corresponding one of OUT(1) to OUT(N)) which is input to another circuit or the like are output from each of the pulse output circuits. Note that as shown in FIG. 25A, the subsequent-stage signal OUT(n+2) is not input to the last two stages of the shift register; therefore, as an example, a second start pulse SP2 may be input to one of the last two stages of the shift register and a third start pulse SP3 may be input to the other of the same. Alternatively, signals may be generated inside the shift register. For example, a (N+1)-th pulse output circuit $10_{(N+1)}$ and a (N+2)-th pulse output circuit $10_{(N+2)}$ which do not contribute to output of pulses to the pixel portion (such circuits are also referred to as dummy stages) may be provided, and signals corresponding to the second start pulse (SP2) and the third start pulse (SP3) may be generated in the dummy stages.

Note that the first to the fourth clock signals (CK1) to (CK4) each are a signal which oscillates between an H-level signal and an L-level signal at a constant cycle. The first to the fourth clock signals (CK1) to (CK4) are delayed by ¼ period sequentially. In this embodiment, by using the first to fourth clock signals (CK1) to (CK4), control of driving of the pulse output circuit or the like is performed. Note that the clock signal CK is also called GCK or SCK depending on a driver circuit to which the clock signal is input; however, description is made in this embodiment by using CK as the clock signal.

Note that when it is explicitly described that "A and B are connected," the case where A and B are electrically connected, the case where A and B are functionally connected, and the case where A and B are directly connected are included therein. Here, each of A and B corresponds to an object (e.g., a device, an element, a circuit, a wiring, an electrode, a terminal, a conductive film, or a layer). Accordingly, other connection relations are included without being limited to a predetermined connection relation, for example, the connection relation shown in the drawings and the texts.

Each of the first to N-th pulse output circuits 10_1 to 10_N includes a first input terminal 21, a second input terminal 22, a third input terminal 23, a fourth input terminal 24, a fifth input terminal 25, a first output terminal 26, and a second output terminal 27 (see FIG. 25B).

The first input terminal 21, the second input terminal 22, and the third input terminal 23 are electrically connected to any of the first to fourth wirings 11 to 14. For example, in FIGS. 25A and 25B, the first input terminal 21 of the first pulse output circuit 10_1 is electrically connected to the first wiring 11, the second input terminal 22 of the first pulse output circuit 10_1 is electrically connected to the second wiring 12, and the third input terminal 23 of the first pulse output circuit 10_1 is electrically connected to the third wiring 13. In addition, the first input terminal 21 of the second pulse output circuit 10_2 is electrically connected to the second wiring 12, the second input terminal 22 of the second pulse output circuit 10_2 is electrically connected to the third wiring 13, and the third input terminal 23 of the second pulse output circuit 10_2 is electrically connected to the fourth wiring 14.

In FIGS. 25A and 25B, in the first pulse output circuit 10_1, the first start pulse SP1 is input to the fourth input terminal 24, a subsequent-stage signal OUT(3) is input to the fifth input terminal 25, the first output signal OUT(1)(SR) is output from the first output terminal 26, and the second output signal OUT(1) is output from the second output terminal 27.

Next, an example of a specific circuit structure of the pulse output circuit is described with reference to FIG. 25C.

In FIG. 25C, a first terminal of the first transistor 31 is electrically connected to the power supply line 51, a second terminal of the first transistor 31 is electrically connected to a first terminal of the ninth transistor 39, and a gate electrode of the first transistor 31 is electrically connected to the fourth input terminal 24. A first terminal of the second transistor 32 is electrically connected to the power supply line 52, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 52, and a second terminal of the fourth transistor 34 is electrically connected to the first output terminal 26. A first terminal of the fifth transistor 35 is electrically connected to the power supply line 52, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 51, a second terminal of the sixth transistor 36 is electrically connected to the gate electrode of the second transistor 32 and the gate electrode of the fourth transistor 34, and a gate electrode of the sixth transistor 36 is electrically connected to the fifth input terminal 25. A first terminal of the seventh transistor 37 is electrically connected to the power supply line 51, a second terminal of the seventh transistor 37 is electrically connected to a second terminal of the eighth transistor 38, and a gate electrode of the seventh transistor 37 is electrically connected to the third input terminal 23. A first terminal of the eighth transistor 38 is electrically connected to the gate electrode of the second transistor 32 and the gate electrode of the fourth transistor 34, and a gate electrode of the eighth transistor 38 is electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to the gate electrode of the third transistor 33 and the gate electrode of the tenth transistor 40, and a gate electrode of the ninth transistor 39 is electrically connected to the power supply line 51. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 52, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34.

In FIG. 25C, a connection point of the gate electrode of the third transistor 33, the gate electrode of the tenth transistor 40, and the second terminal of the ninth transistor 39 is referred to as a node NA. In addition, a connection point of the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 is referred to as a node NB.

In the case where the pulse output circuit in FIG. 25C is the first pulse output circuit 10_1, the first clock signal CK1 is input to the first input terminal 21, the second clock signal CK2 is input to the second input terminal 22, the third clock signal CK3 is input to the third input terminal 23, the start pulse SP is input to the fourth input terminal 24, a subsequent-stage signal OUT(3) is input to the fifth input terminal 25, the first output signal OUT(1)(SR) is output from the first output terminal 26, and the second output signal OUT (1) is output from the second output terminal 27.

Figure 26:
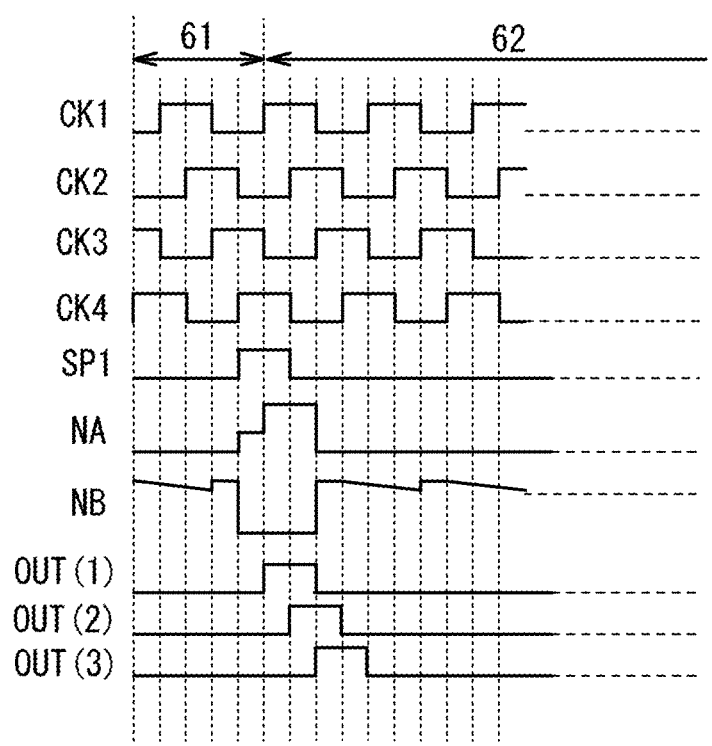
FIG. 26 is a timing chart for illustrating the operation of a shift register.

FIG. 26 shows a timing chart of a shift register including the plurality of pulse output circuits shown in FIG. 25C. In the case where the shift register is a scan line driver circuit, a period 61 in FIG. 26 is a vertical retrace period and a period 62 is a gate selection period.

The procedure of supplying, or stopping the supply of, a potential to each wiring of the driver circuit portion during the operations to display a still image and a moving image, or the operation to rewrite a voltage to be applied to a liquid crystal element (hereinafter also referred to as refresh operation), in the driver circuit manufactured using a plurality of n-channel transistors, which is given as an example in FIGS. 25A to 25C and FIG. 26, will be described with reference to FIG. 27. Note that FIG. 27 illustrates changes in potentials, before and after a period T1, of a wiring for supplying a high power supply potential (VDD), a wiring for supplying a low power supply potential (VSS), a wiring for supplying a start pulse (SP), and wirings for supplying first to fourth clock signals (CK1 to CK4) to a shift register.

The liquid crystal display device of this embodiment can display a still image without constantly operating the driver circuit portion. Therefore, as illustrated in FIG. 27, there are a period in which control signals such as the high power supply potential (VDD), the first to fourth clock signals (CK1 to CK4), and the start pulse are supplied to a shift register and a period in which control signals are not supplied. Note that the period T1 illustrated in FIG. 27 corresponds to the period in which control signals are supplied, in other words, a period in which a moving image is displayed and a period in which refresh operation is performed. The period T2 illustrated in FIG. 27 corresponds to the period in which control signals are not supplied, in other words, a period in which a still image is displayed.

Figure 27:
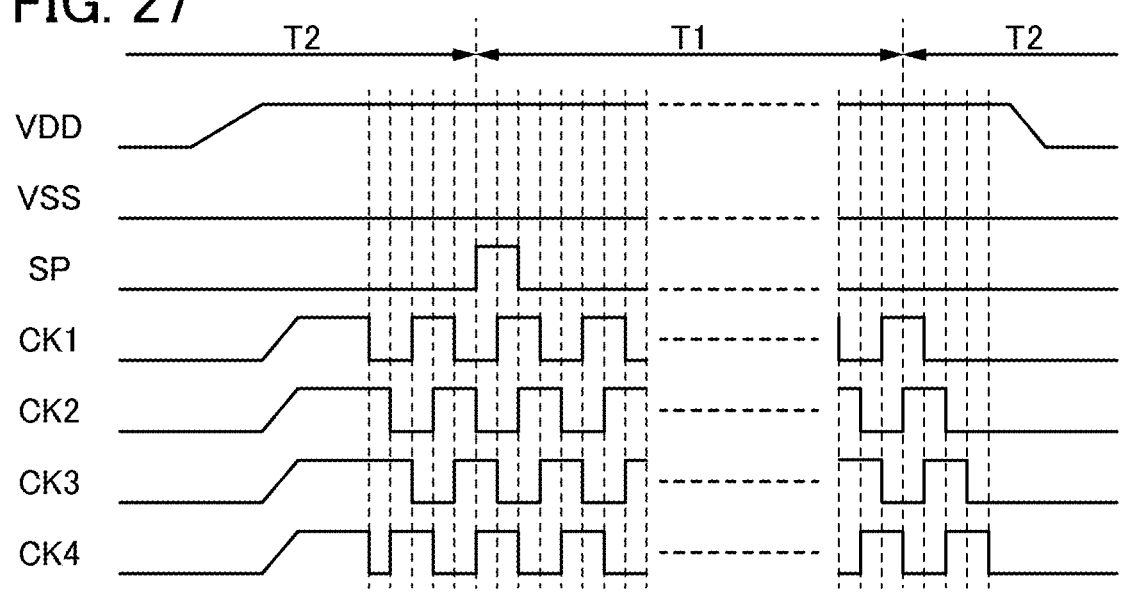
FIG. 27 is a timing chart for illustrating the operation of a shift register.

In FIG. 27, a period in which the high power supply potential (VDD) is supplied is provided not only in the period T1 but also in part of the period T2. In addition, in FIG. 27, a period in which the first to fourth clock signals (CK1 to CK4) are supplied is provided between the start of the supply of the high power supply potential (VDD) and the stop of the supply of the high power supply potential (VDD).

Moreover, as illustrated in FIG. 27, the first to fourth clock signals (CK1 to CK4) may be set so as to start to oscillate at a constant frequency after being set to a high potential once before the period T1 begins and stop oscillating after being set to a low potential after the period T1 ends.

As described above, in the liquid crystal display device of this embodiment, the supply of control signals such as the high power supply potential (VDD), the first to fourth clock signals (CK1 to CK4), and the start pulse to the shift register is stopped in the period T2. Then, in the period in which the supply of control signals is stopped, whether each transistor is turned on or turned off is controlled and the output of a pulse signal from the shift register is also stopped. Therefore, power consumption of the shift register and power consumption of the pixel portion which is driven by the shift register can be reduced.

Note that the aforementioned refresh operation needs to be performed regularly because there is a possibility that the quality of a displayed still image may deteriorate. In the liquid crystal display device of this embodiment, the aforementioned transistor including an oxide semiconductor is employed as a switching element for controlling a voltage to be applied to a liquid crystal element of each pixel. Accordingly, off-state current can be drastically decreased, and a change in voltage to be applied to the liquid crystal element of each pixel can be reduced. In other words, even when the period in which the operation of the shift register is stopped is long due to display of a still image, the deterioration of image quality can be suppressed. For example, even when the period is 3 minutes long, the quality of a displayed still image can be maintained. For example, if a liquid crystal display device in which rewrite is performed 60 times per second and a liquid crystal display device in which refresh operation is performed once in 3 minutes are compared with each other, power consumption can be reduced to approximately 1/10000.

Note that the stop of the supply of the high power supply potential (VDD) is to set a potential equal to the low power supply potential (VSS) as illustrated in FIG. 27. In addition, the stop of the supply of the high power supply potential (VDD) may be to set the potential of a wiring, to which the high power supply potential is supplied, in a floating state.

Note that when the potential of the wiring to which the high power supply potential (VDD) is supplied is increased, which means that the potential is increased from the low power supply potential (VSS) to the high power supply potential (VDD) before the period T1, it is preferable that the potential of the wiring is controlled so as to change gradually. If the gradient of the change in potential of the wiring is steep, there is a possibility that the change in potential may become noise and an irregular pulse may be output from the shift register. In the case where the shift register is included in a gate line driver circuit, the irregular pulse serves as a signal for turning on a transistor. Thus, there is a possibility that a voltage to be applied to a liquid crystal element may be changed by the irregular pulse and the quality of a still image may be changed. Therefore, it is preferable to control the change in potential of the wiring as described above. In view of the above content, FIG. 27 illustrates an example in which a rise in signal to the high power supply potential (VDD) is more gradual than a fall. In particular, in the liquid crystal display device of this embodiment, when a still image is displayed in the pixel portion, the stop of the supply, and the resupply, of the high power supply potential (VDD) to the shift register are performed as appropriate. In other words, in the case where a change in potential of the wiring for supplying the high power supply potential (VDD) adversely affects the pixel portion as noise, the noise directly leads to deterioration of a display image. Therefore, it is important to control the liquid crystal display device of this embodiment so as to prevent a change in potential (particularly, an increase in potential) of the wiring from entering the pixel portion as noise.

Furthermore, in this embodiment, when a still image is displayed, by operating the driver circuit portion so as to stop the output of a signal to be supplied to a signal line or a scan line, power consumption of the driver circuit portion as well as the pixel portion can be reduced.

Note that this embodiment can be combined with any of other embodiments as appropriate.

Example 1

In this example, the results of evaluation of image signal holding characteristics of the liquid crystal display device, which is described in the above embodiment and actually manufactured, at the time of displaying a still image will be described.

Figure 28:
FIG. 28 is a diagram for illustrating a liquid crystal display device of Example 1.

First, a photograph of a display state of the manufactured liquid crystal display device is shown in FIG. 28. From the photograph of the liquid crystal display device of FIG. 28, a state of the actually manufactured liquid crystal display device displaying a still image can be seen.

Figure 29:
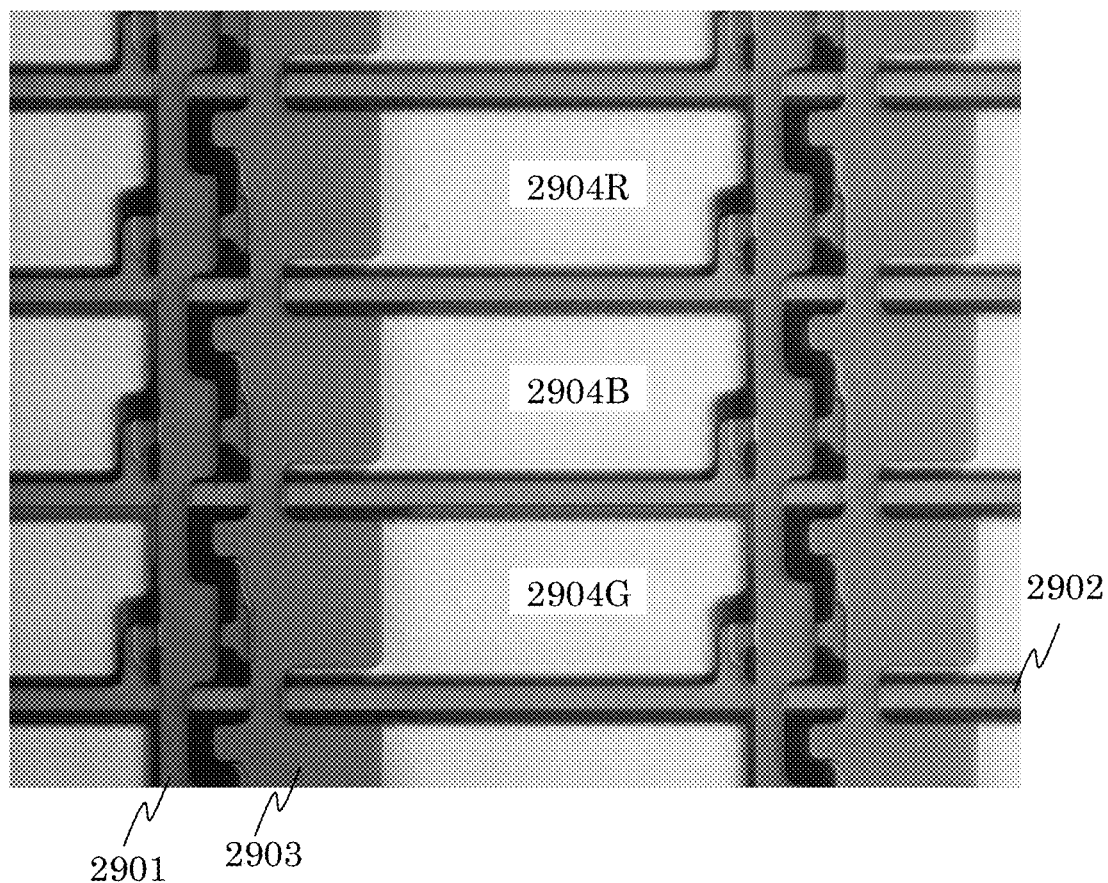
FIG. 29 is a diagram for illustrating a liquid crystal display device of Example 1.

Next, regarding an upper-side layout diagram of a plurality of pixels included in a pixel portion, a photograph of elements such as thin film transistors formed over a substrate, which is taken from the rear side, is shown in FIG. 29.

From the photograph of the pixels shown in FIG. 29, it can be seen that rectangular pixels are provided and gate lines 2901 and signal lines 2902 are provided at right angles to each other. It can also be seen that capacitor lines 2903 are provided in a position parallel with the gate lines 2901. In a region where the gate line 2901 and the capacitor line 2903, and the signal line 2902 overlap each other, an insulating film is provided in order to reduce parasitic capacitance, and can be observed as a bump in FIG. 29. The liquid crystal display device described in this example is a reflective liquid crystal display device, and a reflective electrode 2904R overlapping a red (R) color filter, a reflective electrode 2904G overlapping a green (G) color filter, and a reflective electrode 2904B overlapping a blue (B) color filter are observed. In FIG. 29, in a region controlled by the gate line 2901, an In—Ga—Zn—O-based non-single-crystal film which is an oxide semiconductor is provided as a light transmitting semiconductor layer, and a thin film transistor is formed.

Figure 30:
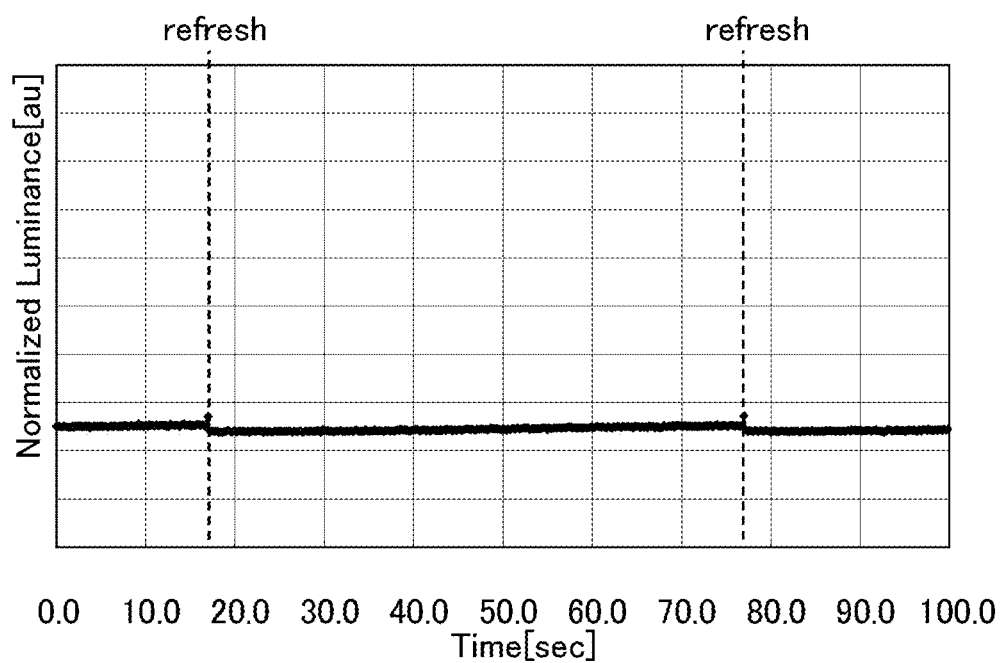
FIG. 30 is a diagram for illustrating a liquid crystal display device of Example 1.

FIG. 30 shows a graph of changes in luminance over time of each pixel shown in FIG. 29 at the time of displaying a still image according to the above embodiment.

It can be seen from FIG. 30 that in the case of the upper-side layout of the pixel of FIG. 29, the image signal holding period is approximately 1 minute long. Therefore, at the time of displaying a still image, a constant luminance may be maintained by performing the operation to regularly supply the same image signal (in the diagram, "refresh"). As a result, the length of time to apply a voltage to a transistor included in a driver circuit portion can be drastically shortened. Furthermore, deterioration of a driver circuit over time can be drastically slowed, which produces advantageous effects such as an improvement in reliability of a liquid crystal display device.

This application is based on Japanese Patent Application serial no. 2009-238869 filed with Japan Patent Office on Oct. 16, 2009 and Japanese Patent Application serial no. 2009-

279004 filed on Dec. 8, 2009, the entire contents of which are hereby incorporated by reference.

EXPLANATION OF REFERENCE

100: pixel, 101: wiring, 102: wiring, 103: oxide semiconductor layer, 104: capacitor line, 105: pixel electrode, 106: thin film transistor, 111: substrate, 112: base film, 113: gate insulating film, 114: oxide insulating layer, 121: insulating layer, 200: substrate: 201: pixels, 202: pixel portion, 203: scan line driver circuit, 204: signal line driver circuit, 251: period, 252: period, 261: period, 262: period, 300: substrate, 302: gate insulating layer, 303: protective insulating layer, 310: thin film transistor, 311: gate electrode layer, 313: channel formation region, 314a: high-resistance source region, 314b: high-resistance drain region, 315a: source electrode layer. 315b: drain electrode layer, 316: oxide insulating layer, 320: substrate, 322: gate insulating layer: 323: protective insulating layer, 330: oxide semiconductor film, 331: island-shaped oxide semiconductor layer. 332: oxide semiconductor layer, 340: substrate, 342: gate insulating layer, 343: protective insulating layer, 345: oxide semiconductor film, 346: oxide semiconductor layer, 350: thin film transistor, 351: gate electrode layer, 352: i-type oxide semiconductor layer, 355a: source electrode layer, 355b: drain electrode layer, 356: oxide insulating layer, 360: thin film transistor, 361: gate electrode layer, 362: oxide semiconductor layer, 363: channel formation region, 364a: high-resistance source region, 364b: high-resistance drain region: 365a: source electrode layer, 365b: drain electrode layer, 366: oxide insulating layer, 370: substrate, 372a: gate insulating layer, 372b: gate insulating layer, 373: protective insulating layer, 380: thin film transistor, 381: gate electrode layer, 382: oxide semiconductor layer, 385a: source electrode layer, 385b: drain electrode layer, 386: oxide insulating layer, 390: thin film transistor, 391: gate electrode layer, and 392: oxide semiconductor layer.

The invention claimed is:

1. A display device comprising:
a pixel portion comprising:
a transistor comprising a source, a drain and a channel formation region, the channel formation region comprising an oxide semiconductor;
a pixel electrode electrically connected to the source or the drain of the transistor; and
a liquid crystal material adjacent to the pixel electrode,
wherein the pixel portion does not include any capacitor line overlapping with the pixel electrode,
wherein the oxide semiconductor includes indium, gallium, and zinc,
wherein an off-state current per micrometer of a channel width of the channel formation region is $1\times10^{-17}$ A or less, and
wherein a specific resistance of the liquid crystal material measured at 20° C. is $1\times10^{12}$ Ω·cm or more.

2. The display device according to claim 1, wherein the oxide semiconductor includes a microcrystalline portion with a grain diameter of 1 nm to 20 nm.

3. The display device according to claim 1, wherein the specific resistance of the liquid crystal material measured at 20° C. is $1\times10^{14}$ Ω·cm or more.

4. A display device comprising:
a pixel portion comprising:
a transistor comprising a source, a drain and a channel formation region, the channel formation region comprising an oxide semiconductor;
a capacitor;
a pixel electrode electrically connected to the source or the drain of the transistor; and
a liquid crystal material adjacent to the pixel electrode,
wherein the pixel portion does not include any capacitor line overlapping with the pixel electrode,
wherein the oxide semiconductor includes indium, gallium, and zinc,
wherein the oxide semiconductor has a carrier concentration of less than $1\times10^{14}/cm^3$,
wherein an off-state current per micrometer of a channel width of the channel formation region is $1\times10^{-17}$ A or less, and
wherein a specific resistance of the liquid crystal material measured at 20° C. is $1\times10^{12}$ Ω·cm or more.

5. The display device according to claim 4, wherein the oxide semiconductor includes a microcrystalline portion with a grain diameter of 1 nm to 20 nm.

6. The display device according to claim 4, wherein the specific resistance of the liquid crystal material measured at 20° C. is $1\times10^{14}$ Ω·cm or more.

7. The display device according to claim 4, wherein the display device is driven by dot inversion driving.

8. A display device comprising:
a pixel comprising:
a transistor comprising a source, a drain and a channel formation region, the channel formation region comprising an oxide semiconductor;
a pixel electrode electrically connected to the source or the drain of the transistor; and
a liquid crystal material adjacent to the pixel electrode,
wherein the pixel does not include any storage capacitor,
wherein the oxide semiconductor includes indium, gallium, and zinc,
wherein an off-state current per micrometer of a channel width of the channel formation region is $1\times10^{-17}$ A or less, and
wherein a specific resistance of the liquid crystal material measured at 20° C. is $1\times10^{12}$ Ω·cm or more.

9. The display device according to claim 8, wherein the oxide semiconductor includes a microcrystalline portion with a grain diameter of 1 nm to 20 nm.

10. The display device according to claim 8, wherein the specific resistance of the liquid crystal material measured at 20° C. is $1\times10^{14}$ Ω·cm or more.

11. The display device according to claim 8, wherein the display device is driven by dot inversion driving.

* * * * *